United States Patent
Jeong et al.

(10) Patent No.: US 10,878,908 B2
(45) Date of Patent: Dec. 29, 2020

(54) THREE-DIMENSIONAL (3D) SEMICONDUCTOR MEMORY DEVICES AND METHODS OF MANUFACTURING THE SAME

(71) Applicant: Samsung Electronics Co., Ltd., Suwon-si (KR)

(72) Inventors: Da Woon Jeong, Hwaseong-si (KR); Sung-Hun Lee, Yongin-si (KR); Seokjung Yun, Iksan-si (KR); Hyunmog Park, Seoul (KR); JoongShik Shin, Yongin-si (KR); Young-Bae Yoon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/659,715

(22) Filed: Oct. 22, 2019

(65) Prior Publication Data
US 2020/0075101 A1 Mar. 5, 2020

Related U.S. Application Data

(63) Continuation of application No. 16/040,837, filed on Jul. 20, 2018, now Pat. No. 10,482,964, which is a (Continued)

(30) Foreign Application Priority Data

Jun. 20, 2016 (KR) .................. 10-2016-0076700

(51) Int. Cl.
*G11C 16/04* (2006.01)
*H01L 27/11524* (2017.01)
(Continued)

(52) U.S. Cl.
CPC .......... *G11C 16/0483* (2013.01); *G11C 5/025* (2013.01); *G11C 5/06* (2013.01);
(Continued)

(58) Field of Classification Search
CPC . H01L 27/115; H01L 21/768; G11C 16/0483; G11C 5/025; G11C 5/06
See application file for complete search history.

(56) References Cited

U.S. PATENT DOCUMENTS

| | | | |
|---|---|---|---|
| 8,476,713 | B2 | 7/2013 | Lee et al. |
| 8,659,070 | B2 | 2/2014 | Tanaka et al. |

(Continued)

FOREIGN PATENT DOCUMENTS

| | | |
|---|---|---|
| KR | 20140075340 | 6/2014 |
| KR | 20140093038 | 7/2014 |

*Primary Examiner* — Sitaramarao S Yechuri
(74) *Attorney, Agent, or Firm* — Myers Bigel, P.A.

(57) ABSTRACT

Three-dimensional (3D) semiconductor memory devices and methods of manufacturing the same are provided. Three-dimensional (3D) semiconductor memory devices may include a substrate including a cell array region and a connection region, a lower stack structure including a plurality of lower electrodes vertically stacked on the substrate, the lower stack structure having a first stair step structure extending in a first direction on the connection region and a second stair step structure extending in a second direction substantially perpendicular to the first direction on the connection region, and a plurality of intermediate stack structures vertically stacked on the lower stack structure. Each of the intermediate stack structures includes a plurality of intermediate electrodes vertically stacked and has a third stair step structure extending in the second direction on the connection region. Each of the intermediate stack structures exposes the third stair step structure of the intermediate stack structure disposed thereunder.

15 Claims, 54 Drawing Sheets

Related U.S. Application Data continuation of application No. 15/383,213, filed on Dec. 19, 2016, now Pat. No. 10,049,744.

(60) Provisional application No. 62/276,356, filed on Jan. 8, 2016.

(51) Int. Cl.

| | | |
|---|---|---|
| *H01L 27/11556* | (2017.01) | |
| *H01L 27/1157* | (2017.01) | |
| *H01L 27/11582* | (2017.01) | |
| *H01L 21/768* | (2006.01) | |
| *G11C 5/02* | (2006.01) | |
| *G11C 5/06* | (2006.01) | |
| *H01L 49/02* | (2006.01) | |

(52) U.S. Cl.
CPC .. *H01L 21/76816* (2013.01); *H01L 21/76877* (2013.01); *H01L 27/1157* (2013.01); *H01L 27/11524* (2013.01); *H01L 27/11556* (2013.01); *H01L 27/11582* (2013.01); *H01L 28/00* (2013.01)

(56) References Cited

U.S. PATENT DOCUMENTS

| | | |
|---|---|---|
| 8,680,604 B2 | 3/2014 | Higashi et al. |
| 8,748,970 B1 | 6/2014 | Lee et al. |
| 8,751,217 B2 | 6/2014 | Ballinger et al. |
| 8,759,217 B1 | 6/2014 | Chen |
| 8,822,285 B2 | 9/2014 | Hwang et al. |
| 9,087,738 B2 | 7/2015 | Park et al. |
| 9,165,938 B1 | 10/2015 | Kim et al. |
| 9,190,514 B2 | 11/2015 | Lee et al. |
| 9,929,093 B2 | 3/2018 | Lee |
| 2009/0230462 A1 | 9/2009 | Tanaka et al. |
| 2009/0310425 A1 | 12/2009 | Sim et al. |
| 2010/0052042 A1 | 3/2010 | Tanaka et al. |
| 2012/0061744 A1 | 3/2012 | Hwang et al. |
| 2013/0009274 A1 | 1/2013 | Lee et al. |
| 2013/0161821 A1* | 6/2013 | Hwang ............ H01L 27/11556 257/773 |
| 2014/0008806 A1 | 1/2014 | Ha et al. |
| 2014/0038400 A1 | 2/2014 | Park et al. |
| 2014/0162420 A1 | 6/2014 | Oh et al. |
| 2014/0191388 A1 | 7/2014 | Chen |
| 2014/0197546 A1 | 7/2014 | Hwang et al. |
| 2014/0203442 A1* | 7/2014 | Yun ........................ G11C 5/063 257/773 |
| 2014/0264547 A1 | 9/2014 | Kawai et al. |
| 2014/0355350 A1 | 12/2014 | Maejima |
| 2015/0001613 A1 | 1/2015 | Yip et al. |
| 2016/0268298 A1 | 9/2016 | Iguchi et al. |
| 2017/0179028 A1 | 6/2017 | Lee et al. |
| 2017/0194326 A1 | 7/2017 | Kim et al. |
| 2017/0207238 A1 | 7/2017 | Lee et al. |
| 2018/0342533 A1 | 11/2018 | Lee et al. |

* cited by examiner

THREE-DIMENSIONAL (3D) SEMICONDUCTOR MEMORY DEVICES AND METHODS OF MANUFACTURING THE SAME

CROSS-REFERENCE TO RELATED APPLICATIONS

The present application is a continuation application of U.S. patent application Ser. No. 16/040,837, filed Jul. 20, 2018, which claims priority to U.S. patent application Ser. No. 15/383,213, filed on Dec. 19, 2016, now U.S. Pat. No. 10,049,744, which claims priority from U.S. Provisional Patent application Ser. No. 62/276,356, filed on Jan. 8, 2016, in the United States Patent and Trademark Office and Korean Patent Application No. 10-2016-0076700, filed on Jun. 20, 2016, in the Korean Intellectual Property Office, the disclosures of all of which are hereby incorporated by reference in their entireties.

BACKGROUND

The present disclosure relates to three-dimensional (3D) semiconductor devices and methods of manufacturing the 3D semiconductor devices.

Semiconductor devices have been highly integrated to provide excellent performance and low manufacturing costs. The integration density of semiconductor devices may affect a manufacturing cost of the semiconductor devices, and thus highly integrated semiconductor devices may be beneficial in terms of a manufacturing cost of the semiconductor devices. The integration density of conventional two-dimensional (2D) or planar semiconductor devices may be determined by an area that a unit memory cell occupies. Therefore, the integration density of the conventional 2D semiconductor devices may be affected by a technique of forming fine patterns. However, since expensive apparatuses may be used to form fine patterns, the integration density of 2D semiconductor devices may be limited. Thus, three-dimensional (3D) semiconductor memory devices have been developed to further increase the integration density of semiconductor devices. 3D semiconductor memory devices may include memory cells that are three-dimensionally arranged.

SUMMARY

Embodiments of the inventive concepts provide three-dimensional (3D) semiconductor memory devices having a high integration density and methods of manufacturing the semiconductor memory devices.

A 3D semiconductor memory device may include a substrate including a cell array region and a connection region, a lower stack structure including a plurality of lower electrodes vertically stacked on the substrate, the lower stack structure having a first stair step structure extending in a first direction on the connection region and a second stair step structure extending in a second direction substantially perpendicular to the first direction on the connection region, and a plurality of intermediate stack structures vertically stacked on the lower stack structure. Each of the intermediate stack structures may include a plurality of intermediate electrodes vertically stacked and may have a third stair step structure extending in the second direction on the connection region. Each of the intermediate stack structures may expose the third stair step structure of the intermediate stack structure disposed thereunder.

A 3D semiconductor memory device may include a substrate including a cell array region and a connection region, and an electrode structure extending from the cell array region onto the connection region in a first direction. The electrode structure may include a lower stack structure including lower electrodes vertically stacked on the substrate, and a plurality of intermediate stack structures vertically stacked on the lower stack structure to constitute a stair step structure in the first direction. Each of the intermediate stack structures may include intermediate electrodes vertically stacked, and each of the lower electrodes may have a lower pad region exposed by one of the lower electrodes disposed immediately thereon on the connection region. Each of the intermediate electrodes may have an intermediate pad region exposed by one of the intermediate electrodes disposed immediately thereon on the connection region. Lengths of the intermediate pad regions in the first direction may be substantially equal to each other, and widths of the intermediate pad regions in a second direction substantially perpendicular to the first direction may be substantially equal to each other. The lower pad regions may have lengths in the first direction and widths in the second direction, and the lengths and the widths of the lower pad regions may decrease as a vertical distance from the substrate increases.

A method of manufacturing a 3D semiconductor memory device may include forming a thin-layer structure including insulating layers and horizontal layers which are vertically and alternately stacked on a substrate including a cell array region and a connection region, forming an upper structure including a plurality of upper horizontal patterns vertically stacked on the thin-layer structure, the upper structure having a first stair step structure extending in a first direction and a second stair step structure extending in a second direction substantially perpendicular to the first direction on the connection region, forming a mask pattern exposing portions of the first and second stair step structures of the upper structure and a portion of the thin-layer structure on the connection region, and performing a pad etching process using the mask pattern as an etch mask to etch the upper structure and the thin-layer structure.

A method of manufacturing a 3D semiconductor memory device may include forming a thin-layer structure including insulating layers and horizontal layers which are vertically and alternately stacked on a substrate including a cell array region and a connection region, repeatedly performing a first patterning process on an upper portion of the thin-layer structure to form an upper structure including a plurality of upper horizontal patterns vertically stacked, the upper structure having a first stair step structure extending in a first direction and a second stair step structure extending in a second direction substantially perpendicular to the first direction on the connection region, and repeatedly performing a second patterning process on a portion of the upper structure and a lower portion of the thin-layer structure to form a plurality of intermediate structures under the upper structure. The intermediate structures may constitute a stair step structure in the first direction. Each of the intermediate structures may include at least two of the horizontal layers and may have a third stair step structure extending in the second direction.

An integrated circuit device may include an electrode structure on a substrate. The electrode structure may include a plurality of electrodes vertically stacked on the substrate. The plurality of electrodes may include a plurality of intermediate electrodes vertically stacked on the substrate. Each of the plurality of intermediate electrodes may extend longitudinally in a first horizontal direction and may include first and second long sidewalls extending in the first horizontal direction and a short sidewall extending from the first long sidewall toward the second long sidewall in a second horizontal direction that is substantially perpendicular to the first horizontal direction. The short sidewalls of the plurality of intermediate electrodes may be vertically substantially aligned each other, a first one of the plurality of intermediate electrodes may include a first intermediate pad region exposed by a second one of the plurality of intermediate electrodes that is immediately on the first one of the plurality of intermediate electrodes, and the first intermediate pad region may protrude in the second horizontal direction beyond the second long sidewall of the second one of the plurality of intermediate electrodes in a plan view. The plurality of electrodes may also include a plurality of lower electrodes vertically stacked on the substrate. The plurality of lower electrodes may be between the substrate and the plurality of intermediate electrodes. Each of the plurality of lower electrodes may extend longitudinally in the first horizontal direction and may include third and fourth long sidewalls extending in the first horizontal direction and a short sidewall extending from the third long sidewall toward the fourth long sidewall in the second horizontal direction. A first one of the plurality of lower electrodes may include a first lower pad region exposed by a second one of the plurality of lower electrodes that is immediately on the first one of the plurality of lower electrodes, and the first lower pad region may protrude in the first horizontal direction beyond the short sidewall of the second one of the plurality of lower electrodes and may protrude in the second horizontal direction beyond the fourth long sidewall of the second one of the plurality of lower electrodes in the plan view.

BRIEF DESCRIPTION OF THE DRAWINGS

The inventive concepts will become more apparent in view of the attached drawings and accompanying detailed description.

DETAILED DESCRIPTION OF THE EMBODIMENTS

Embodiments of the inventive concepts will be described hereinafter in detail with reference to the accompanying drawings.

Figure 1:
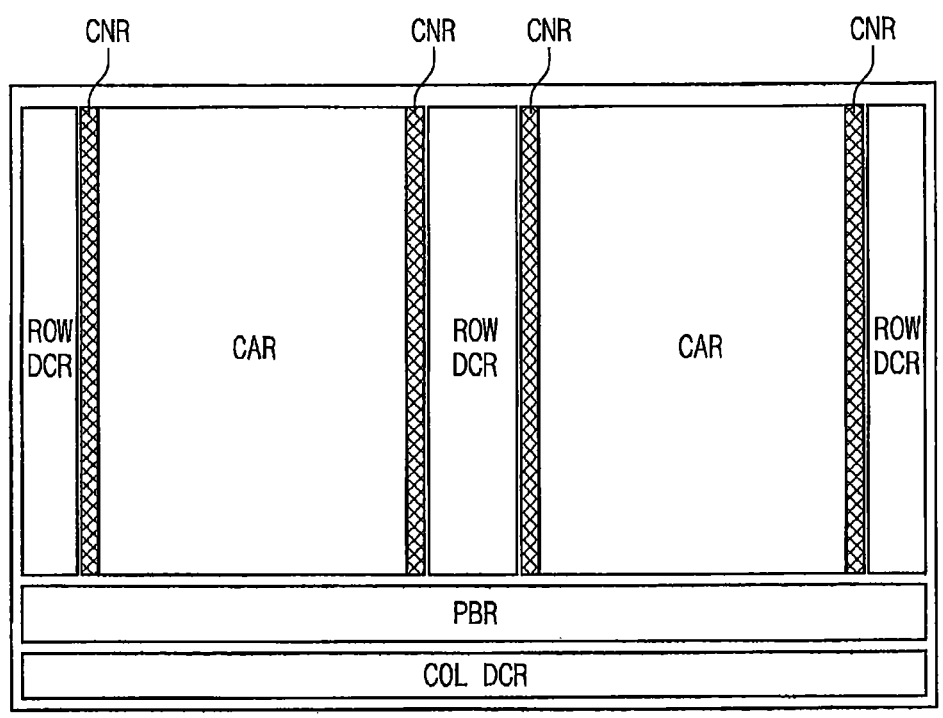
FIG. 1 is a schematic block diagram illustrating a 3D semiconductor memory device according to some embodiments of the inventive concepts.

FIG. 1 is a schematic block diagram illustrating a 3D semiconductor memory device according to some embodiments of the inventive concepts.

Referring to FIG. 1, a 3D semiconductor memory device may include a cell array region CAR and a peripheral circuit region. The peripheral circuit region may include row decoder regions ROW DCR, a page buffer region PBR, a column decoder region COL DCR, and a control circuit region (not shown). In some embodiments, a connection region CNR may be disposed between the cell array region CAR and the row decoder region ROW DCR.

A memory cell array including a plurality of memory cells may be disposed in the cell array region CAR. In some embodiments, the memory cell array may include three-dimensionally arranged memory cells, word lines, and bit lines. The word lines and the bit lines may be electrically connected to the memory cells.

A row decoder for selecting the word lines of the memory cell array may be disposed in the row decoder region ROW DCR, and an interconnection structure may be disposed in the connection region CNR. The interconnection structure may include contact plugs and interconnection lines, which electrically connect the memory cell array to the row decoder. The row decoder may select one among the word lines of the memory cell array in response to an address signal. The row decoder may respectively provide a first word line voltage and second word line voltages to the selected word line and unselected word lines in response to a control signal of a control circuit.

A page buffer for sensing data stored in the memory cells may be disposed in the page buffer region PBR. According to an operation mode, the page buffer may temporarily store data to be stored in the memory cells or may sense data stored in the memory cells. The page buffer may operate as a write driver circuit in a program operation mode and may operate as a sense amplifier circuit in a read operation mode.

A column decoder connected to the bit lines of the memory cell array may be disposed in the column decoder region COL DCR. The column decoder may provide a data transmission path between the page buffer and an external device (e.g., a memory controller).

Figure 2:
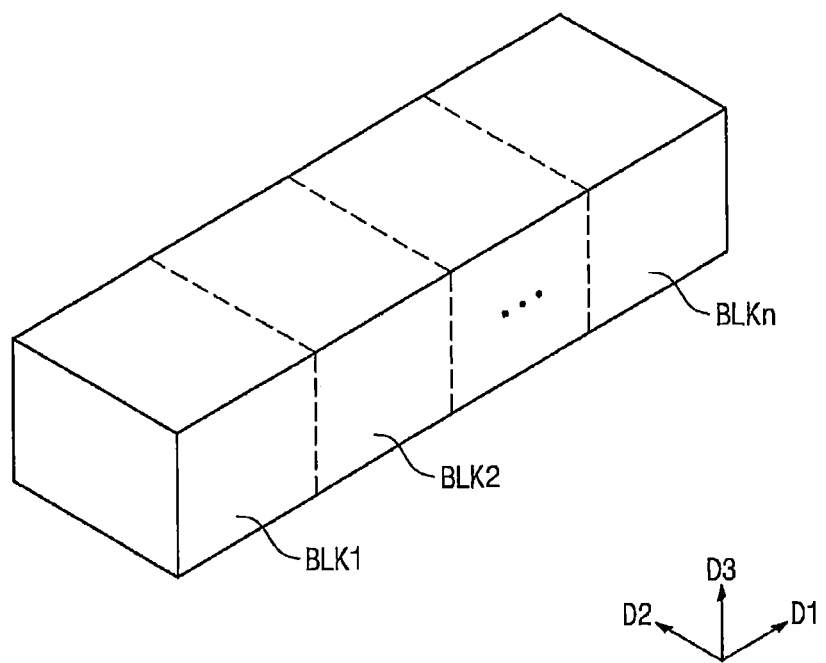
FIG. 2 is a schematic block diagram illustrating a 3D semiconductor memory device according to some embodiments of the inventive concepts.

FIG. 2 is a schematic block diagram illustrating a cell array of a 3D semiconductor memory device according to some embodiments of the inventive concepts.

Referring to FIG. 2, a cell array may include a plurality of cell array blocks BLK1 to BLKn. Each of the cell array blocks BLK1 to BLKn may include an electrode structure that includes electrodes stacked on a plane, defined by first and second directions D1 and D2 intersecting each other, along a third direction D3. The electrode structure may be coupled to a plurality of vertical structures (e.g., semiconductor pillars) to constitute memory cells that are three-dimensionally arranged. In addition, each of the cell array blocks BLK1 to BLKn may further include bit lines that are electrically connected to the memory cells.

Figure 3:
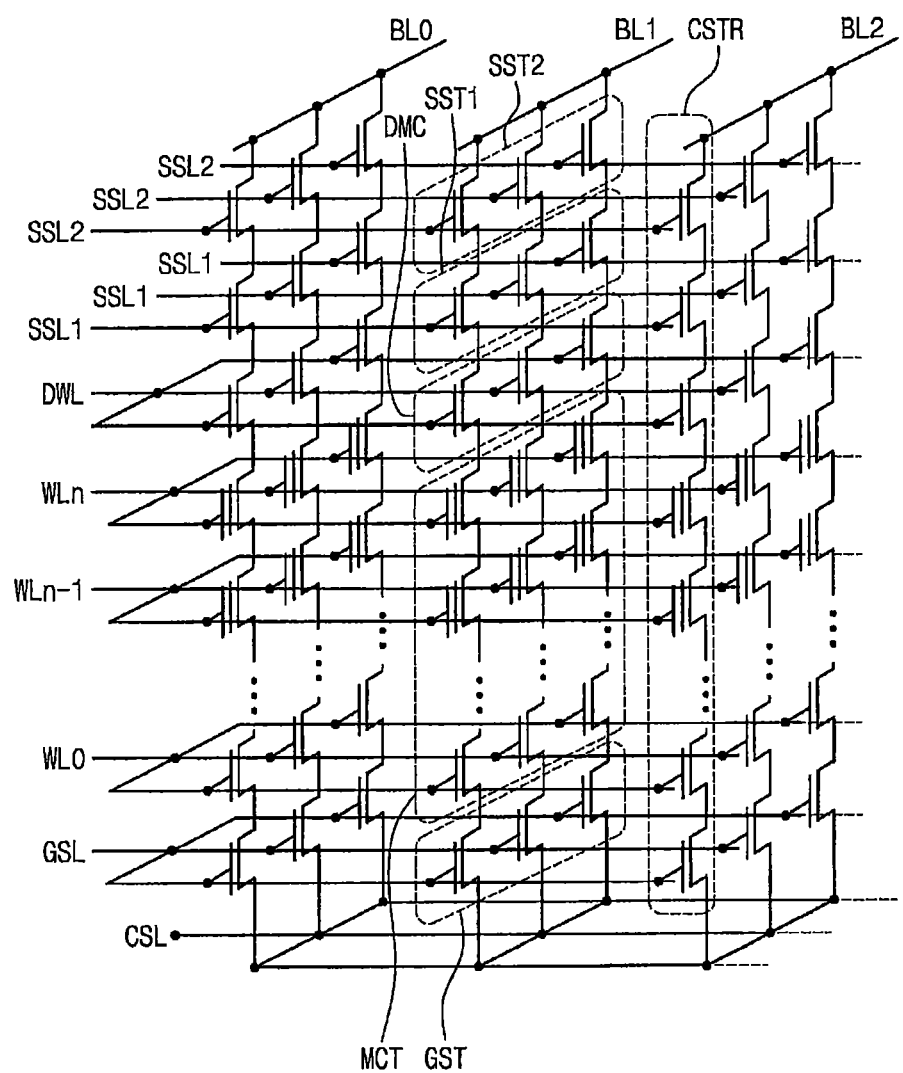
FIG. 3 is a schematic circuit diagram illustrating a 3D semiconductor memory device according to some embodiments of the inventive concepts.

FIG. 3 is a schematic circuit diagram illustrating a 3D semiconductor memory device according to some embodiments of the inventive concepts.

Referring to FIG. 3, a cell array of a 3D semiconductor memory device according to some embodiments may include a common source line CSL, a plurality of bit lines BL0 to BL2, and a plurality of cell strings CSTR disposed between the common source line CSL and the bit lines BL0 to BL2.

The bit lines BL0 to BL2 may be two-dimensionally arranged and a plurality of the cell strings CSTR may be connected in parallel to each of the bit lines BL0 to BL2. The cell strings CSTR may be connected in common to the common source line CSL. In other words, a plurality of the cell strings CSTR may be disposed between one common source line CSL and the plurality of bit lines BL0 to BL2. The common source line CSL may include a plurality of common source lines CSL, and the plurality of common source lines CSL may be two-dimensionally arranged. In some embodiments, the same voltage may be applied to the plurality of common source lines CSL. In some embodiments, the common source lines CSL may be electrically controlled independently of each other.

In some embodiments, each of the cell strings CSTR may include string selection transistors SST1 and SST2 connected in series to each other, memory cells MCT connected in series to each other, and a ground selection transistor GST. Each of the memory cells MCT may include a data storage element.

In some embodiments, each of the cell strings CSTR may include first and second string selection transistors SST1 and SST2 connected in series to each other. The second string selection transistor SST2 may be connected to one of the bit lines BL0 to BL2, and the ground selection transistor GST may be connected to the common source line CSL. The memory cells MCT may be connected in series between the first string selection transistor SST1 and the ground selection transistor GST.

In addition, each of the cell strings CSTR may further include a dummy cell DMC connected between the first string selection transistor SST1 and the memory cell MCT. Even though not shown in the drawings, an additional dummy cell may be connected between the ground selection transistor GST and the memory cell MCT adjacent to the ground selection transistor GST.

In some embodiments, in each of the cell strings CSTR, the ground selection transistor GST may include a plurality of MOS transistors connected in series to each other, similarly to the first and second string selection transistors SST1 and SST2. In some embodiments, each of the cell strings CSTR may include a single string selection transistor.

In some embodiments, the first string selection transistor SST1 may be controlled by a first string selection line SSL1, and the second string selection transistor SST2 may be controlled by a second string selection line SSL2. The memory cells MCT may be controlled by a plurality of word lines WL0 to WLn, and the dummy cell DMC may be controlled by a dummy word line DWL. The ground selection transistor GST may be controlled by a ground selection line GSL. The common source line CSL may be connected in common to sources of the ground selection transistors GST.

One cell string CSTR may include the plurality of memory cells MCT respectively disposed at different distances/heights from the common source line CSL. The word lines WL0 to WLn and DWL may be disposed between the common source line CSL and the bit lines BL0 to BL2.

Gate electrodes of the memory cells MCT (or the dummy cells DWC) disposed at the substantially same level from the common source line CSL may be connected in common to one of the word lines WL0 to WLn and DWL so as to be in an equipotential state. Alternatively, even though the gate electrodes of the memory cells MCT are disposed at the substantially same level (e.g., distance/height) from the common source line CSL, the gate electrodes constituting one row (or one column) may be controlled independently of the gate electrodes constituting another row (or another column).

Figure 4:
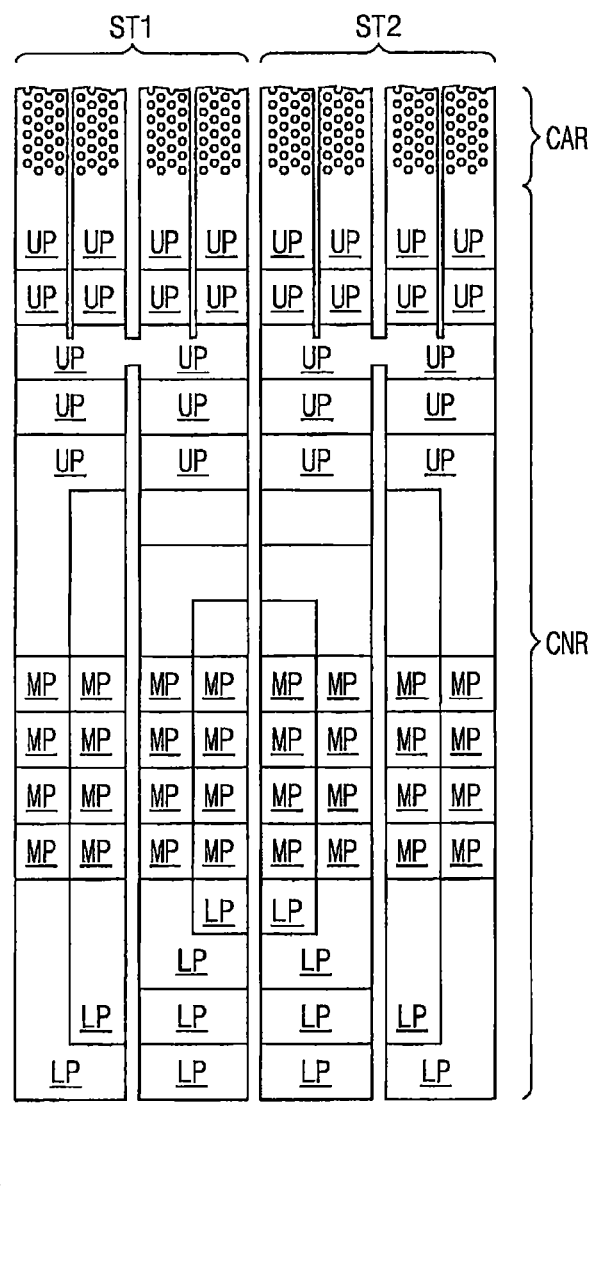
FIGS. 4 and 5 are views illustrating an electrode structure of a 3D semiconductor memory device according to some embodiments of the inventive concepts.
Figure 5:
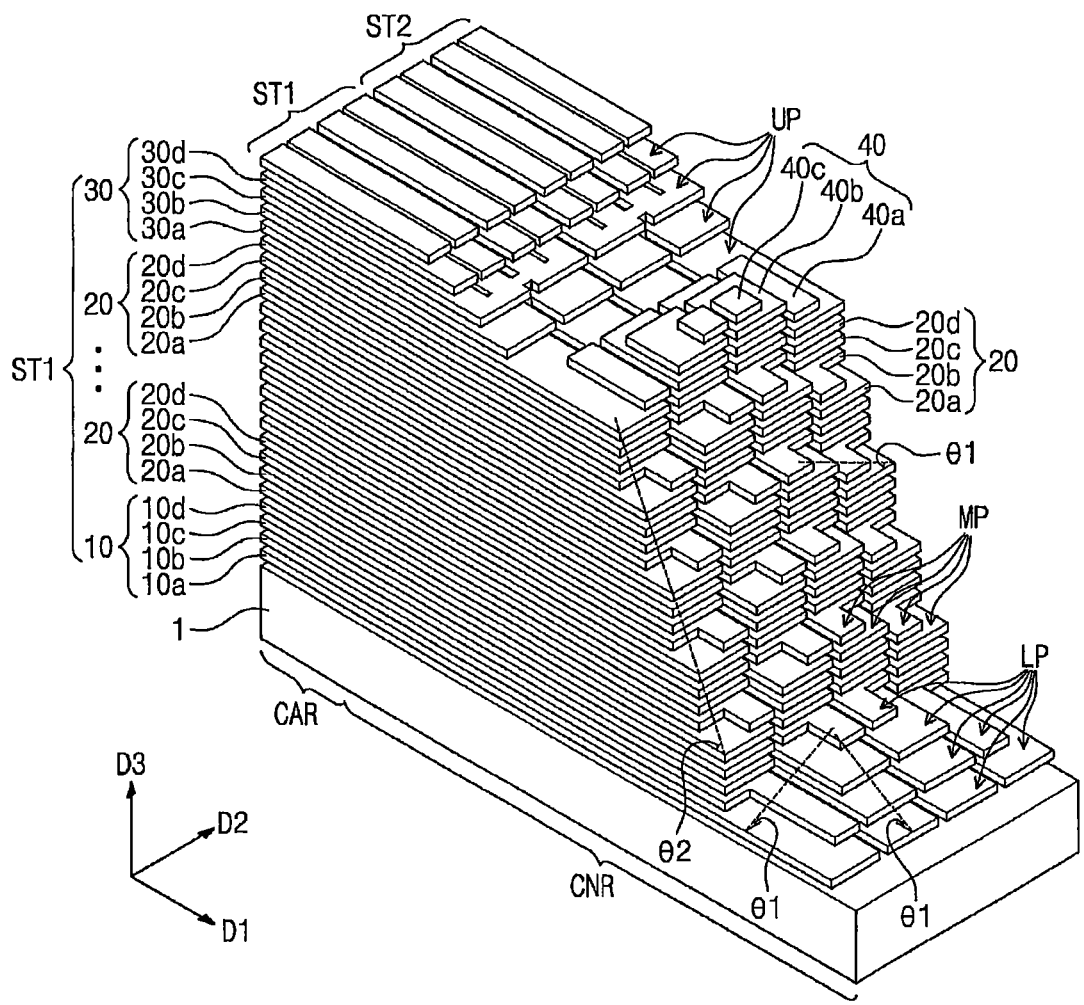

FIGS. 4 and 5 are views illustrating an electrode structure of a 3D semiconductor memory device according to some embodiments of the inventive concepts. FIGS. 6 and 7A to 7D are views illustrating a lower stack structure of an electrode structure according to some embodiments of the inventive concepts. FIGS. 8, 9A to 9D, and 10 are views illustrating intermediate stack structures of electrode structures according to some embodiments of the inventive concepts. FIGS. 11 and 12A to 12C are views illustrating an upper stack structure of an electrode structure according to some embodiments of the inventive concepts.

Referring to FIGS. 4 and 5, a substrate 1 may include a cell array region CAR and a connection region CNR. For example, the substrate 1 may include at least one of silicon (Si), germanium (Ge), silicon-germanium (SiGe), gallium-arsenic (GaAs), indium-gallium-arsenic (InGaAs), aluminum-gallium-arsenic (AlGaAs), or any combination thereof. The substrate 1 may be a bulk silicon substrate, a siliconon-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process. In some embodiments, the substrate 1 may be formed of an insulating material and may include a single layer or a plurality of thin layers. For example, the substrate 1 may include at least one of a silicon oxide layer, a silicon nitride layer, or a low-k dielectric layer.

In some embodiments, a plurality of electrode structures ST1 and ST2 may be disposed on the substrate 1. The electrode structures ST1 and ST2 may extend from the cell array region CAR onto the connection region CNR in a first direction D1 and may be spaced apart from each other in a second direction D2 substantially perpendicular to the first direction D1. Here, the first direction D1 and the second direction D2 may be substantially parallel to a top surface of the substrate 1.

In some embodiments, first and second electrode structures ST1 and ST2 may be spaced apart from each other in the second direction D2 on the substrate 1. The first and second electrode structures ST1 and ST2 may have a stair step structure on the connection region CNR. Each of the first and second electrode structures ST1 and ST2 may include insulating layers (not shown) and electrodes 10a to 10d, 20a to 20d, and 30a to 30d, which are alternately stacked on the substrate 1. In other words, the insulating layers and the electrodes 10a to 10d, 20a to 20d, and 30a to 30d may be alternately stacked in a third direction D3 substantially perpendicular to the top surface of the substrate 1. The electrodes 10a to 10d, 20a to 20d, and 30a to 30d may include a conductive material. For example, the electrodes 10a to 10d, 20a to 20d, and 30a to 30d may include at least one of a doped semiconductor material (e.g., doped silicon), a metal (e.g., tungsten, copper, or aluminum), a conductive metal nitride (e.g., titanium nitride or tantalum nitride), or a transition metal (e.g., titanium or tantalum). The insulating layers may include an insulating material, e.g., silicon oxide.

In detail, as illustrated in FIG. 5, each of the first and second electrode structures ST1 and ST2 may include a lower stack structure 10, an upper stack structure 30, and a plurality of intermediate stack structures 20 stacked between the lower stack structure 10 and the upper stack structure 30.

In some embodiments, the lower stack structure 10 may include a plurality of (i.e., two or more) lower electrodes 10a to 10d vertically stacked with the insulating layer (not shown) interposed therebetween. An end portion of the lower stack structure 10 may be exposed by the intermediate stack structures 20 on the connection region CNR. In other words, portions of the lower electrodes 10a to 10d may be exposed by the intermediate stack structures 20 on the connection region CNR.

In detail, each of the lower electrodes 10a to 10d may have a lower pad region LP exposed by one of the lower electrode disposed immediately thereon. It will be understood that the second lowermost lower electrode 10b is immediately on the lowermost lower electrode 10a and is immediately adjacent the lowermost lower electrode 10a in the third direction D3 since there is no lower electrode between the second lowermost lower electrode 10b and the lowermost lower electrode 10a. It will be also understood that the second lowermost lower electrode 10b, which is immediately on the lowermost lower electrode 10a, is spaced apart from the lowermost lower electrode 10a in the third direction D3 and does not contact (e.g., directly contact) the lowermost lower electrode 10a. In some embodiments, areas (e.g., surface areas) of the lower pad regions LP may decrease (e.g., monotonically decrease) as distances/heights of the lower electrodes 10a to 10d from the substrate 1 increase. In other words, longest lengths of the lower electrodes 10a to 10d in the first direction D1 and longest widths of the lower electrodes 10a to 10d in the second direction D2 may decrease (e.g., monotonically decrease) as the distances/heights of the lower electrodes 10a to 10d from the substrate 1 increase. In addition, a horizontal distance, in the first direction D1, between first sidewalls of the lower electrodes vertically adjacent to each other may be substantially equal to a horizontal distance, in the second direction D2, between second sidewalls of the lower electrodes vertically adjacent to each other.

First portions of the lower electrodes 10a to 10d may constitute a first stair step structure in the first direction D1, and second portions of the lower electrodes 10a to 10d may constitute a second stair step structure in the second direction D2. That is, the lower stack structure 10 may have the first stair step structure formed along the first direction D1 and the second stair step structure formed along the second direction D2. In other words, the lower stack structure 10 may have a pyramid-shaped stair step structure on the connection region CNR. An angle between a slope of the first stair step structure and the top surface of the substrate 1 may be substantially equal to an angle between a slope of the second stair step structure and the top surface of the substrate 1. In other words, each of the slopes of the first and second stair step structures may form a first inclination angle θ1 with respect to the top surface of the substrate 1 as illustrated in FIG. 5.

In some embodiments, the intermediate stack structures 20 may be vertically stacked on the lower stack structure 10. Each of the intermediate stack structures 20 may include a plurality of intermediate electrodes 20a to 20d vertically stacked. The number of the intermediate stack structures 20 may vary depending on a sum of the numbers of the lower, intermediate and upper electrodes 10a to 10d, 20a to 20d, and 30a to 30d and may also vary depending on the number of the intermediate electrodes 20a to 20d included in each of the intermediate stack structures 20. For example, the number of the intermediate electrodes 20a to 20d included in each of the intermediate stack structures 20 may be n, and "n" denotes a natural number equal to or greater than 2. In some embodiments, each of the intermediate stack structures 20 may include four intermediate electrodes 20a to 20d.

The plurality of intermediate stack structures 20 may be stacked on the connection region CNR to have a stair step structure in the first direction D1. In other words, each of the intermediate stack structures 20 may expose an end portion of the intermediate stack structure 20 disposed thereunder.

Since each of the intermediate stack structures 20 may include the plurality of intermediate electrodes 20a to 20d, a slope of the stair step structure formed in the first direction D1 by the intermediate stack structures 20 may form a second inclination angle θ2, which is greater than the first inclination angle θ1, with respect to the top surface of the substrate 1.

Figure 10:
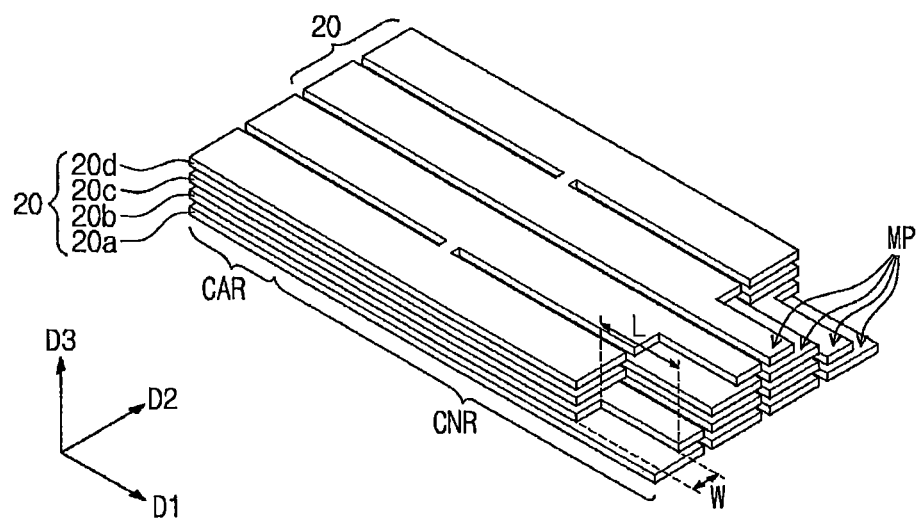
FIG. 10 is a perspective view illustrating an intermediate stack structure of an electrode structure according to some embodiments of the inventive concepts.

In each of the intermediate stack structures 20, end portions of the intermediate electrodes 20a to 20d may be exposed on the connection region CNR. Each of the intermediate electrodes 20a to 20d may have an intermediate pad region MP exposed by one of the intermediate electrodes disposed immediately thereon. It will be understood that a second one of the intermediate electrodes 20b is immediately on a first one of the intermediate electrodes 20a and is immediately adjacent the first one of the intermediate electrodes 20a in the third direction D3 since there is no intermediate electrode between the second one of the intermediate electrodes 20b and the first one of the intermediate electrodes 20a. It will be also understood that the second one of the intermediate electrodes 20b, which is immediately on the first one of the intermediate electrodes 20a, is spaced apart from the first one of the intermediate electrodes 20a in the third direction D3 and does not contact (e.g., directly contact) the first one of the intermediate electrodes 20a. In some embodiments, areas (e.g., surface areas) of the intermediate pad regions MP of the intermediate electrodes 20a to 20d may be substantially equal to each other, and the area of the intermediate pad region MP may be smaller than the area of the lower pad region LP. In other words, the intermediate pad regions MP of the intermediate electrodes 20a to 20d may have lengths L in the first direction D1 and widths W in the second direction D2. The lengths L of the intermediate pad regions MP may be substantially equal to each other, and the widths W of the intermediate pad regions MP may be substantially equal to each other. In some embodiments, the length L may be substantially equal to the width W in each of the intermediate pad regions MP. In some embodiments, as illustrated in FIG. 10, each of the intermediate pad regions MP may have a length L and a width W which are different from each other. For example, the length L may be greater than the width W.

In each of the intermediate stack structures 20, portions of the intermediate electrodes 20a to 20d may constitute a third stair step structure in the second direction D2. A slope of the third stair step structure may form the first inclination angle θ1 with respect to the top surface of the substrate 1, like the first and second stair step structures.

In addition, each of the intermediate electrodes 20a to 20d may have a sidewall vertically substantially aligned with a sidewall of another intermediate electrode disposed thereon. In other words, the sidewalls of the intermediate electrodes 20a to 20d may be substantially coplanar with each other. That is, the maximum lengths of the intermediate electrodes 20a to 20d in the first direction D1 may be substantially equal to each other in each of the intermediate stack structures 20.

In some embodiments, the upper stack structure 30 may include a plurality of upper electrodes 30a to 30d vertically stacked on the uppermost one of the intermediate stack structures 20. The upper stack structure 30 may expose the end portions of the intermediate stack structures 20 and the end portion of the lower stack structure 10 on the connection region CNR. In addition, end portions of the upper electrodes 30a to 30d may be exposed on the connection region CNR. In other words, each of the upper electrodes 30a to 30d may have an upper pad region UP exposed by one of the upper electrodes 30a to 30d disposed immediately thereon. It will be understood that a second one of the upper electrodes 30b is immediately on a first one of the upper electrodes 30a and is immediately adjacent the first one of the upper electrodes 30a in the third direction D3 since there is no intermediate electrode between the second one of the intermediate electrodes 30b and the first one of the intermediate electrodes 30a. It will be also understood that the second one of the upper electrodes 30b, which is immediately on the first one of the upper electrodes 30a, is spaced apart from the first one of the upper electrodes 30a in the third direction D3 and does not contact (e.g., directly contact) the first one of the upper electrodes 30a. The upper pad regions UP may be arranged in the first direction D1 in a plan view. An area (e.g., surface area) of the upper pad region UP may be greater than the area of the intermediate pad region MP.

Portions of the upper electrodes 30a to 30d may constitute a fourth stair step structure in the first direction D1. In some embodiments, a slope of the fourth stair step structure may form the first inclination angle θ1 with respect to the top surface of the substrate 1, like the first and second stair step structures.

In addition, the lowermost upper electrode 30a in the upper stack structure 30 may have a sidewall vertically substantially aligned with a sidewall of the intermediate electrode 20d disposed thereunder. Two upper electrodes 30c and 30d disposed in an upper region of the upper stack structure 30 may have line shapes as illustrated in FIG. 5.

Furthermore, an upper dummy stack structure 40 may be disposed on the lowermost upper electrode 30a. The upper dummy stack structure 40 may include upper dummy electrodes 40a to 40c that are vertically stacked. One sidewall of the upper dummy stack structure 40 may be vertically substantially aligned with one sidewall of the intermediate stack structure 20 disposed under the upper dummy stack structure 40. The upper dummy electrodes 40a to 40c may be laterally spaced apart from some upper electrodes 30b to 30d in the first direction D1. First portions of the upper dummy electrodes 40a to 40c may be exposed along the first direction D1, and second portions of the upper dummy electrodes 40a to 40c may be exposed along the second direction D2. Thus, the upper dummy stack structure 40 may have a first stair step structure formed along the first direction D1 and a second stair step structure formed along the second direction D2. In addition, the first stair step structure of the upper dummy stack structure 40 may be opposite to the fourth stair step structure of the upper stack structure 30. In some embodiments, the first stair step structure of the upper dummy stack structure 40 may face the fourth stair step structure of the upper stack structure 30, as illustrated in FIG. 5.

In some embodiments, the first and second electrode structures ST1 and ST2 may be symmetric with respect to an imaginary line that extends between the first and second electrode structures ST1 and ST2 along the first direction D1.

In more detail, referring to FIGS. 6 and 7A to 7D, the lower stack structure 10 may include first to fourth lower electrodes 10a to 10d sequentially stacked on the substrate 1. Each of the first to fourth lower electrodes 10a to 10d may include a plurality of electrode portions EP, an electrode connection portion ECP, and one or more extension portions EXP1 and EXP2. In some embodiments, each of the first to fourth lower electrodes 10a to 10d may include first and second extension portions EXP1 and EXP2.

The electrode portions EP may extend in the first direction D1 on the substrate 1 of the cell array region CAR and may be spaced apart from each other in the second direction D2 that is substantially perpendicular to the first direction D1. In other words, the electrode portions EP may be laterally spaced apart from each other. Each of the electrode portions EP may have a first width w1 in the second direction D2. In the lower stack structure 10, the electrode portions EP of the first to fourth lower electrodes 10a to 10d may overlap with each other in a plan view.

The electrode connection portion ECP may horizontally extend in the second direction D2 on the connection region CNR adjacent to the cell array region CAR, and thus the electrode connection portion ECP may horizontally connect the electrode portions EP to each other. In other words, in each of the electrode structures ST1 and ST2, the electrode portions EP disposed at the same distance/height (or level) from the substrate 1 may be in an equipotential state by the electrode connection portion ECP. In the lower stack structure 10, the electrode connection portions ECP of the first to fourth lower electrodes 10a to 10d may overlap with each other in a plan view.

The first and second extension portions EXP1 and EXP2 may extend from the electrode connection portion ECP in the first direction D1 onto the connection region CNR and may be spaced apart from each other. Each of the first and second extension portions EXP1 and EXP2 may have the first width w1 in the second direction D2. In other words, the widths w1 of the first and second extension portions EXP1 and EXP2 in the second direction D2 may be substantially equal to the widths w1 of the electrode portions EP in the second direction D2. In addition, a distance in the second direction D2 between the first and second extension portions EXP1 and EXP2 may be substantially equal to a distance in the second direction D2 between the electrode portions EP.

Figure 7A:
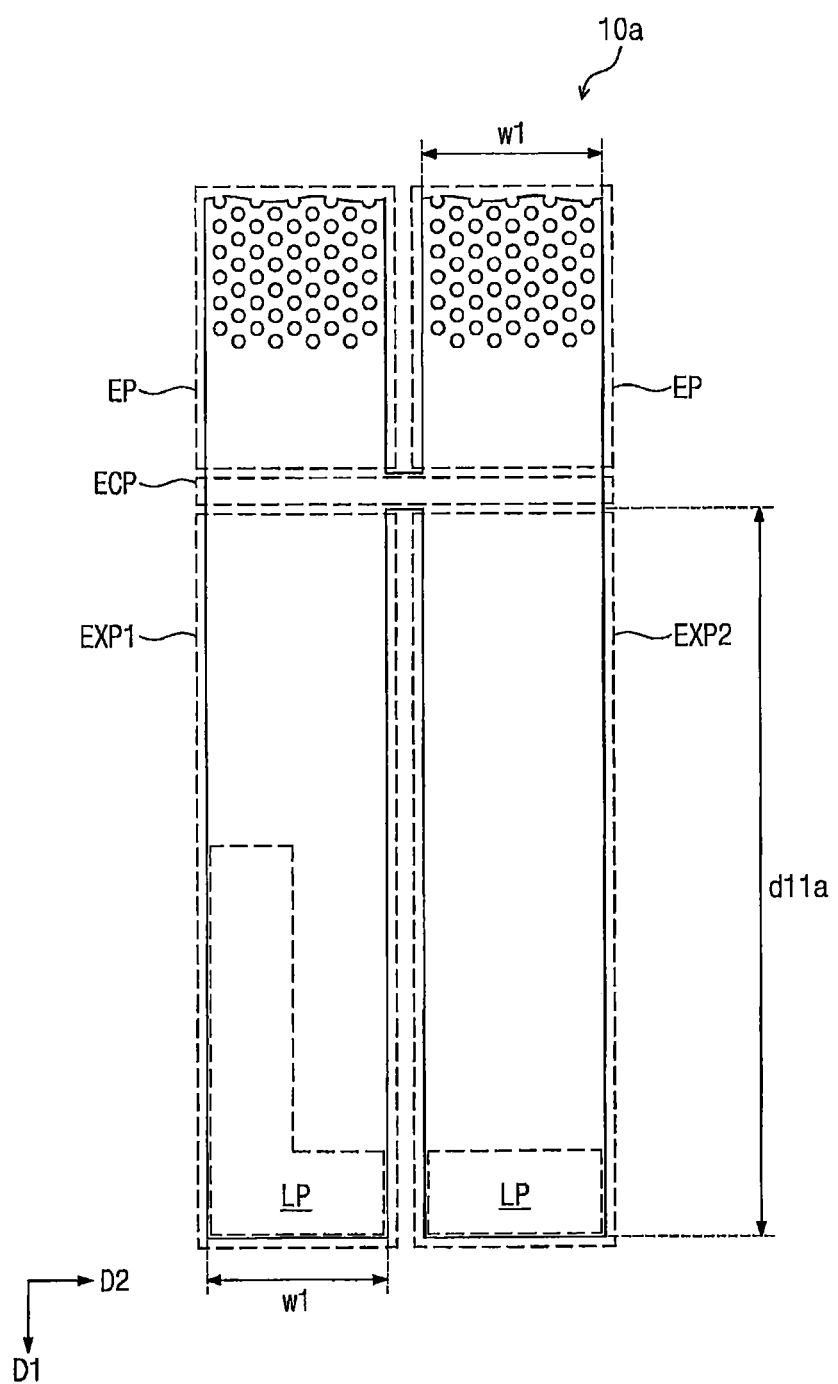

In some embodiments, the first and second extension portions EXP1 and EXP2 of the first lower electrode 10a may extend from the electrode connection portion ECP in the first direction D1 by a first length d11a, as illustrated in FIG. 7A. Both the first extension portion EXP1 of the first lower electrode 10a and the second extension portion EXP2 of the first lower electrode 10a may have the first length d11a. In addition, the first lower electrode 10a may have the lower pad region LP corresponding to end portions of the first and second extension portions EXP1 and EXP2 thereof.

Figure 6:
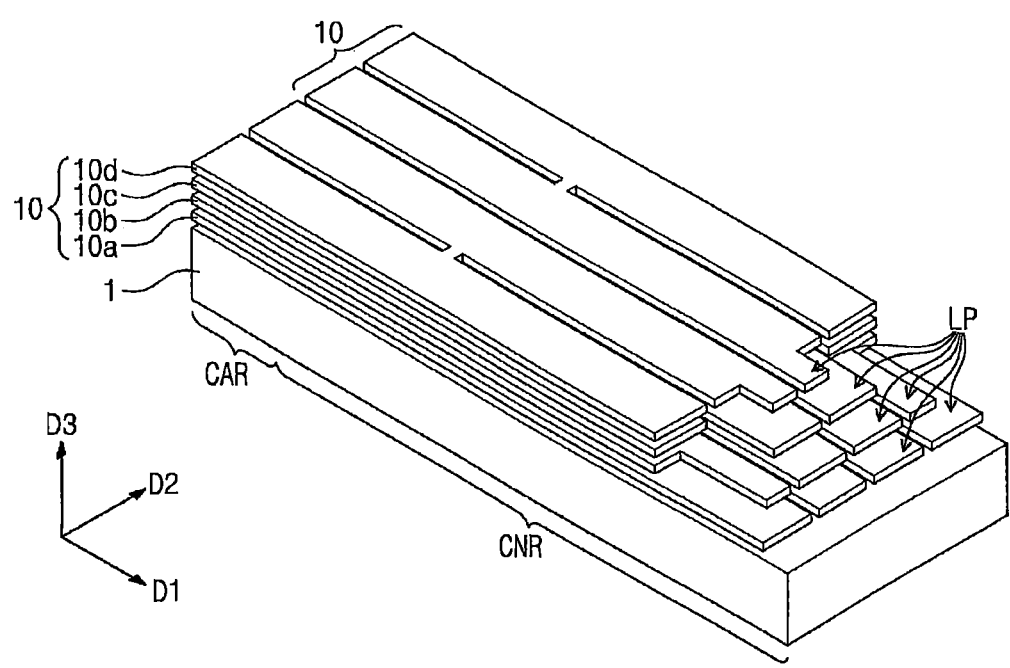
FIGS. 6 and 7A to 7D are views illustrating a lower stack structure of an electrode structure according to some embodiments of the inventive concepts.
Figure 7B:
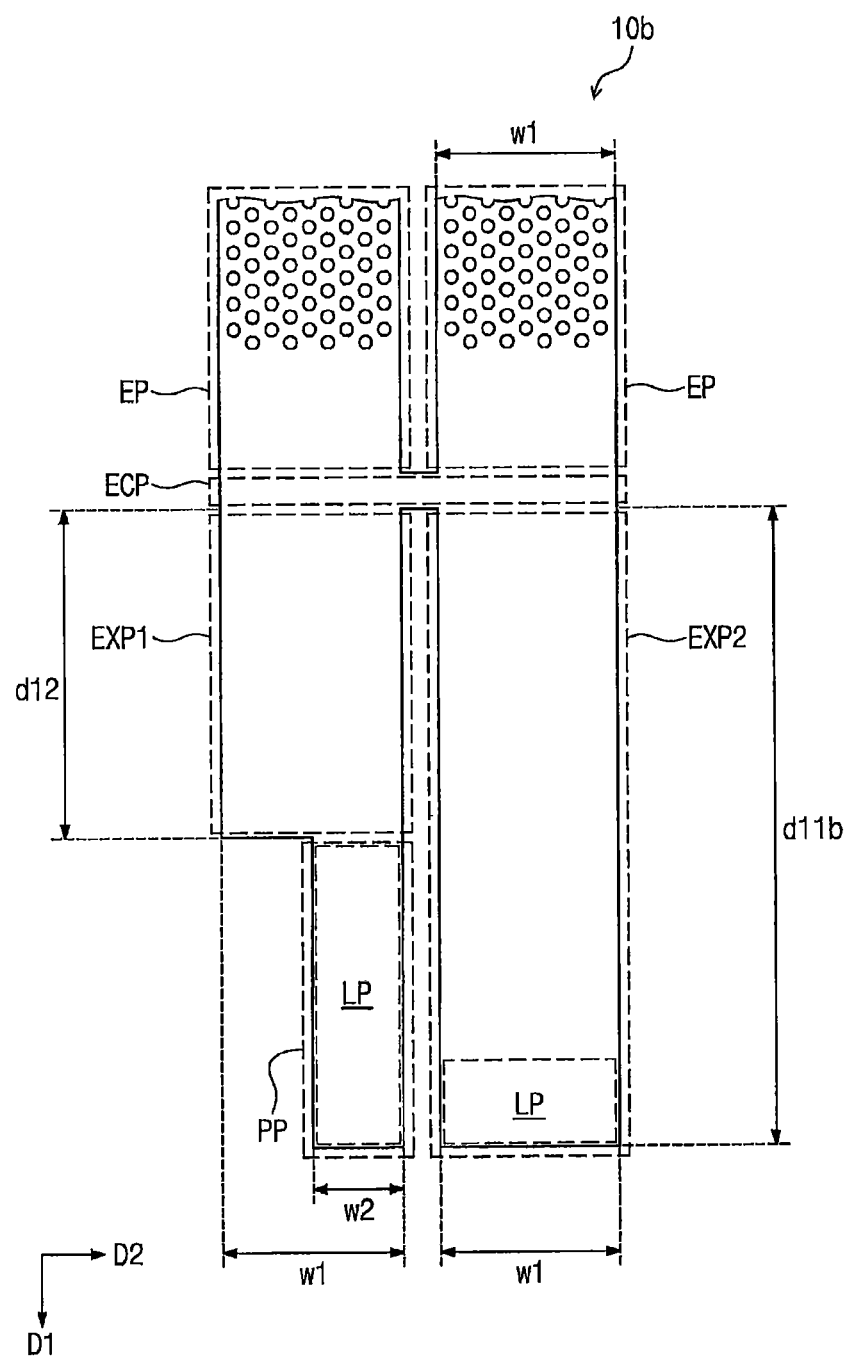

Referring to FIGS. 6 and 7B, the first and second extension portions EXP1 and EXP2 of the second lower electrode 10b may extend from the electrode connection portion ECP in the first direction D1 and may have different lengths from each other. For example, a second length d12 of the first extension portion EXP1 of the second lower electrode 10b may be smaller than a third length d11b of the second extension portion EXP2 of the second lower electrode 10b. In addition, the second lower electrode 10b may include a protrusion portion PP that protrudes from the first extension portion EXP1 in the first direction D1. Here, the protrusion portion PP may have a second width w2 smaller than the first width w1 of the first extension portion EXP1. The second lower electrode 10b may have the lower pad region LP corresponding to the protrusion portion PP and an end portion of the second extension portion EXP2.

Figure 7C:
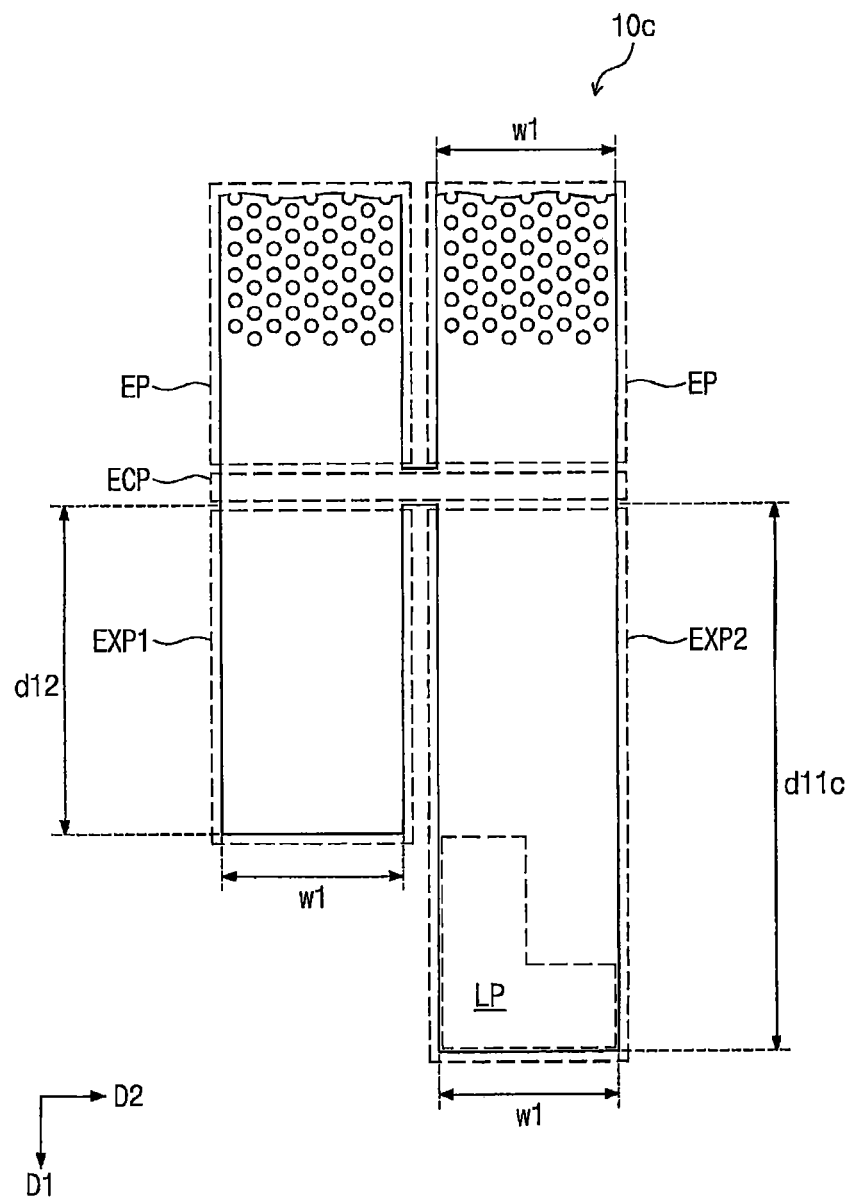

Referring to FIGS. 6 and 7C, the second length d12 of the first extension portion EXP1 of the third lower electrode 10c may be smaller than a fourth length d11c of the second extension portion EXP2 of the third lower electrode 10c. The first extension portion EXP1 of the third lower electrode 10c may expose the protrusion portion PP of the second lower electrode 10b. The third lower electrode 10c may have the lower pad region LP corresponding to a portion of the second extension portion EXP2 thereof.

Figure 7D:
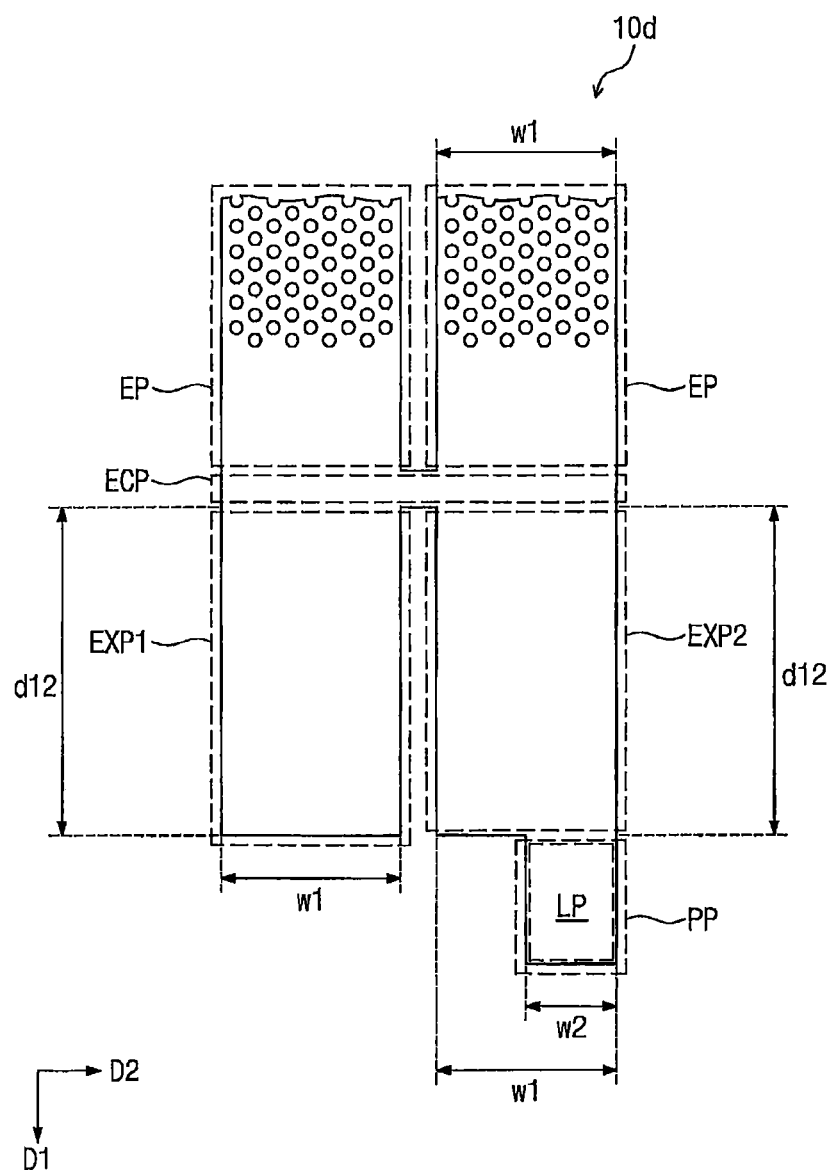

Referring to FIGS. 6 and 7D, the first extension portion EXP1 of the fourth lower electrode 10d may expose the protrusion portion PP of the second lower electrode 10b. The fourth lower electrode 10d may include a protrusion portion PP that protrudes from the second extension portion EXP2 in the first direction D1. Here, the protrusion portion PP of the fourth lower electrode 10d may have a width w2 smaller than a width w1 of the second extension portion EXP2 of the fourth lower electrode 10d. The fourth lower electrode 10d may have the lower pad region LP corresponding to the protrusion portion PP thereof.

The lower stack structure 10 including four lower electrodes 10a to 10d is described as an example. However, the inventive concepts are not limited thereto. In some embodiments, the number of the lower electrodes 10a to 10d of the lower stack structure 10 may be greater than 4. In addition, the number of the electrode portions EP and the number of the extension portions EXP1 and EXP2 in each of the lower electrodes 10a to 10d may vary. Furthermore, in some embodiments, the number of the electrode portions EP may be different from the number of the extension portions EXP1 and EXP2 in each of the lower electrodes 10a to 10d.

Referring to FIGS. 8 and 9A to 9D, the intermediate stack structure 20 may include first to fourth intermediate electrodes 20a to 20d sequentially stacked. Each of the first to fourth intermediate electrodes 20a to 20d may include a plurality of electrode portions EP, an electrode connection portion ECP, and one or more extension portions EXP1 and EXP2.

In some embodiments, the first to fourth intermediate electrodes 20a to 20d may have sidewalls vertically substantially aligned with each other on the connection region CNR. Here, the sidewalls vertically substantially aligned with each other may be defined or formed by one etching process. In other words, the sidewalls, which are vertically substantially aligned with each other, of the first to fourth intermediate electrodes 20a to 20d may be substantially coplanar with each other.

In some embodiments, each of the first to fourth intermediate electrodes 20a to 20d may include first and second extension portions EXP1 and EXP2. In some embodiments, the electrode portions EP and the electrode connection portions ECP of the first to fourth intermediate electrodes 20a to 20d may have the same shapes as the electrode portions EP and the electrode connection portions ECP of the first to fourth lower electrodes 10a to 10d. Thus, the electrode portions EP and the electrode connection portions ECP of the first to fourth intermediate electrodes 20a to 20d may overlap with the electrode portions EP and the electrode connection portions ECP of the first to fourth lower electrodes 10a to 10d in a plan view.

Figure 8:
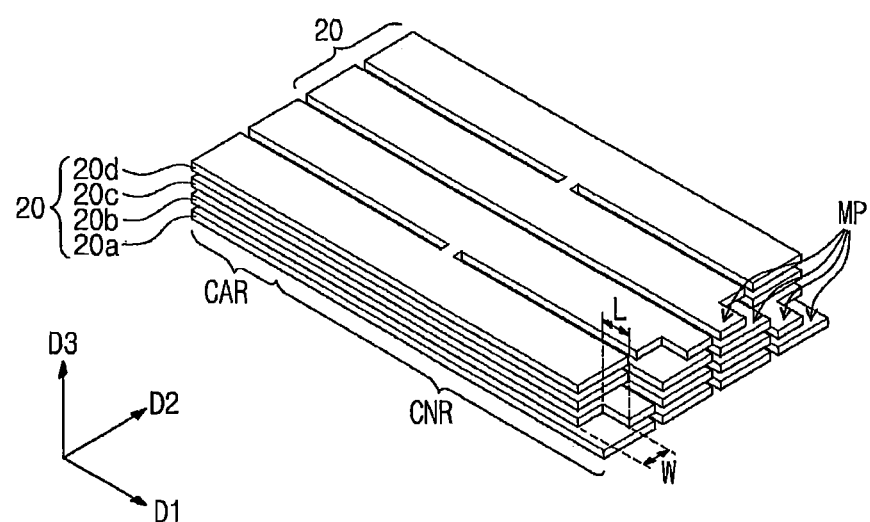
FIGS. 8 and 9A to 9D are views illustrating an intermediate stack structure of an electrode structure according to some embodiments of the inventive concepts.
Figure 9A:
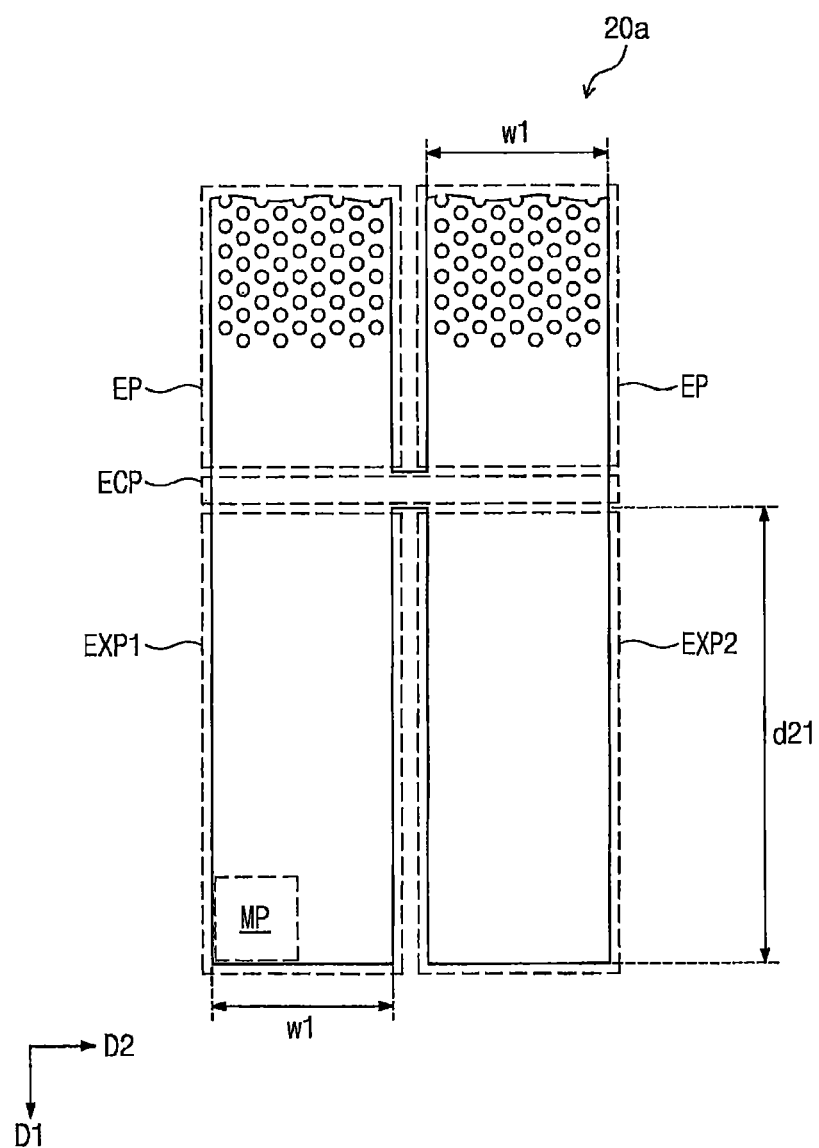

Referring to FIGS. 8 and 9A, the first intermediate electrode 20a may have the substantially same structure as the first lower electrode 10a. However, fifth lengths d21, in the first direction D1, of the first and second extension portions EXP1 and EXP2 of the first intermediate electrode 20a may be smaller than the first lengths d11a, in the first direction D1, of the first and second extension portions EXP1 and EXP2 of the first lower electrodes 10a. The first intermediate electrode 20a may have the intermediate pad region MP disposed at an end portion of the first extension portion EXP1 thereof.

Figure 9B:
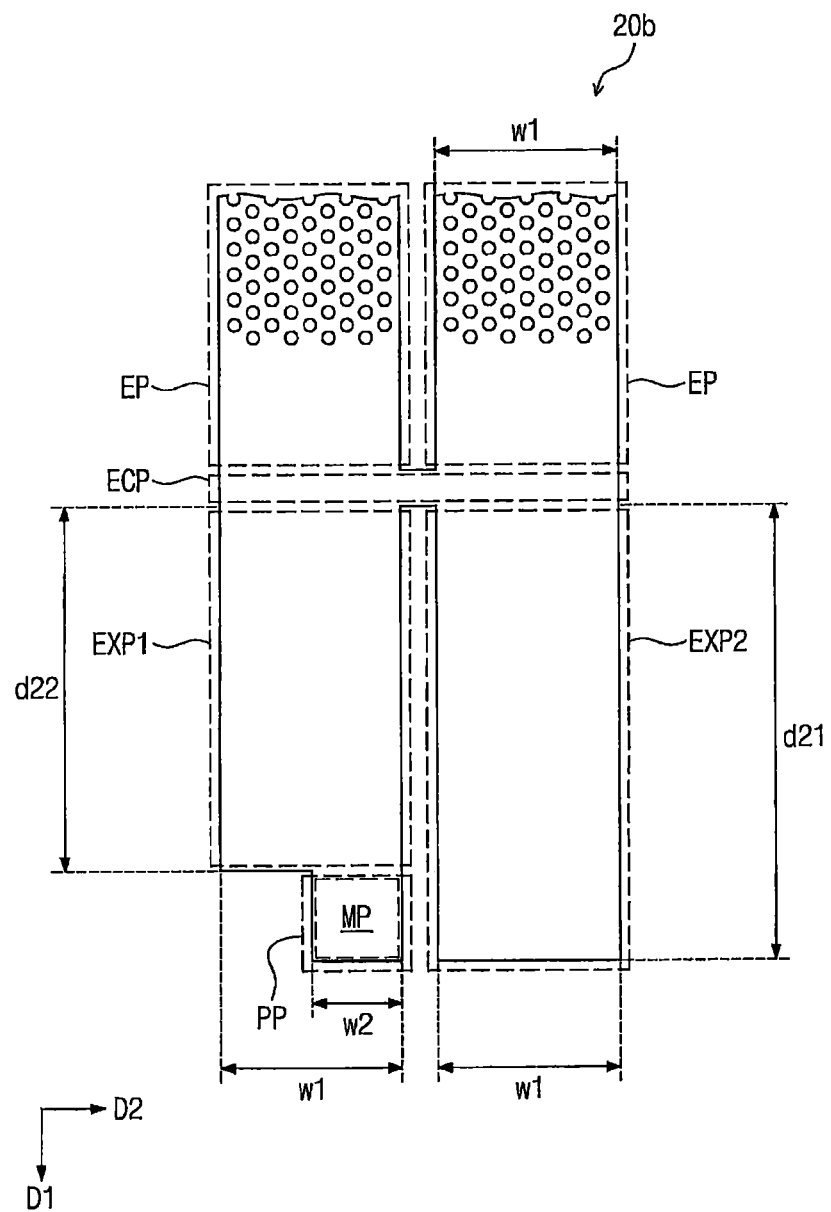

Referring to FIGS. 8 and 9B, the second intermediate electrode 20b may include the first and second extension portions EXP1 and EXP2 having the fifth length d21 and a sixth length d22 different from each other. The second intermediate electrode 20b may include a protrusion portion PP that protrudes from the first extension portion EXP1 in the first direction D1. In other words, the second intermediate electrode 20b may have the substantially same structure as the second lower electrode 10b. However, a length, in the first direction D1, of the protrusion portion PP of the second intermediate electrode 20b may be smaller than the length, in the first direction D1, of the protrusion portion PP of the second lower electrode 10b. The second intermediate electrode 20b may have the intermediate pad region MP corresponding to the protrusion portion PP thereof.

Figure 9C:
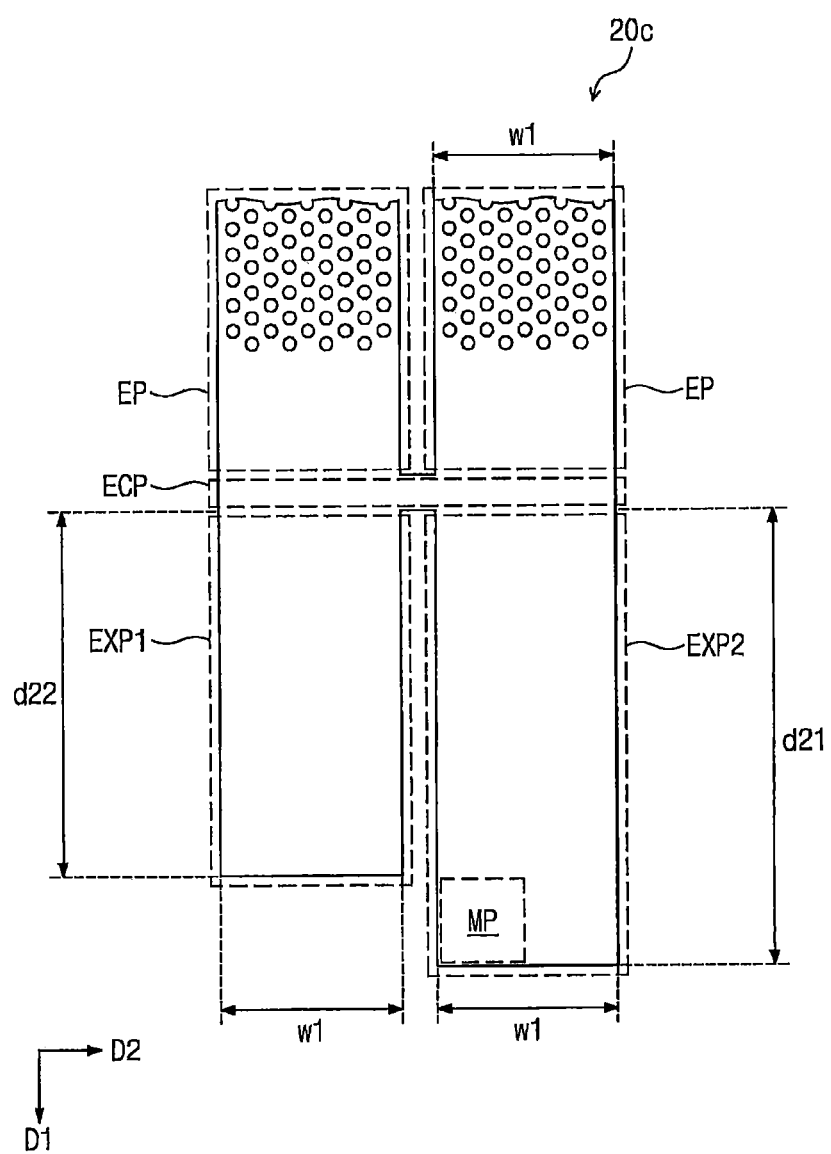

Referring to FIGS. 8 and 9C, the third intermediate electrode 20c may have the substantially same structure as the third lower electrode 10c. However, the fifth and sixth lengths d21 and d22, in the first direction D1, of the first and second extension portions EXP1 and EXP2 of the third intermediate electrode 20c may be smaller than the fourth and second lengths d11c and d12, in the first direction D1, of the first and second extension portions EXP1 and EXP2 of the third lower electrodes 10c, respectively. The first extension portion EXP1 of the third intermediate electrode 20c may expose the protrusion portion PP of the second intermediate electrode 20b. The third intermediate electrode 20c may have the intermediate pad region MP disposed at an end portion of the second extension portion EXP2 thereof.

Figure 9D:
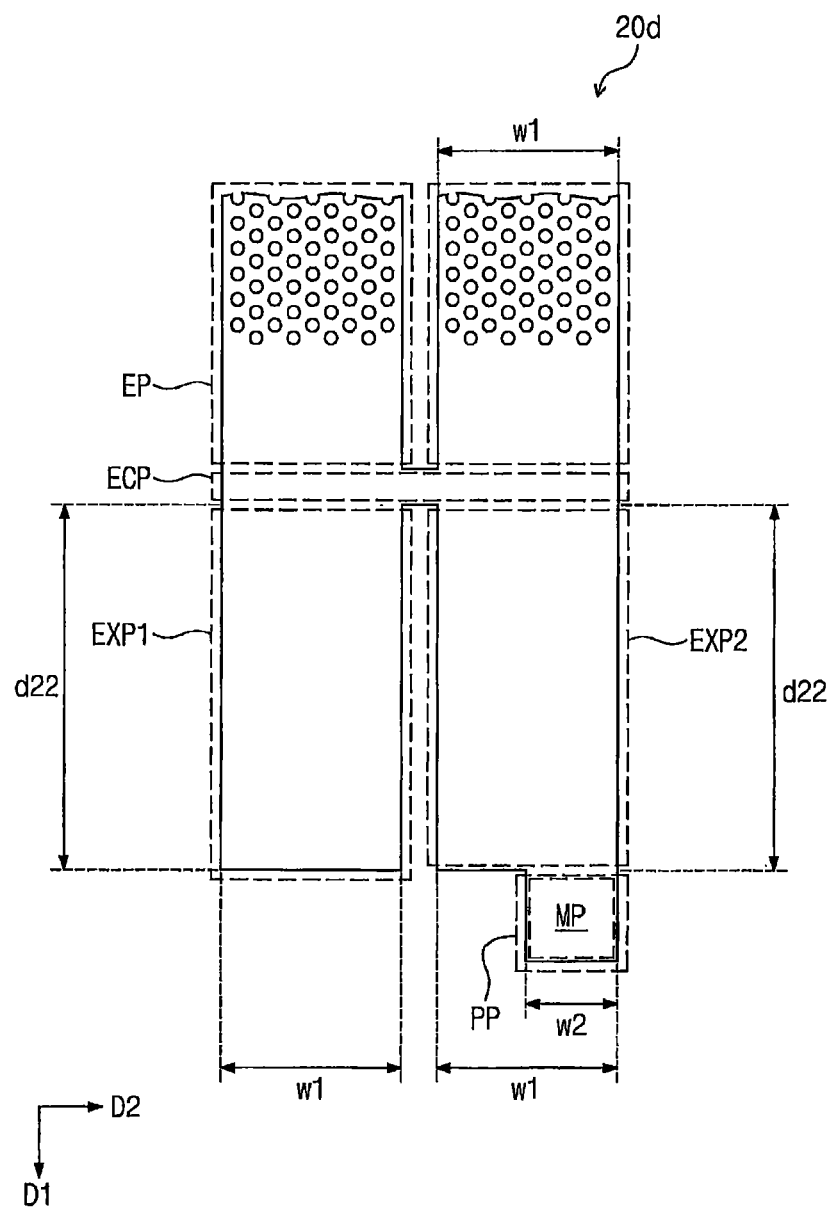

Referring to FIGS. 8 and 9D, the fourth intermediate electrode 20d may include the first and second extension portions EXP1 and EXP2 having lengths substantially equal to each other. In addition, the fourth intermediate electrode 20d may further include a protrusion portion PP protruding from the second extension portion EXP2 in the first direction D1. The fourth intermediate electrode 20d may have the substantially same structure as the fourth lower electrode 10d of FIG. 7D. However, a length, in the first direction D1, of the protrusion portion PP of the fourth intermediate electrode 20d may be smaller than the length, in the first direction D1, of the protrusion portion PP of the fourth lower electrode 10d of FIG. 7D. The fourth intermediate electrode 20d may have the intermediate pad region MP corresponding to the protrusion portion PP thereof.

In some embodiments, the intermediate stack structure 20 may include four intermediate electrodes 20a to 20d as described with reference to FIGS. 8 and 9A to 9D. However, the inventive concepts are not limited thereto. The number of the intermediate electrodes 20a to 20d of the intermediate stack structure 20 may vary. In addition, the number of the electrode portions EP and the number of the extension portions EXP1 and EXP2 in each of the intermediate electrodes 20a to 20d may vary.

Figure 11:
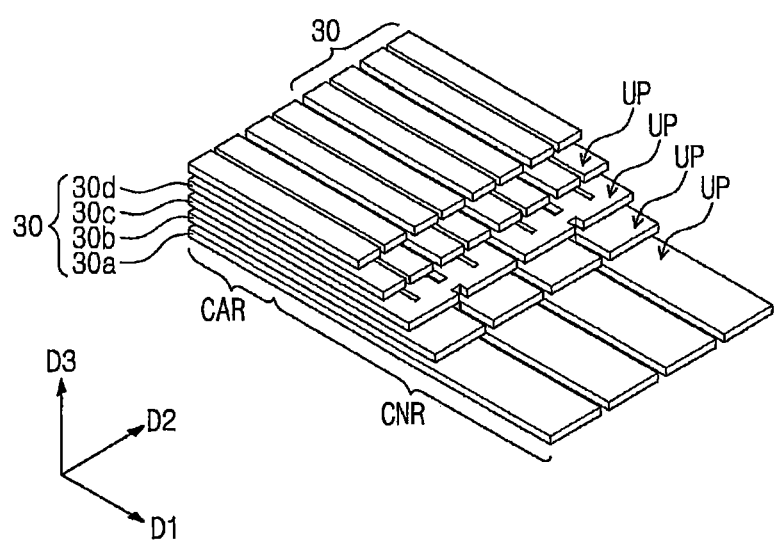
FIGS. 11 and 12A to 12C are views illustrating an upper stack structure of an electrode structure according to some embodiments of the inventive concepts.

Referring to FIGS. 11 and 12A to 12C, the upper stack structure 30 may include first to fourth upper electrodes 30a to 30d sequentially stacked. Sidewalls of the first to fourth upper electrodes 30a to 30d, which are substantially parallel to, e.g., the second direction D2, may be horizontally spaced apart from each other in the first direction D1 in a plan view. In addition, a horizontal distance between the sidewall of the first upper electrode 30a and the sidewall of the second upper electrode 30b in the first direction D1 may be greater than a horizontal distance between the sidewalls of the second and third upper electrodes 30b and 30c in the first direction D1, as illustrated in FIG. 11.

Figure 12A:
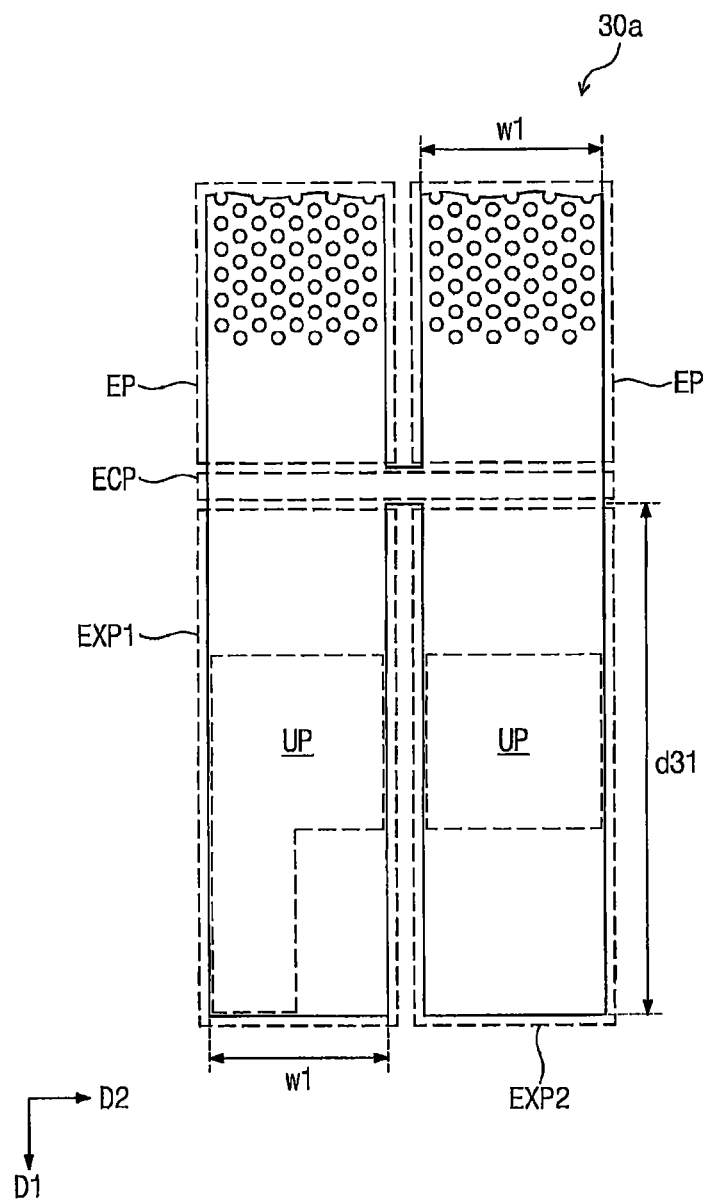

Referring to FIGS. 11 and 12A, the first upper electrode 30a may include a plurality of electrode portions EP, an electrode connection portion ECP, and first and second extension portions EXP1 and EXP2, like the first lower electrode 10a and the first intermediate electrode 20a described above. In addition, seventh lengths d31 of the first and second extension portions EXP1 and EXP2 of the first upper electrode 30a may be substantially equal to each other.

In some embodiments, the upper dummy electrodes 40a to 40c of FIG. 5 may be disposed on the first and second extension portions EXP1 and EXP2 of the first upper electrode 30a, as described with reference to FIG. 5. The upper dummy electrodes 40a to 40c of FIG. 5 may have sidewalls vertically substantially aligned with a sidewall of the first upper electrode 30a. The upper dummy electrodes 40a to 40c of FIG. 5 may expose portions of the first and second extension portions EXP1 and EXP2 of the first upper electrode 30a. In other words, the first upper electrode 30a may have the upper pad region UP corresponding to portions of the first and second extension portions EXP1 and EXP2. The upper pad region UP of the first upper electrode 30a may be disposed between the second upper electrode 30b and the upper dummy electrodes 40a to 40c of FIG. 5 in a plan view.

Figure 12B:
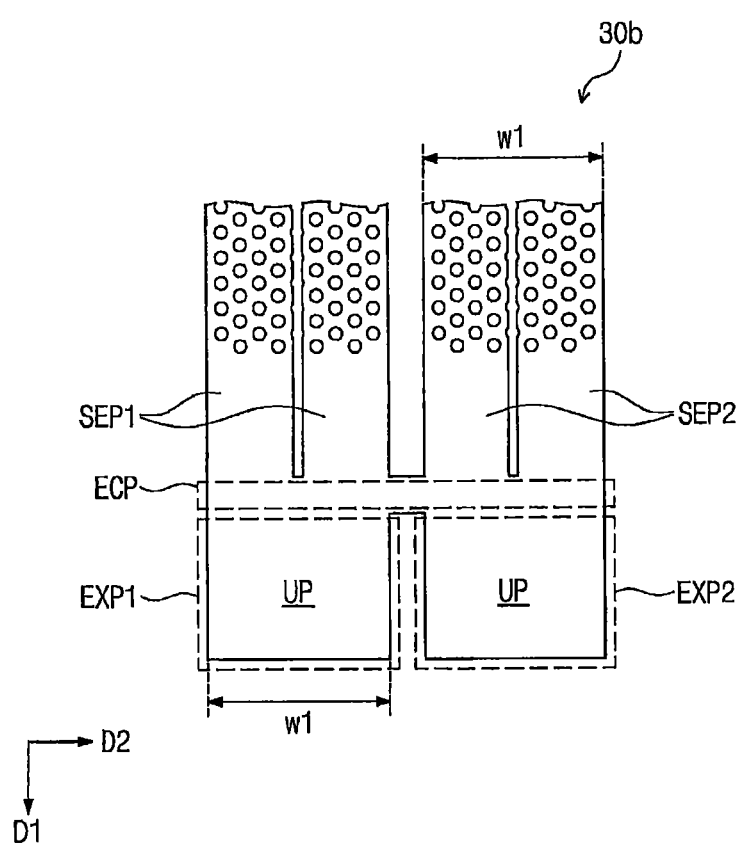

Referring to FIGS. 11 and 12B, the second upper electrode 30b may include a plurality of first and second sub-electrode portions SEP1 and SEP2, an electrode connection portion ECP, and extension portions EXP1 and EXP2.

The first and second sub-electrode portions SEP1 and SEP2 of the second upper electrode 30b may extend in the first direction D1 on the cell array region CAR and may overlap with the electrode portions EP of the first upper electrode 30a in a plan view. A width of each of the first and second sub-electrode portions SEP1 and SEP2 may be equal to or smaller than about a half of a width w1 of each of the electrode portions EP of the first upper electrode 30a.

The electrode connection portion ECP of the second upper electrode 30b may extend in the second direction D2 on the connection region CNR to horizontally connect the first and second sub-electrode portions SEP1 and SEP2 to each other. The second upper electrode 30b may have the upper pad region UP disposed at the first and second extension portions EXP1 and EXP2.

The first and second extension portions EXP1 and EXP2 of the second upper electrode 30b may extend in the first direction D1 on the connection region CNR.

Figure 12C:
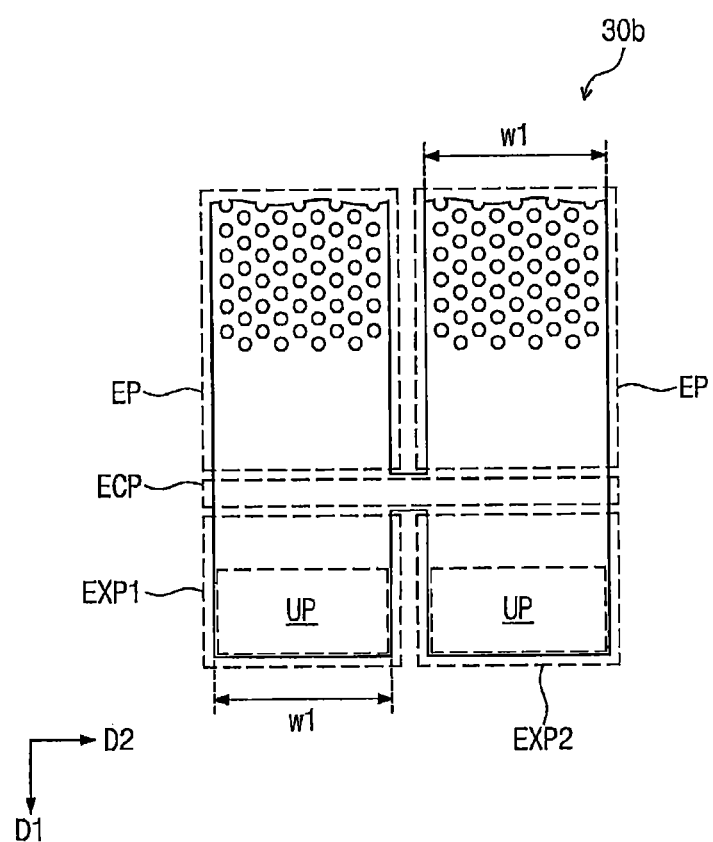

In some embodiments, the second upper electrode 30b may include electrode portions EP of which widths are substantially equal to those of the first and second extension portions EXP1 and EXP2, as illustrated in FIG. 12C.

As illustrated in FIG. 11, the third and fourth upper electrodes 30c and 30d may have line shapes extending in the first direction D1, and a width of each of the third and fourth upper electrodes 30c and 30d may be smaller than about a half of the width of the electrode portion EP of the first upper electrode 30a. The third upper electrodes 30c may overlap with the first and second sub-electrode portions SEP1 and SEP2 of the second upper electrode 30b, respectively, in a plan view. The fourth upper electrode 30d may have the substantially same structure as the third upper electrode 30c. However, the fourth upper electrode 30d may expose an end portion of the third upper electrode 30c on the connection region CNR.

Figure 13:
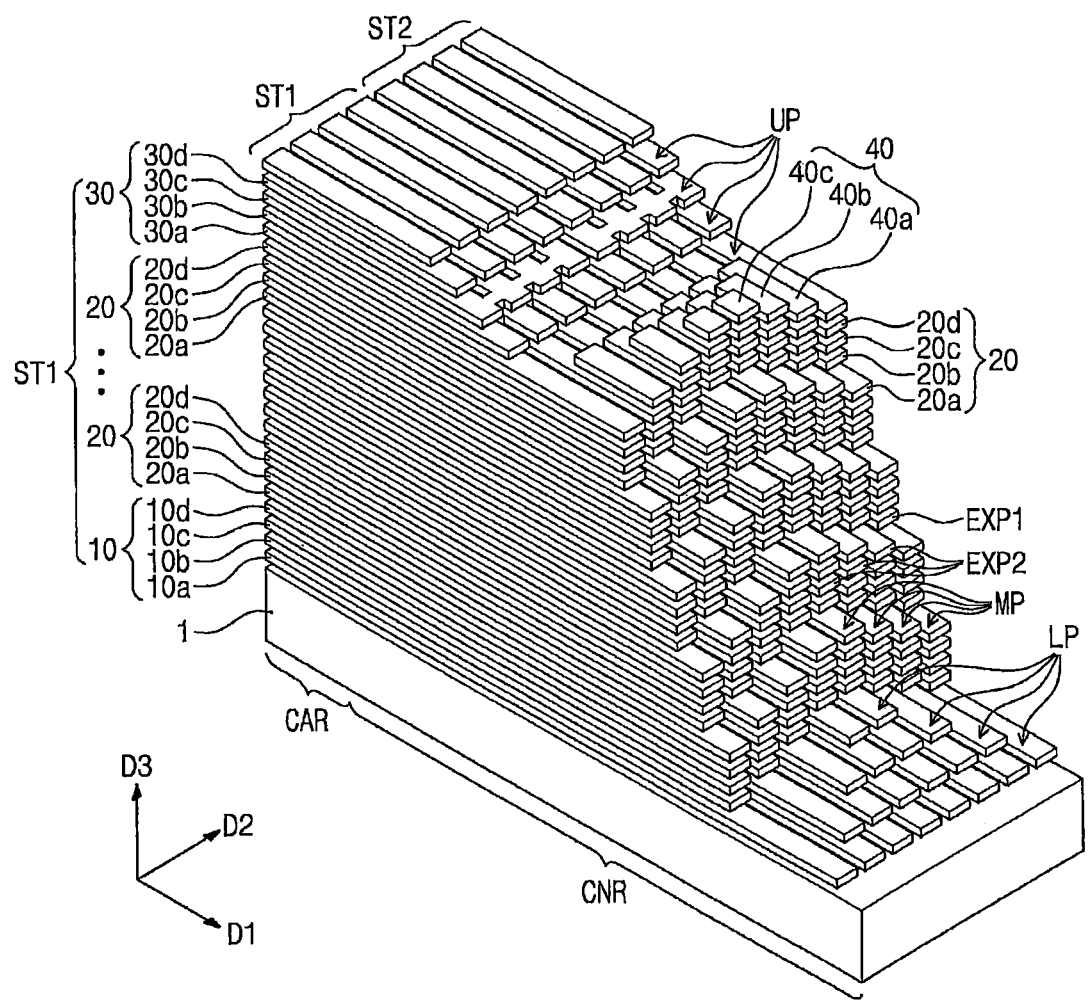
FIG. 13 is a perspective view illustrating an electrode structure according to some embodiments of the inventive concepts.
Figure 14:
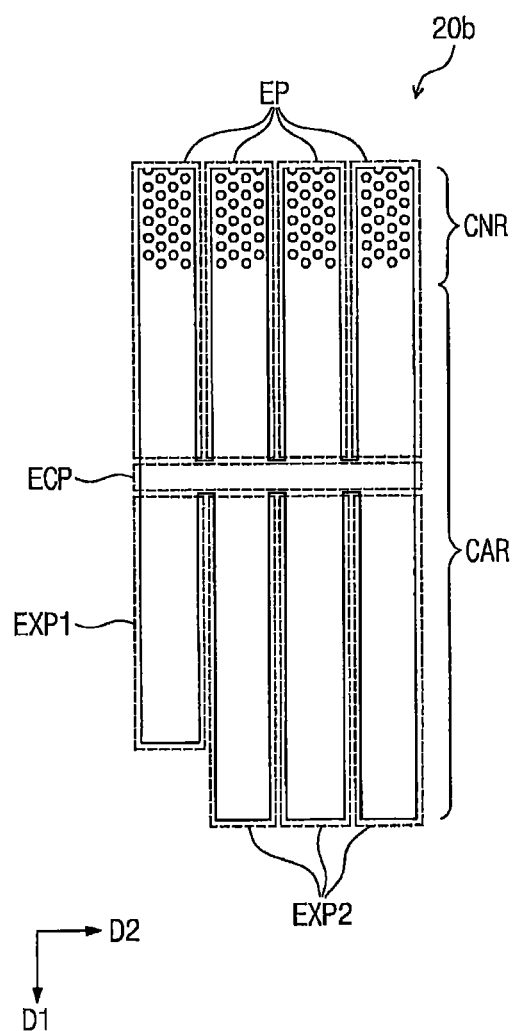
FIG. 14 is a view illustrating an intermediate stack structure of the electrode structure illustrated in FIG. 13.

FIG. 13 is a perspective view illustrating an electrode structure of a 3D semiconductor memory device according to some embodiments of the inventive concepts. FIG. 14 is a view illustrating an intermediate stack structure of the electrode structure illustrated in FIG. 13. Hereinafter, the same elements as described in the embodiments of FIGS. 4 to 12C will be indicated by the same reference numerals or the same reference designators, and the descriptions thereto will be omitted or mentioned briefly for the purpose of ease and convenience in explanation.

According to the embodiment illustrated in FIGS. 13 and 14, each of electrodes 10a to 10d, 20a to 20d, and 30a to 30d may include a plurality of electrode portions EP, a plurality of extension portions EXP1 and EXP2, and an electrode connection portion ECP, as described above. According to the present embodiment, the extension portions EXP1 and EXP2 may have uniform widths in the second direction D2 and may extend in the first direction D1. In some embodiments, the number of the electrode portions EP may be equal to the number of the extension portions EXP1 and EXP2 in each of the electrodes 10a to 10d, 20a to 20d, and 30a to 30d.

As illustrated in FIG. 14, at least one of the intermediate electrodes 20b to 20d may include a first extension portion EXP1 having a first length in the first direction D1 and a second extension portion EXP2 having a second length in the first direction D1. Here, the second length may be greater than the first length. In each of the intermediate stack structures 20, the numbers of the second extension portions EXP2 of the intermediate electrodes 20a to 20d may decrease sequentially as distances/heights of the intermediate electrodes 20a to 20d from the substrate 1 increase sequentially. The extension portions of the lowermost intermediate electrode 20a in each of the intermediate stack structures 20 may have lengths in the first direction D1, which are substantially equal to each other, as illustrated in FIG. 13.

Figure 15:
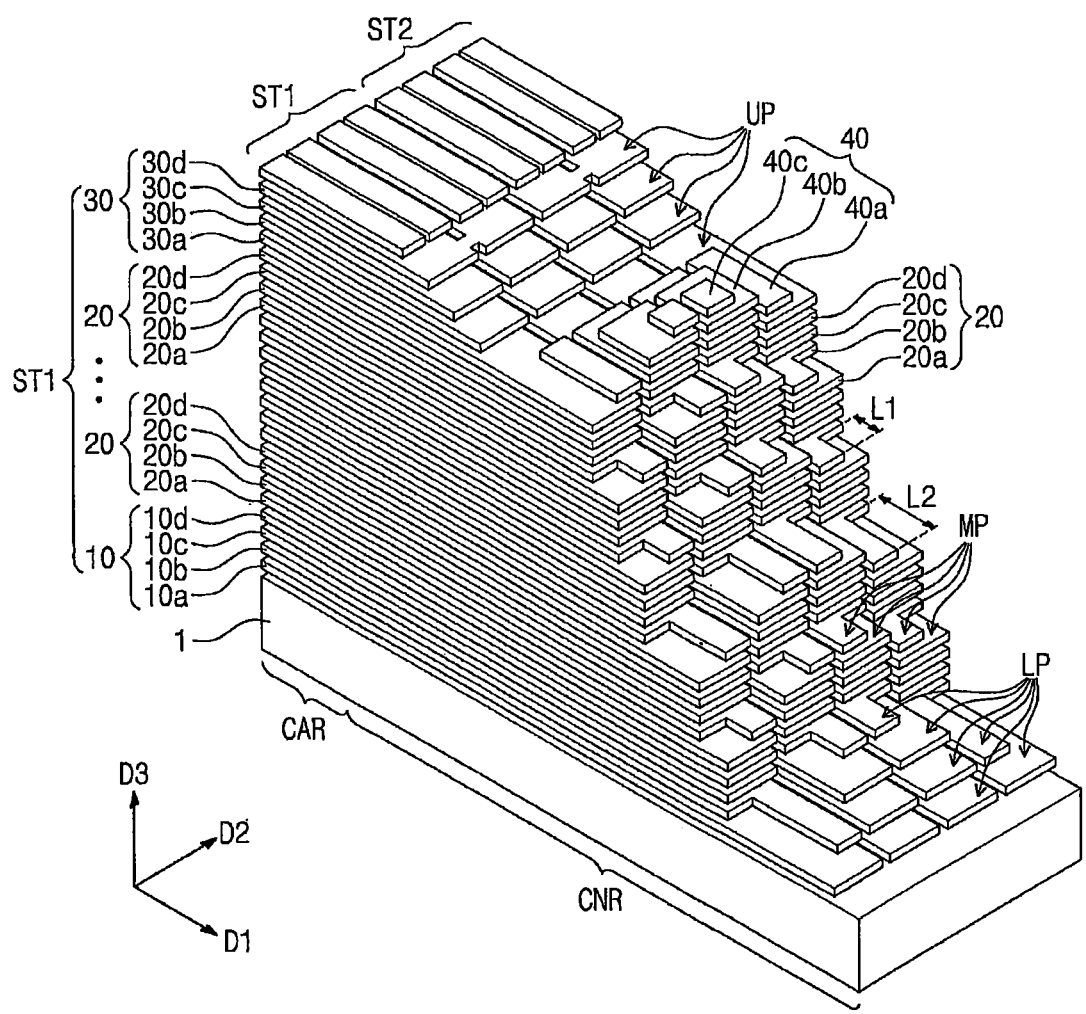
FIGS. 15, 16, and 17 are perspective views illustrating electrode structures according to some embodiments of the inventive concepts.
Figure 16:
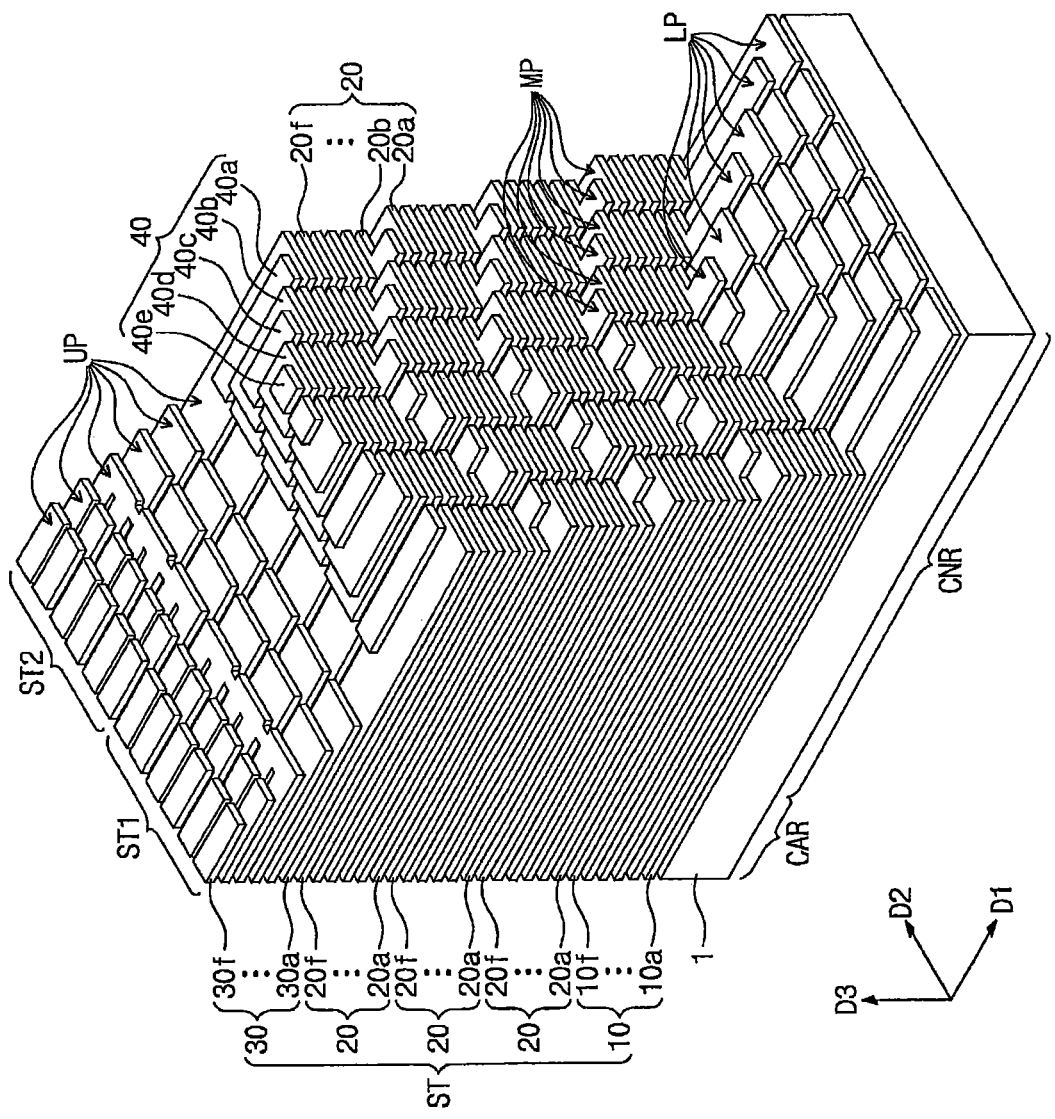
Figure 17:
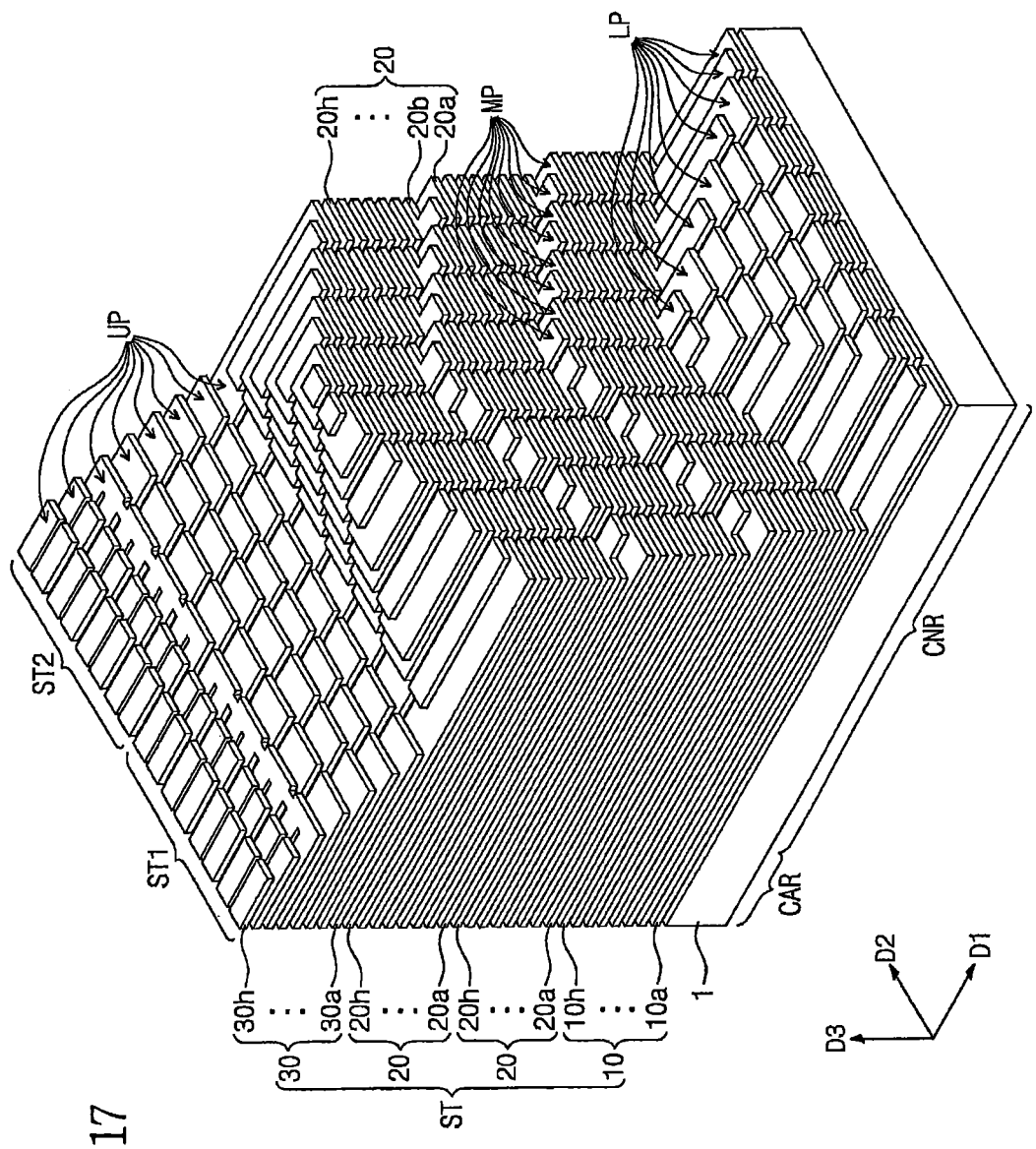

FIGS. 15, 16, and 17 are perspective views illustrating electrode structures of 3D semiconductor memory devices according to some embodiments of the inventive concepts. Hereinafter, the same elements as described in the embodiments of FIGS. 4 to 12C will be indicated by the same reference numerals or the same reference designators, and the descriptions thereto will be omitted or mentioned briefly for the purpose of ease and convenience in explanation.

Referring to FIGS. 15, 16, and 17, each of the first and second electrode structures ST1 and ST2 may include the lower stack structure 10, the upper stack structure 30, and a plurality of the intermediate stack structures 20 stacked between the lower stack structure 10 and the upper stack structure 30, as described above.

According to the embodiment of FIG. 15, the intermediate stack structures 20 may be vertically stacked on the lower stack structure 10 and may constitute a stair step structure along the first direction D1. In other words, each of the intermediate stack structures 20 may expose an end portion of the intermediate stack structure 20 disposed thereunder. Each of the intermediate stack structures 20 may have a third stair step structure which is formed along the second direction D2 by the intermediate electrodes 20a to 20d. Here, each of the intermediate stack structures 20 may be spaced apart from one sidewall of the intermediate stack structure 20 disposed thereunder by a first horizontal distance L1 or a second horizontal distance L2 that is greater than the first horizontal distance L1 as illustrated in FIG. 15. Each of the intermediate electrodes 20a to 20d included in each of the intermediate stack structures 20 may have an intermediate pad region MP exposed by one of the intermediate electrodes disposed immediately thereon, as described with reference to FIG. 4. In some embodiments, a length L2 of the intermediate pad region MP of one of the intermediate stack structures 20 may be greater than a length L1 of the intermediate pad region MP of another of the intermediate stack structures 20.

According to some embodiments, the number of the electrodes of each of the lower, intermediate, and upper stack structures 10, 20, and 30 may be changed.

According to the embodiment of FIG. 16, each of lower, intermediate, and upper stack structures 10, 20, and 30 may include six electrodes sequentially stacked. The number of the pad regions LP, MP, or UP arranged along the second direction D2 in each of the stack structures 10, 20, and 30 may increase as the number of the electrodes of each of the stack structures 10, 20, and 30 increases. For example, each of the intermediate stack structures 20 may include six intermediate pad regions MP.

According to the embodiment of FIG. 17, each of lower, intermediate, and upper stack structures 10, 20, and 30 may include eight electrodes sequentially stacked. In the present embodiment, each of the intermediate stack structures 20 may include eight intermediate pad regions MP that are arranged in the second direction D2 in a plan view.

Figure 18:
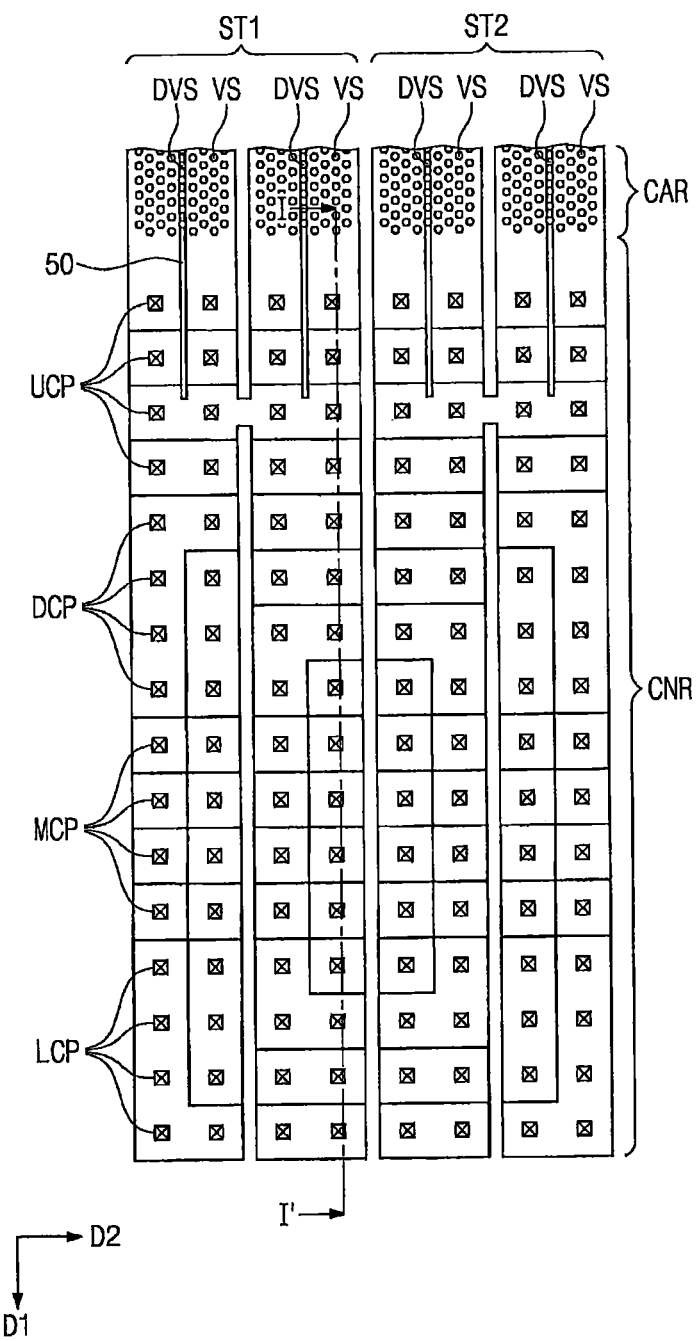
FIG. 18 is a plan view illustrating contact plugs connected to an electrode structure of a 3D semiconductor memory device according to some embodiments of the inventive concepts.
Figure 19:
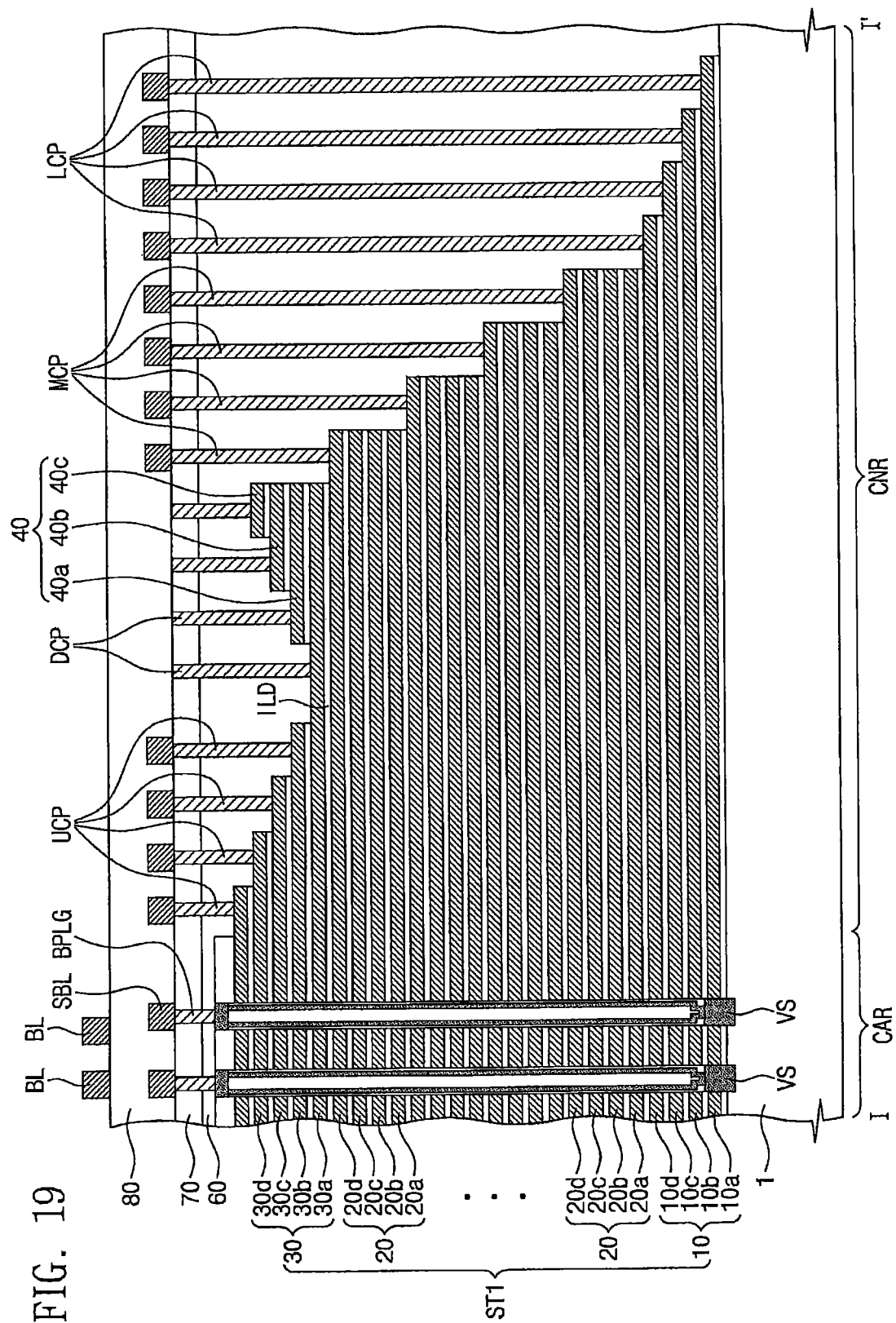
FIG. 19 is a cross-sectional view taken along the line I-I' of FIG. 18 to illustrate a 3D semiconductor memory device according to some embodiments of the inventive concepts.

FIG. 18 is a plan view illustrating contact plugs connected to an electrode structure of a 3D semiconductor memory device according to some embodiments of the inventive concepts. FIG. 19 is a cross-sectional view taken along the line I-I' of FIG. 18 to illustrate a 3D semiconductor memory device according to some embodiments of the inventive concepts.

Referring to FIGS. 18 and 19, a substrate 1 may include a cell array region CAR and a connection region CNR. First and second electrode structures ST1 and ST2 may be disposed on the substrate 1. Each of the first and second electrode structures ST1 and ST2 may include a lower stack structure 10, a plurality of intermediate stack structures 20, and an upper stack structure 30, as described with reference to FIGS. 4 to 12C. The lower stack structure 10 may include a plurality of lower electrodes 10a to 10d and may have a first stair step structure formed along a first direction D1 and a second stair step structure formed along a second direction D2 on the connection region CNR. Each of the lower electrodes 10a to 10d may have a lower pad region LP on the connection region CNR, as described with reference to FIG. 4.

The intermediate stack structures 20 may expose an end portion of the lower stack structure 10 and may be stacked to have a stair step structure formed along the first direction D1. Each of the intermediate stack structures 20 may include a plurality of intermediate electrodes 20a to 20d and may have a third stair step structure which is formed along the second direction D2 on the connection region CNR. In each of the intermediate stack structures 20, each of the intermediate electrodes 20a to 20d may have an intermediate pad region MP on the connection region CNR, as described with reference to FIG. 4.

The upper stack structure 30 may expose end portions of the intermediate stack structures 20 and the end portion of the lower stack structure 10. The upper stack structure 30 may include a plurality of upper electrodes 30a to 30d and may have a fourth stair step structure which is formed along the first direction D1 on the connection region CNR. Each of the upper electrodes 30a to 30d may have an upper pad region UP on the connection region CNR, as described with reference to FIG. 4. In addition, an upper dummy stack structure 40 including a plurality of upper dummy electrodes 40a to 40c may be laterally spaced apart from the upper stack structure 30 and may be disposed on the connection region CNR. In some embodiments, the upper dummy electrodes 40a to 40c may be electrically floating (e.g., electrically disconnected from other elements).

Technical features of the first and second electrode structures ST1 and ST2 may be the substantially same as those of the first and second electrode structures ST1 and ST2 described with reference to FIGS. 4 to 12C. Thus, in the present embodiment, the same elements as in the embodiments of FIGS. 4 to 12C will be indicated by the same reference numerals or the same reference designators, and the descriptions thereto will be omitted or mentioned briefly for the purpose of ease and convenience in explanation.

In some embodiments, the lowermost one of the lower electrodes 10a to 10d of the lower stack structure 10 may correspond to the ground selection line GSL connected to the ground selection transistors GST described with reference to FIG. 2. In the upper stack structure 30, upper ones, having line shapes, of the upper electrodes 30a to 30d may correspond to the string selection lines SSL1 and SSL2 connected to the string selection transistors SST1 and SST2 described with reference to FIG. 2. In some embodiments, the third and fourth upper electrodes 30c and 30d may be used as the string selection lines SSL1 and SSL2. In the upper stack structure 30, the upper electrode (e.g., the second upper electrode 30b) disposed under the upper electrodes (e.g., 30c and 30d) having the line shapes may correspond to the dummy word line DWL connected to the dummy cells DMC described with reference to FIG. 2. The lower electrodes 10b to 10d, the intermediate electrodes 20a to 20d, and at least one upper electrode 30a, which are disposed between the second upper electrode 30b and the lowermost lower electrode 10a, may correspond to the word lines WL0 to WLn connected to the memory cells MCT described with reference to FIG. 2.

In some embodiments, an isolation insulating pattern 50 may be disposed between the uppermost upper electrodes 30d horizontally spaced apart from each other. In addition, the isolation insulating pattern 50 may extend downward to be disposed between the third upper electrodes 30c and to penetrate the second upper electrode 30b. The isolation insulating pattern 50 may extend from the cell array region CAR onto the connection region CNR in the first direction D1. A length of the isolation insulating pattern 50 in the first direction D1 may be greater than lengths of the upper electrodes having the line shapes (e.g., the uppermost upper electrodes 30d or the third and fourth upper electrodes 30c and 30d) in the first direction D1.

A plurality of interlayer insulating layers 60, 70, and 80 may cover the first and second electrode structures ST1 and ST2 on the substrate 1 of the cell array region CAR and the connection region CNR.

Lower contact plugs LCP, intermediate contact plugs MCP, and upper contact plugs UCP may penetrate some interlayer insulating layers 60 and 70 on the connection region CNR so as to be connected to the first and second electrode structures ST1 and ST2. In some embodiments, the contact plugs LCP, MCP, and UCP may be connected to the vertically stacked electrodes 10a to 10d, 20a to 20d, and 30a to 30d in one-to-one correspondence in each of the first and second electrode structures ST1 and ST2.

Referring to FIG. 18, in more detail, the lower contact plugs LCP may be respectively connected to the lower pad regions LP of the lower electrodes 10a to 10d described with reference to FIG. 4. In each of the first and second electrode structures ST1 and ST2, the lower contact plugs LCP may be disposed on the first and second stair step structures of the lower stack structure 10. In other words, the lower contact plugs LCP may be arranged along the first direction D1 and the second direction D2 in a plan view. Since the lower contact plugs LCP are disposed on the first and second stair step structures, bottom surfaces of the lower contact plugs LCP may be disposed at different distances/heights (or levels) from the substrate 1. Top surfaces of the lower contact plugs LCP may be substantially coplanar with each other as illustrated in FIG. 19.

Interconnection lines may be respectively connected to the lower contact plugs LCP connected to the lower electrodes 10a to 10d disposed at levels different from each other. In some embodiments, a plurality of the lower contact plugs LCP may be connected to one of the lower electrodes 10a to 10d on the connection region CNR. In this case, the plurality of lower contact plugs LCP may be connected in common to one interconnection line.

The intermediate contact plugs MCP may be respectively connected to the intermediate pad regions MP of the intermediate electrodes 20a to 20d described with reference to FIG. 4. In each of the first and second electrode structures ST1 and ST2, the intermediate contact plugs MCP may be disposed on the third stair step structures of each of the intermediate stack structures 20. The third stair step structure may be formed along the second direction D2, and thus the intermediate contact plugs MCP connected to each of the intermediate stack structures 20 may be arranged in the second direction D2 in a plan view. Since the sidewalls of the intermediate stack structures 20 are horizontally spaced apart from each other in the first direction D1, the intermediate contact plugs MCP of the intermediate stack structures 20 may also be arranged in the first direction D1.

Since the intermediate contact plugs MCP are respectively connected to the intermediate electrodes 20a to 20d disposed at levels (e.g., distances/heights) different from each other, vertical lengths (i.e., lengths in the third direction D3) of the intermediate contact plugs MCP may be different from each other. For example, bottom surfaces of the intermediate contact plugs MCP may be disposed at different levels (e.g., distances/heights) from the substrate 1, and top surfaces of the intermediate contact plugs MCP may be substantially coplanar with each other as illustrated in FIG. 19. Interconnection lines may be connected to the intermediate contact plugs MCP, respectively.

The upper contact plugs UCP may be respectively connected to the upper pad regions UP of the upper electrodes 30a to 30d described with reference to FIG. 4. In some embodiments, a pair of the upper contact plugs UCP may be connected to each of the upper pad regions UP. The upper contact plugs UCP may be disposed on the fourth stair step structure of the upper stack structure 30. Since the fourth stair step structure is formed along the first direction D1, the upper contact plugs UCP having vertical lengths different from each other may be arranged in the first direction D1 as illustrated in FIG. 19. Bottom surfaces of the upper contact plugs UCP may be disposed at different levels (e.g., distances/heights) from the substrate 1, and top surfaces of the upper contact plugs UCP may be substantially coplanar with each other. Interconnection lines may be connected to the upper contact plugs UCP, respectively.

In addition, dummy contact plugs DCP may be respectively connected to the upper dummy electrodes 40a to 40c described with reference to FIG. 4. Meanwhile, the positions of the lower, intermediate, and upper contact plugs LCP, MCP, and UCP are not limited to the embodiment of FIG. 18 but can be variously changed.

In some embodiments, vertical channels VS and dummy vertical channels DVS may be disposed to penetrate the first and second electrode structures ST1 and ST2 on the substrate 1 of the cell array region CAR. The vertical channels VS and the dummy vertical channels DVS may extend in the third direction D3 substantially perpendicular to the top surface of the substrate 1. Bit lines BL extending in the second direction D2 may be disposed on the cell array region CAR. The bit lines BL may be electrically connected to the vertical channels VS. A structure of the cell array region CAR of the 3D semiconductor memory device according to some embodiments will be described in more detail with reference to FIGS. 20 to 26.

Figure 20:
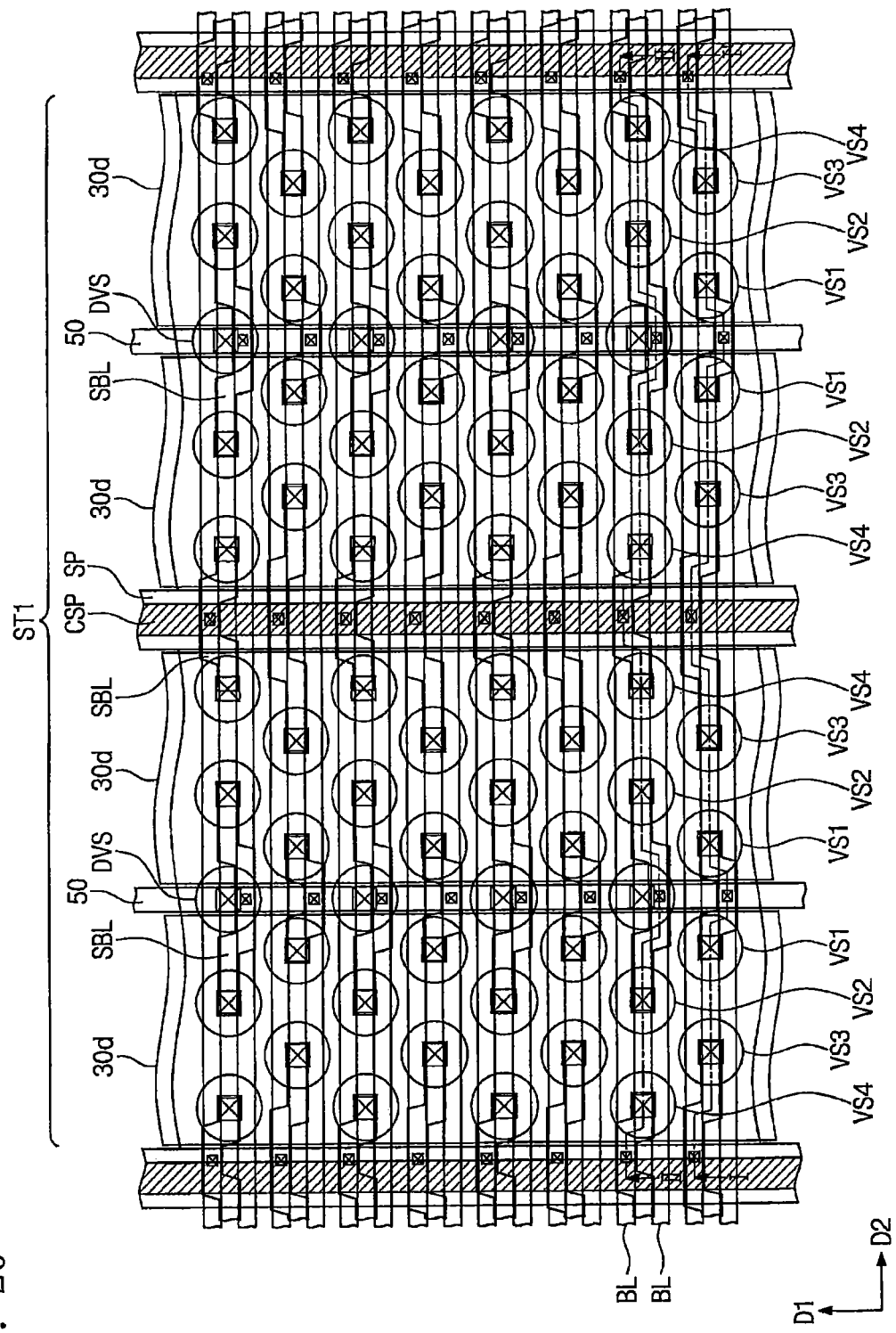
FIG. 20 is a plan view illustrating a cell array region of a 3D semiconductor memory device according to some embodiments of the inventive concepts.
Figure 21:
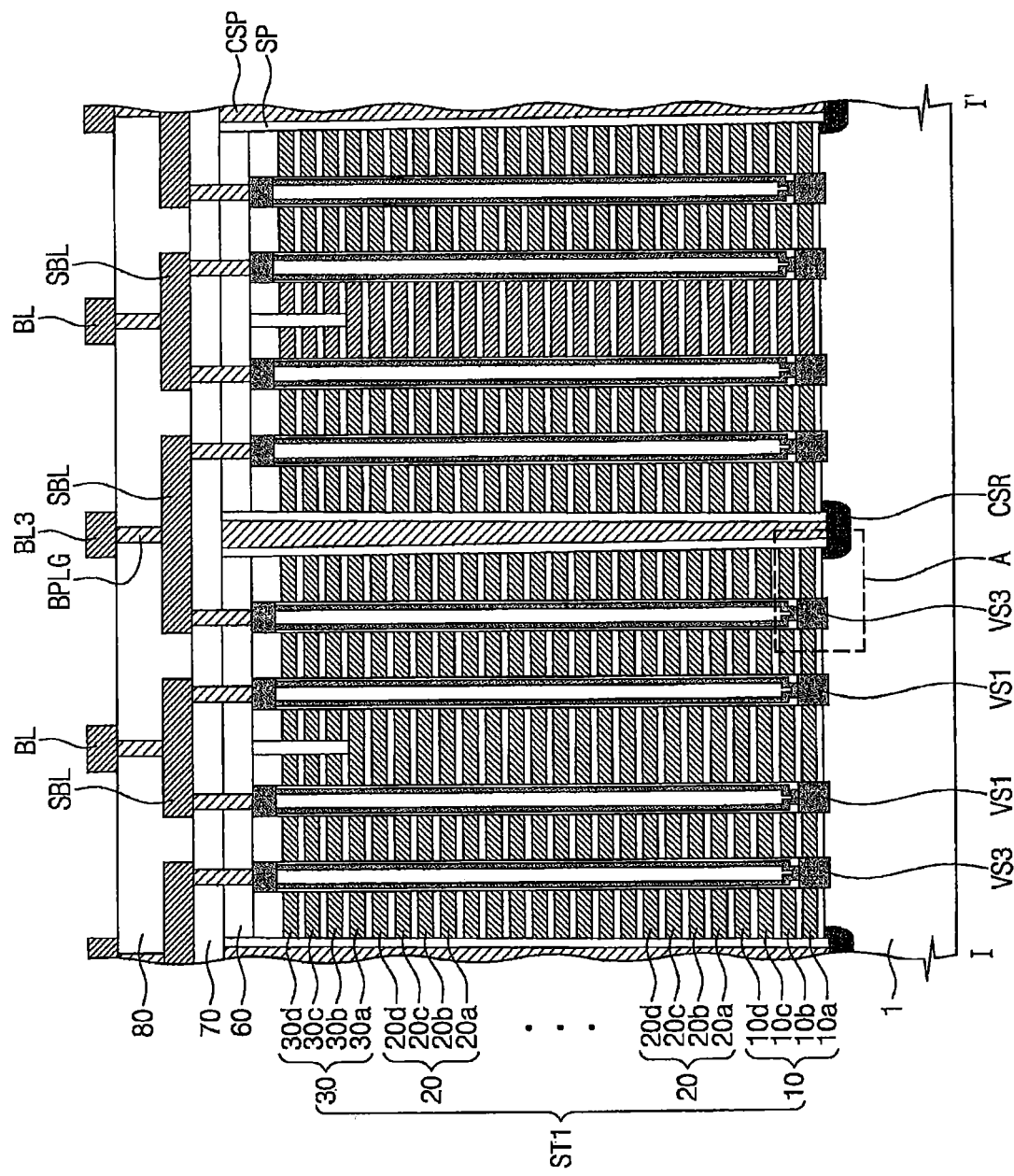
FIGS. 21 and 22 are cross-sectional views taken along the lines I-I' and II-IF of FIG. 20, respectively, to illustrate a 3D semiconductor memory device according to some embodiments of the inventive concepts.
Figure 22:
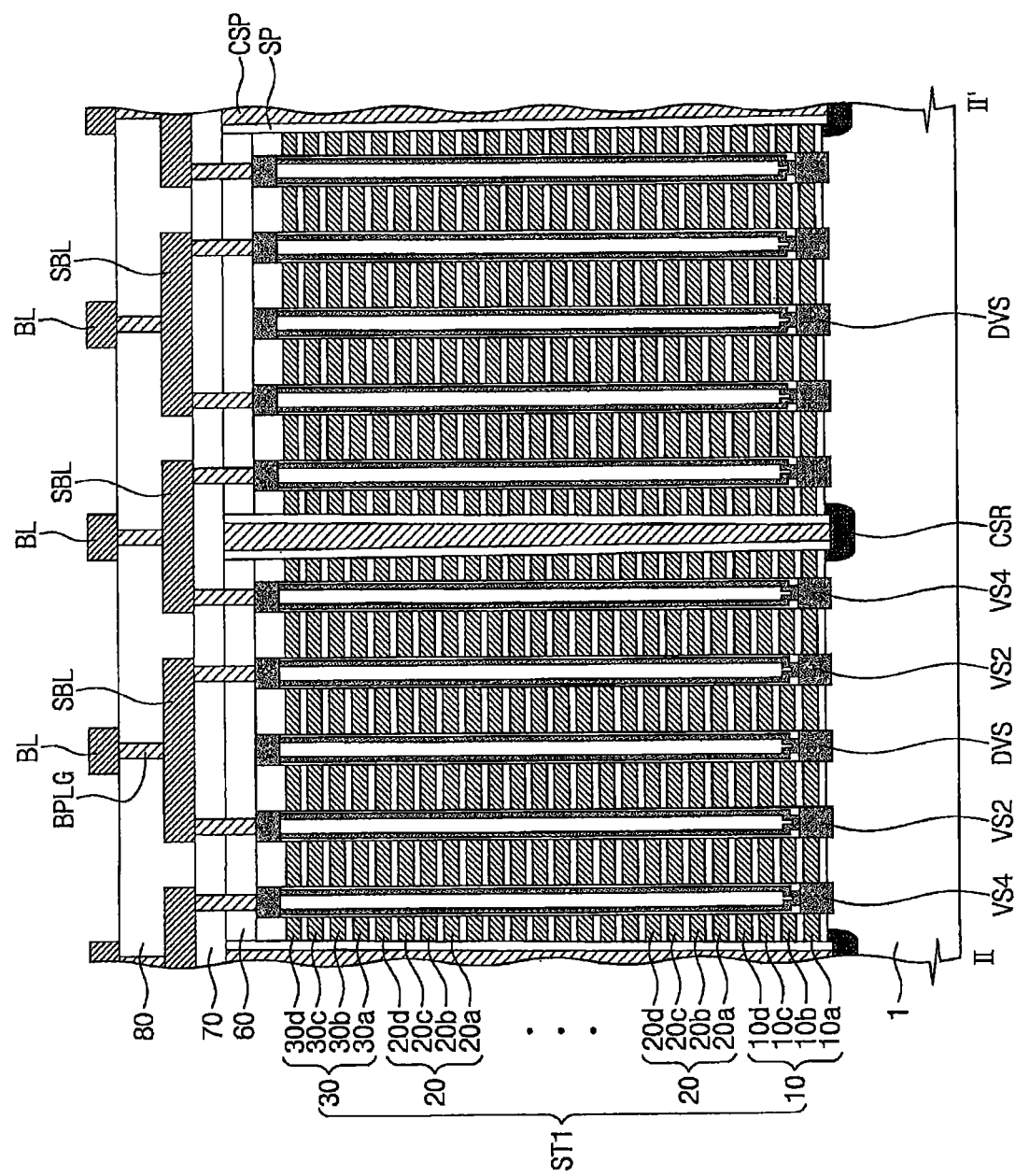
Figure 23:
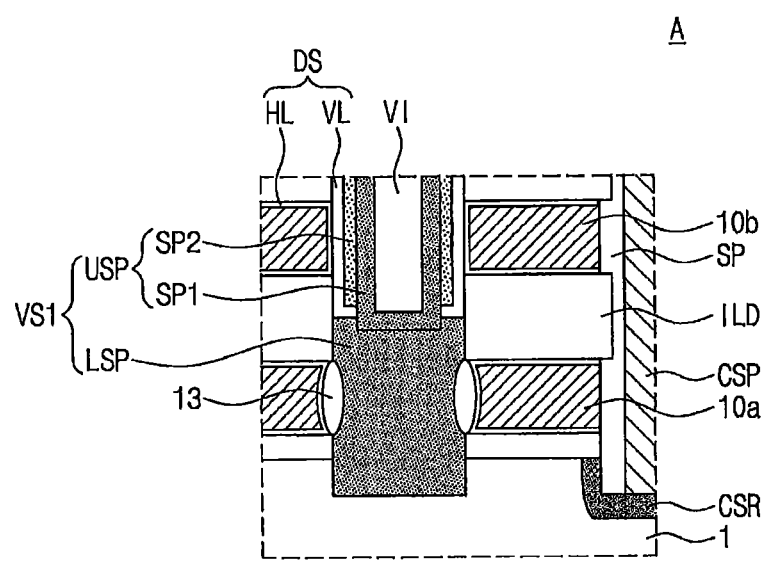
FIG. 23 is an enlarged view of the portion 'A' of FIG. 21.

FIG. 20 is a plan view illustrating a cell array region of a 3D semiconductor memory device according to some embodiments of the inventive concepts. FIGS. 21 and 22 are cross-sectional views taken along the lines I-I' and of FIG. 20, respectively, to illustrate a 3D semiconductor memory device according to some embodiments of the inventive concepts. FIG. 23 is an enlarged view of the portion 'A' of FIG. 21.

Referring to FIGS. 20, 21, and 22, vertical channels VS1 to VS4 and dummy vertical channels DVS may be disposed on the substrate 1 of the cell array region CAR and may extend in the third direction D3. The vertical channels VS1 to VS4 and the dummy vertical channels DVS may penetrate each of the first and second electrode structures ST1 and ST2 described above.

In detail, first to fourth vertical channels VS1 to VS4 may penetrate each of the uppermost upper electrodes 30d. In some embodiments, the first to fourth vertical channels VS1 to VS4 may be arranged in a zigzag form in the first direction D1 in a plan view. The dummy vertical channels DVS may penetrate each of the first and second electrode structures ST1 and ST2 between the uppermost upper electrodes 30d. In other words, the dummy vertical channels DVS may be arranged along the first direction D1 in a plan view.

In some embodiments, the first to fourth vertical channels VS1 to VS4 and the dummy vertical channels DVS may penetrate each of the electrode portions EP of the lower and intermediate electrodes 10a to 10d and 20a to 20d described with reference to FIGS. 7A to 7D and 9A to 9D. In addition, the dummy vertical channels DVS may penetrate the isolation insulating pattern 50 on the cell array region CAR.

In some embodiments, the first to fourth vertical channels VS1 to VS4 and the dummy vertical channels DVS may include the substantially same materials as each other and may have the substantially same structures as each other. For example, the first to fourth vertical channels VS1 to VS4 and the dummy vertical channels DVS may have hollow pipe shapes or hollow macaroni shapes. In some embodiments, the first to fourth vertical channels VS1 to VS4 and the dummy vertical channels DVS may have cylindrical shapes.

The first to fourth vertical channels VS1 to VS4 and the dummy vertical channels DVS may include a semiconductor material or a conductive material. In some embodiments, bottom surfaces of the first to fourth vertical channels VS1 to VS4 may be disposed at a level between the top surface and a bottom surface of the substrate 1. A contact pad may be disposed at a top end of each of the first to fourth vertical channels VS1 to VS4 and may be electrically connected to a bit line contact plug BPLG.

In some embodiments, each of the first to fourth and dummy vertical channels VS1 to VS4 and DVS may include a lower semiconductor pattern LSP and an upper semiconductor pattern USP, as illustrated in FIG. 23. In some embodiments, the lower and upper semiconductor patterns LSP and USP may include silicon (Si), germanium (Ge), or a mixture thereof and may have crystal structures different from each other. Each of the lower and upper semiconductor patterns LSP and USP may have a crystal structure including at least one of a single-crystalline structure, an amorphous structure, or a poly-crystalline structure. The lower and upper semiconductor patterns LSP and USP may be undoped or may be doped with dopants having the same conductivity type as dopants of the substrate 1.

Referring to FIG. 23, in more detail, the lower semiconductor pattern LSP may be in direct contact with the substrate 1 and may penetrate the lowermost electrode 10a. The upper semiconductor pattern USP may include a first semiconductor pattern SP1 and a second semiconductor pattern SP2. The first semiconductor pattern SP1 may be connected to the lower semiconductor pattern LSP and may have a pipe or macaroni shape having a closed bottom end. The inside of the first semiconductor pattern SP1 may be filled with a filling insulation pattern VI. The first semiconductor pattern SP1 may be in contact with an inner sidewall of the second semiconductor pattern SP2 and a top surface of the lower semiconductor pattern LSP. In other words, the first semiconductor pattern SP1 may electrically connect the second semiconductor pattern SP2 to the lower semiconductor pattern LSP. The second semiconductor pattern SP2 may have a pipe or macaroni shape of which top and bottom ends are opened. The second semiconductor pattern SP2 may not be in contact with the lower semiconductor pattern LSP but may be spaced apart from the lower semiconductor pattern LSP.

In some embodiments, a data storage layer DS may be disposed between each of the electrode structures ST1 and ST2 and each of the vertical channels VS1 to VS4. The data storage layer DS may include a vertical insulating layer VL penetrating each of the electrode structures ST1 and ST2 and a horizontal insulating layer HL extending from between the vertical insulating layer VL and each of the electrodes 10a and 10b onto top and bottom surfaces of each of the electrodes 10a and 10b, as illustrated in FIG. 23. A thermal oxide layer 13 may be disposed between the lowermost electrode 10a and the lower semiconductor pattern LSP.

In some embodiments, the 3D semiconductor memory device according to some embodiments of the inventive concepts may be an NAND flash memory device. In this case, the data storage layer DS may include a tunnel insulating layer, a charge storage layer, and a blocking insulating layer. Data stored in the data storage layer DS may be changed using the Fowler-Nordheim tunneling induced by a difference in voltage between each of the vertical channels VS1 to VS4 and each of the electrodes of each of the electrode structures ST1 and ST2.

Referring again to FIGS. 20, 21, and 23, a common source region CSR may be provided in the substrate 1 disposed between the electrode portions of the electrodes in a plan view. The common source regions CSR may extend in the first direction D1 in parallel to the first and second electrode structures ST1 and ST2. The common source regions CSR may be formed by doping portions of the substrate 1 with dopants. A conductivity type of the common source regions CSR may be different from that of the substrate 1. For example, the common source regions CSR may include N-type dopants (e.g., arsenic (As) or phosphorus (P)).

A common source plug CSP may be connected to each of the common source regions CSR, and a sidewall insulating spacer SP may be disposed between the common source plug CSP and each of the electrode structures ST1 and ST2. In some embodiments, the common source plug CSP may have a substantially uniform upper width and may extend in the first direction D1.

A first interlayer insulating layer 60 and a second interlayer insulating layer 70 may cover the electrode structures ST1 and ST2, and assistant interconnection lines SBL may be disposed on the second interlayer insulating layer 70. Some of the assistant interconnection lines SBL may intersect the isolation insulating pattern 50, and others of the assistant interconnection lines SBL may intersect the common source plug CSP. Each of the assistant interconnection lines SBL may electrically connect the vertical channels VS1, VS2, VS3, or VS4 adjacent to each other in the second direction D2. The assistant interconnection lines SBL may extend longitudinally in the second direction D2. Lengths of some assistant interconnection lines SBL may be different from those of other assistant interconnection lines SBL.

A third interlayer insulating layer 80 may be disposed on the second interlayer insulating layer 70 to cover the assistant interconnection lines SBL, and bit lines BL may be disposed on the third interlayer insulating layer 80. The bit lines BL may extend in the second direction D2 and may be electrically connected to the assistant interconnection lines SBL through the bit line contact plugs BPLG.

Figure 24:
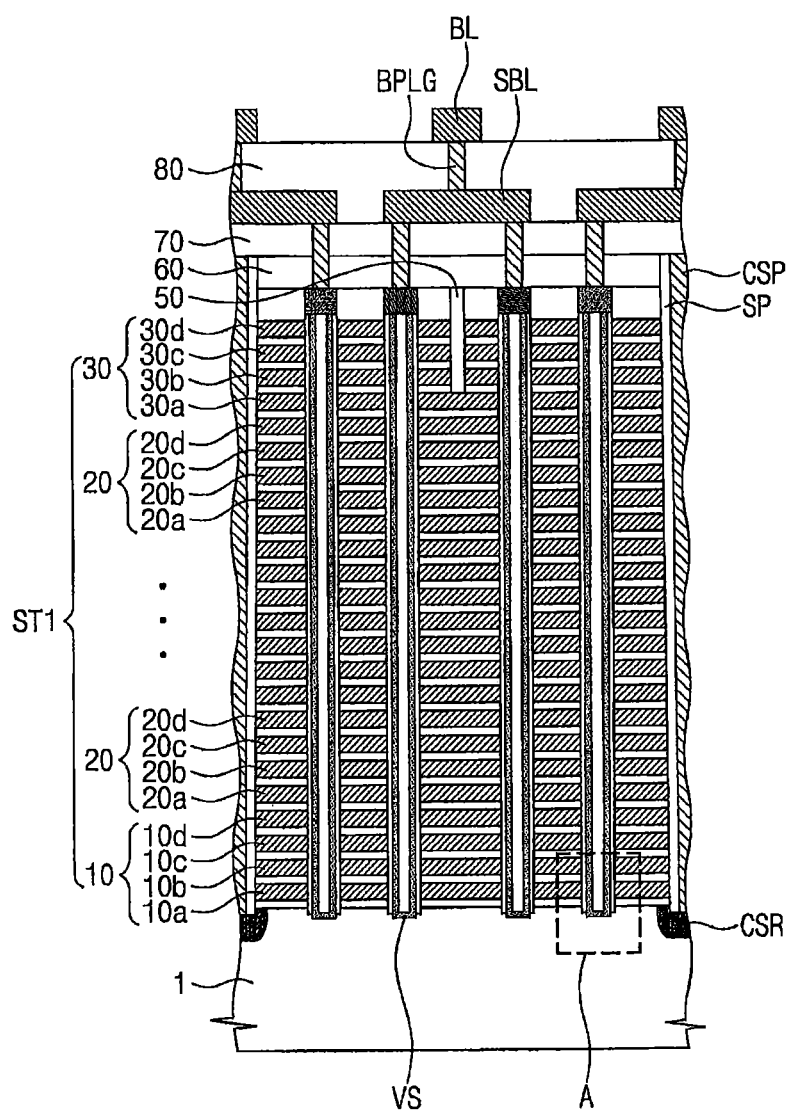
FIG. 24 is a cross-sectional view illustrating a cell array region of a 3D semiconductor memory device according to some embodiments of the inventive concepts.
Figure 25:
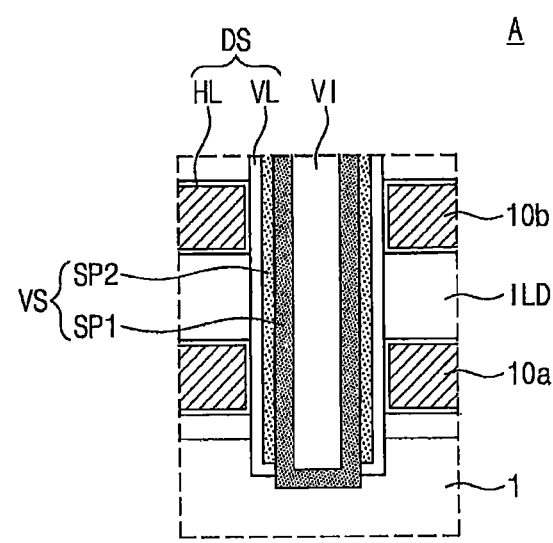
FIG. 25 is an enlarged view of the portion 'A' of FIG. 24.

FIG. 24 is a cross-sectional view illustrating a cell array region of a 3D semiconductor memory device according to some embodiments of the inventive concepts, and FIG. 25 is an enlarged view of the portion 'A' of FIG. 24. In the present embodiment, the same elements as described with reference to FIGS. 20 to 22 will be indicated by the same reference numerals or the same reference designators, and the descriptions thereto will be omitted or mentioned briefly for the purpose of ease and convenience in explanation.

Referring to FIGS. 24 and 25, vertical channels VS may penetrate first and second electrode structures ST1 and ST2 on the cell array region CAR. The vertical channels VS may penetrate the electrode structures ST1 and ST2 so as to be electrically connected to the substrate 1.

In some embodiments, each of the vertical channels VS may include a first semiconductor pattern SP1 penetrating the electrode structure so as to be in contact with the substrate 1, and a second semiconductor pattern SP2 disposed between the electrode structure and the first semiconductor pattern SP1.

In detail, the first semiconductor pattern SP1 may have a hollow pipe shape or a hollow macaroni shape. A bottom end of the first semiconductor pattern SP1 may be in a closed state, and the inner space of the first semiconductor pattern SP1 may be filled with a filling insulation pattern VI. In some embodiments, the first semiconductor pattern SP1 may have a pillar shape having a circular horizontal cross section. The first semiconductor pattern SP1 may be in contact with an inner sidewall of the second semiconductor pattern SP2 and the substrate 1. In other words, the first semiconductor pattern SP1 may electrically connect the second semiconductor pattern SP2 to the substrate 1. A bottom surface of the first semiconductor pattern SP1 may be disposed at a lower level than the top surface of the substrate 1.

The second semiconductor pattern SP2 may have a pipe or macaroni shape of which top and bottom ends are opened. A bottom surface of the second semiconductor pattern SP2 may be higher than the bottom surface of the first semiconductor pattern SP1 and may be spaced apart from the substrate 1. In some embodiments, the second semiconductor pattern SP2 may be in direct contact with the substrate 1.

The first and second semiconductor patterns SP1 and SP2 may be undoped or may be doped with dopants having the same conductivity type as the substrate 1. The first and second semiconductor patterns SP1 and SP2 may be in a poly-crystalline state or a single-crystalline state.

Figure 26:
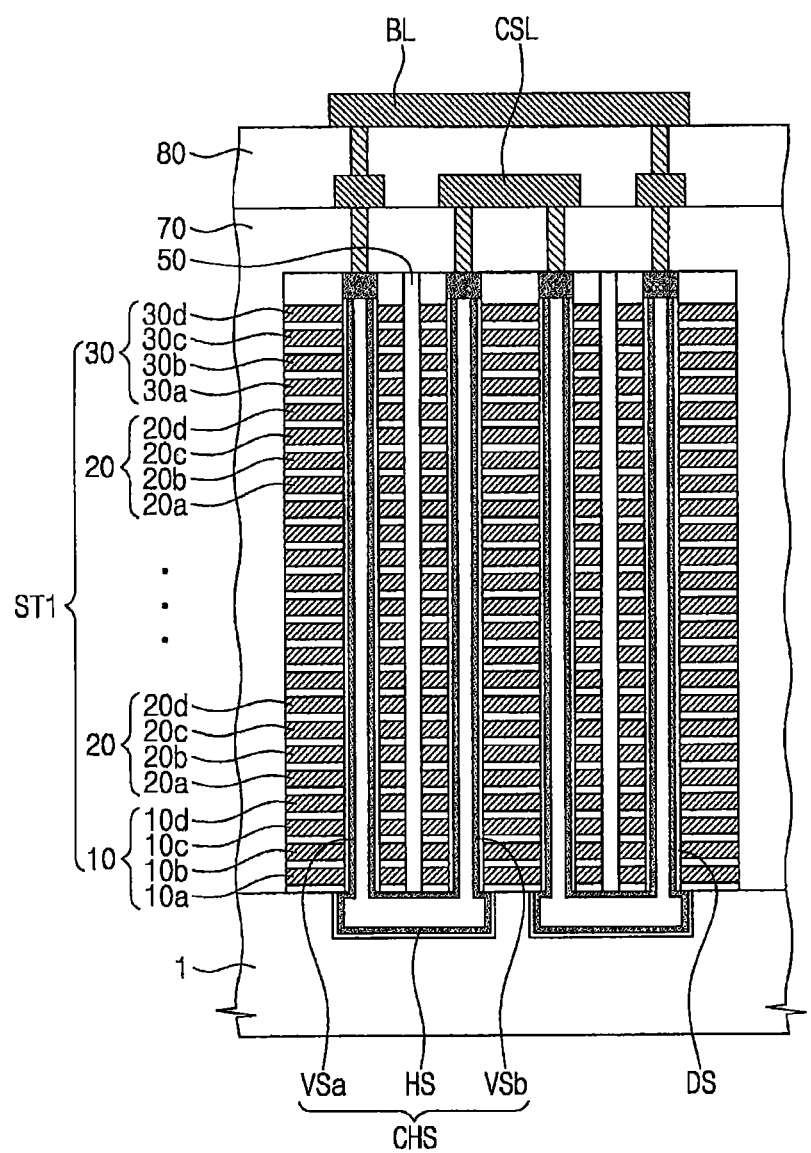
FIG. 26 is a cross-sectional view illustrating a cell array region of a 3D semiconductor memory device according to some embodiments of the inventive concepts.

FIG. 26 is a cross-sectional view illustrating a cell array region of a 3D semiconductor memory device according to some embodiments of the inventive concepts. In the present embodiment, the same elements as described with reference to FIGS. 20 to 22 will be indicated by the same reference numerals or the same reference designators, and the descriptions thereto will be omitted or mentioned briefly for the purpose of ease and convenience in explanation.

Referring to FIG. 26, channel structures CHS may penetrate first and second electrode structures ST1 and ST2 on the cell array region CAR.

In some embodiments, each of the channel structures CHS may include first and second vertical channels VSa and VSb penetrating the electrode structure ST1 and a horizontal channel HS disposed under the electrode structure ST1 to connect the first and second vertical channels VSa and VSb to each other. The first and second vertical channels VSa and VSb may be provided in vertical holes penetrating the electrode structure ST1. The horizontal channel HS may be provided in a recess region formed in an upper portion of the substrate 1. The horizontal channel HS may be disposed between the substrate 1 and the electrode structure ST1 to electrically connect the first and second vertical channels VSa and VSb to each other.

In some embodiments, the horizontal channel HS may have a hollow pipe or macaroni shape continuously connected to the vertical channels VSa and VSb. In other words, the vertical channels VSa and VSb and the horizontal channel HS may constitute a pipe shape of one body. That is, the vertical channels VSa and VSb and the horizontal channel HS may constitute one semiconductor layer continuously extending without an interface therein. Here, the semiconductor layer may be formed of a semiconductor material having a crystal structure including at least one of a single-crystalline structure, an amorphous structure, or a polycrystalline structure. In addition, a data storage layer DS may be disposed between each of the channel structures CHS and the electrodes, as described above.

According to some embodiments, in each of the channel structures CHS, the first vertical channel VSa may be connected to a bit line BL and the second vertical channel VSb may be connected to a common source line CSL. The channel structures CHS may be electrically isolated from each other, and the potential of the channel structures CHS including a semiconductor material may be controlled by the electrode structures ST1 and ST2. Thus, a current path may be formed between the bit line BL and the common source line CSL through each of the channel structures CHS.

FIGS. 27 to 35 are perspective views illustrating a method of manufacturing an electrode structure of a 3D semiconductor memory device according to some embodiments of the inventive concepts. According to some embodiments, the electrode structures described with reference to FIGS. 1 to 26 may be manufactured using a patterning method described below. In other words, the lower electrodes 10a to 10d, the intermediate electrodes 20a to 20d, and the upper electrodes 30a to 30d described with reference to FIGS. 1 to 26 may be resultant structures formed using the patterning method described below.

Figure 27:
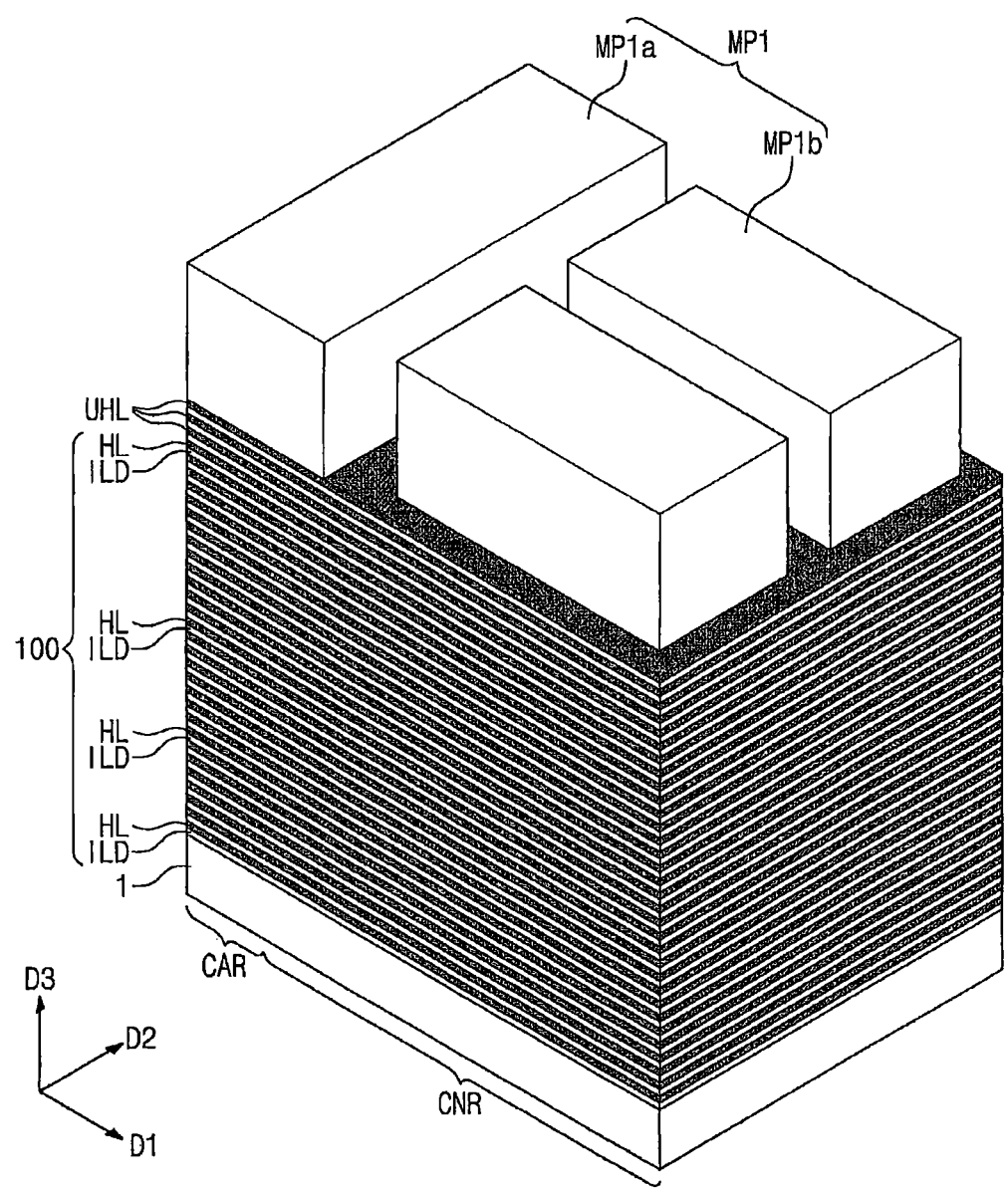
FIGS. 27 to 35 are perspective views illustrating a method of manufacturing an electrode structure of a 3D semiconductor memory device according to some embodiments of the inventive concepts.

Referring to FIG. 27, a thin-layer structure 100 may be formed on a substrate 1 including a cell array region CAR and a connection region CNR. The thin-layer structure 100 may include horizontal layers HL and insulating layers ILD which are vertically alternately stacked on the substrate 1. In other words, the horizontal layers HL and insulating layers ILD may be alternately stacked in a third direction D3.

The horizontal layers HL may be formed of a material having an etch selectivity with respect to the insulating layers ILD. For example, each of the insulating layers ILD may be a silicon oxide layer, and each of the horizontal layers HL may include at least one of a silicon nitride layer, a silicon oxynitride layer, a poly-crystalline silicon layer, or a metal layer. In some embodiments, the horizontal layers HL may be formed of the same material.

Figure 28:
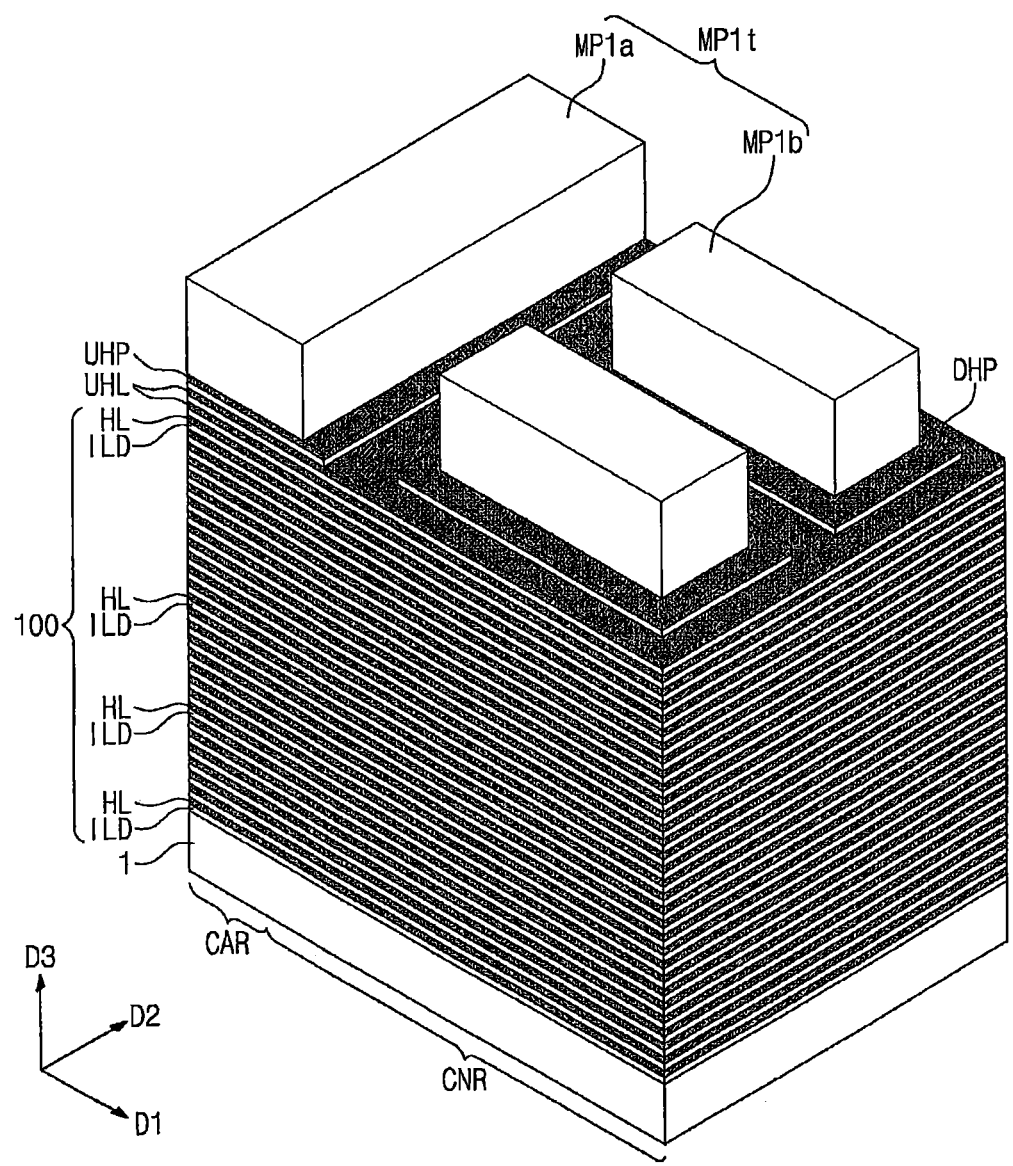
Figure 29:
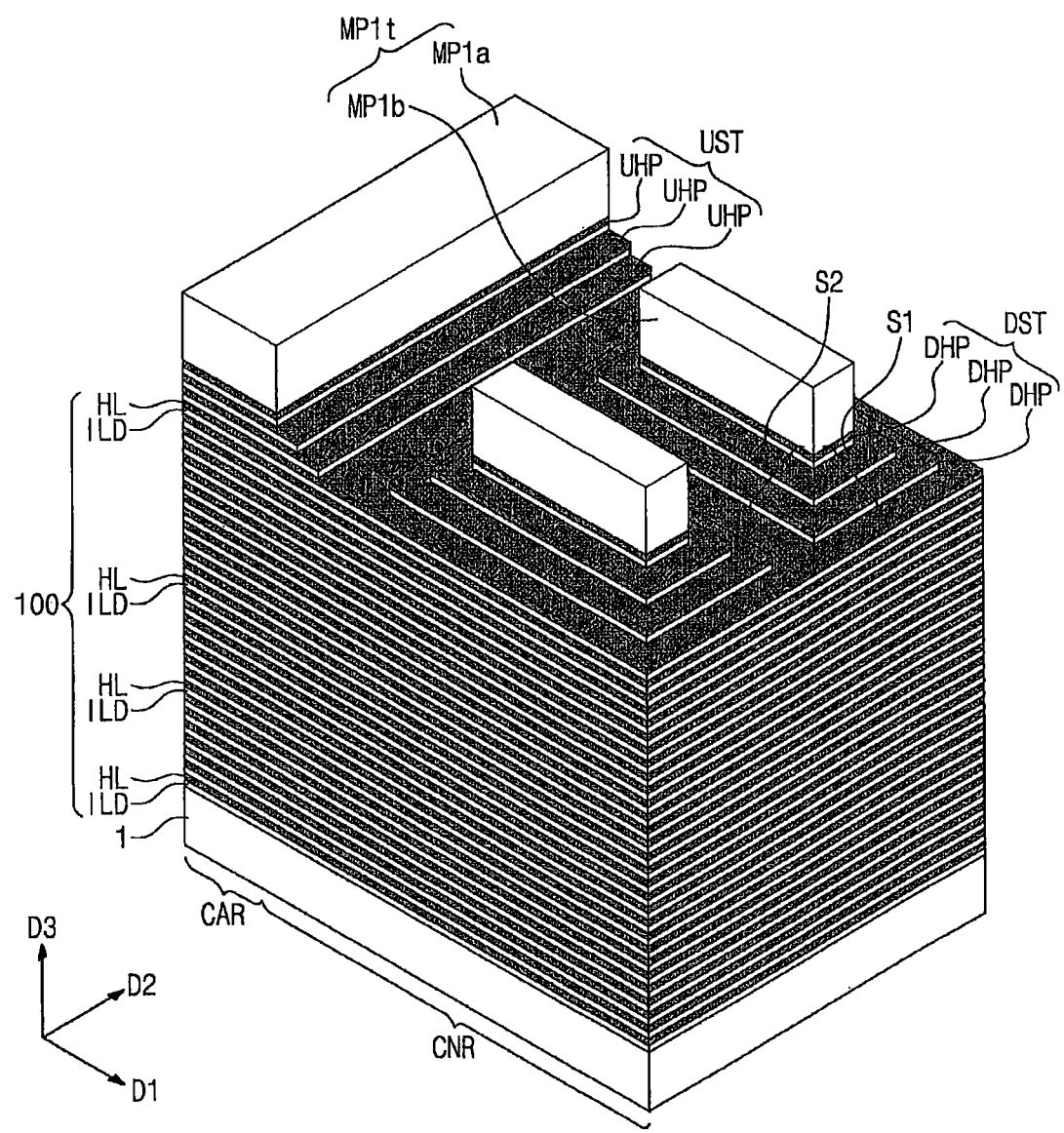

Referring to FIGS. 27 to 29, an upper structure UST and a plurality of upper dummy structures DST may be formed on the thin-layer structure 100.

In some embodiments, forming the upper structure UST and the upper dummy structures DST may include forming an upper thin-layer structure including upper horizontal layers UHL vertically stacked on the thin-layer structure 100, forming a first mask pattern MP1 on the upper thin-layer structure, performing a first etching process using the first mask pattern MP1 as an etch mask to etch a portion of the upper thin-layer structure, and performing a first trimming process reducing an area (e.g., surface area) of the first mask pattern MP1. Here, the first etching process and the first trimming process may be alternately repeated one or more times.

In detail, referring to FIG. 27, the upper thin-layer structure may include insulating layers ILD and the upper horizontal layers UHL which are alternately stacked on the thin-layer structure 100. The upper horizontal layers UHL may be formed of the same material as the horizontal layers HL and may be stacked at the same vertical pitch as the horizontal layers HL. Here, the vertical pitch of the horizontal layers HL may refer to a vertical distance between top surfaces of the horizontal layers HL vertically immediately adjacent to each other. In other words, the vertical pitch of the horizontal layers HL may refer to a distance in the third direction D3 between the top surfaces of the horizontal layers HL vertically immediately adjacent to each other. It will be understood that there is no horizontal layer HL between the horizontal layers HL that are vertically immediately adjacent to each other. In some embodiments, when the number of the electrodes included in each of the intermediate stack structures 20 of FIG. 5 is n, and "n" is a natural number equal to or greater than 2, the number of the upper horizontal layers UHL may be n−1.

The first mask pattern MP1 may expose a portion of the upper thin-layer structure on the connection region CNR. In some embodiments, the first mask pattern MP1 may include a first portion MP1$a$ and second portions MP1$b$. The first portion MP1$a$ may cover the cell array region CAR and a portion of the connection region CNR. The second portions MP1$b$ may be spaced apart from the first portion MP1$a$ and may cover other portions of the connection region CNR, respectively. The second portions MP1$b$ may have island shapes on the upper thin-layer structure and may be spaced apart from each other in a second direction D2. According to some embodiments, widths and a distance of the second portions MP1$b$ may be determined depending on a vertical pitch and a horizontal pitch of the pad regions of the electrode structure described with reference to FIGS. 4 and 5. The vertical pitch of the pad regions may refer to a vertical distance between adjacent pad regions, and the horizontal pitch of the pad regions may refer to a horizontal distance between adjacent pad regions. For example, forming the first mask pattern MP1 may include coating an entire top surface of the upper thin-layer structure with a first photoresist layer and performing an exposure process and a development process on the first photoresist layer.

Referring to FIG. 28, the first etching process may be performed using the first mask pattern MP1 as an etch mask to etch a portion of the upper thin-layer structure. For example, the first etching process may etch the upper thin-layer structure by a first etching depth corresponding to the vertical pitch of the upper horizontal layers UHL. Here, the vertical pitch of the upper horizontal layers UHL may refer to a vertical distance between top surfaces of the upper horizontal layers UHL vertically immediately adjacent to each other. In other words, the vertical pitch of the upper horizontal layers UHL may refer to a distance in the third direction D3 between the top surfaces of the upper horizontal layers UHL vertically immediately adjacent to each other.

For example, one upper horizontal layer UHL may be etched by the first etching process, and thus an upper horizontal pattern UHP and upper dummy patterns DHP may be formed. The upper horizontal pattern UHP may cover the cell array region CAR and a portion of the connection region CNR. The upper dummy patterns DHP may be spaced apart from the upper horizontal pattern UHP and may be disposed on the connection region CNR. In addition, the upper dummy patterns DHP may be spaced apart from each other on the connection region CNR.

Referring to FIG. 28, the first trimming process may be performed to reduce the area of the first mask pattern MP1. The first trimming process may expand a region exposed by the first mask pattern MP1, and thus portions of the upper horizontal pattern UHP and the upper dummy patterns DHP formed in the previous process may be exposed.

The first trimming process may laterally move sidewalls of the first and second portions MP1$a$ and MP1$b$ of the first mask pattern MP1 in the first direction D1 and the second direction D2 by a predetermined distance. Here, the lateral movement distance of the sidewalls of the first mask pattern MP1 may correspond to a width, in the second direction D2, of the intermediate pad regions MP of the intermediate electrodes 20$a$ to 20$d$ described above with reference to FIG. 5. For example, the first trimming process may be performed using an isotropic dry etching method or a wet etching method. In addition, since an entire surface of the first mask pattern MP1 is etched during the first trimming process, a top surface of the first mask pattern MP1 may be recessed. In other words, the area and a thickness of the first mask pattern MP1 may be reduced by the first trimming process.

Subsequently, the first etching process and the first trimming process may be alternately and repeatedly performed. The number of the repetition of the first etching process and the first trimming process may be changed depending on the number of the horizontal layers HL stacked on the substrate 1. For example, the number of the repetition of the first etching process and the first trimming process may be changed according to the number of the intermediate electrodes 20$a$ to 20$d$ constituting the intermediate stack structure 20 described above with reference to FIG. 5. For example, when the number of the intermediate electrodes 20$a$ to 20$d$ of each of the intermediate stack structures 20 is n where "n" is a natural number equal to or greater than 2, the number of the repetition may be n−1.

Since the first etching process and the first trimming process are alternately repeated, the upper horizontal layers UHL may be sequentially etched as illustrated in FIG. 29. Thus, the upper structure UST and the plurality of upper dummy structures DST may be formed on the thin-layer structure 100. In some embodiments, the upper structure UST may include upper horizontal patterns UHP vertically stacked. Each of the upper dummy structures DST may include upper dummy patterns DHP vertically stacked. The trimmed first mask pattern MP1$t$ may be removed after the formation of the upper structure UST and the upper dummy structures DST.

In detail, the upper horizontal patterns UHP may cover the cell array region CAR and may have a stair step structure formed along the first direction D1 on the thin-layer structure 100 of the connection region CNR. Lengths of the upper horizontal patterns UHP in the first direction D1 may decrease sequentially as a vertical distance from the substrate 1 increases. End portions of the upper horizontal patterns UHP may be exposed on the connection region CNR. Horizontal distances, each of which corresponds to a horizontal distance between sidewalls of the upper horizontal patterns UHP vertically immediately adjacent to each other, may be substantially equal to each other. Thus, the upper structure UST may have the stair step structure formed along the first direction D1, and heights of the stairs of the stair step structure of the upper structure UST may correspond to the vertical pitch of the horizontal layers HL.

The upper dummy patterns DHP may have lengths in the first direction D1 and widths in the second direction D2. In each of the upper dummy structures DST, the lengths and the widths of the upper dummy patterns DHP may decrease sequentially as a vertical distance from the substrate 1 increases. In some embodiments, a horizontal distance between first sidewalls of the upper dummy patterns DHP in the first direction D1 may be substantially equal to a horizontal distance between second sidewalls of the upper dummy patterns DHP in the second direction D2. The length, in the first direction D1, of each of the upper dummy patterns DHP may be greater than the width, in the second direction D2, of each of the upper dummy patterns DHP.

The upper dummy structure DST may have a substantial pyramid shape. Thus, each of the upper dummy structures DST may have a first stair step structure S1 formed in the first direction D1 and a second stair step structure S2 formed in the second direction D2 on the connection region CNR. Heights of stairs of the first and second stair step structures S1 and S2 may correspond to the vertical pitch of the horizontal layers HL.

Figure 30:
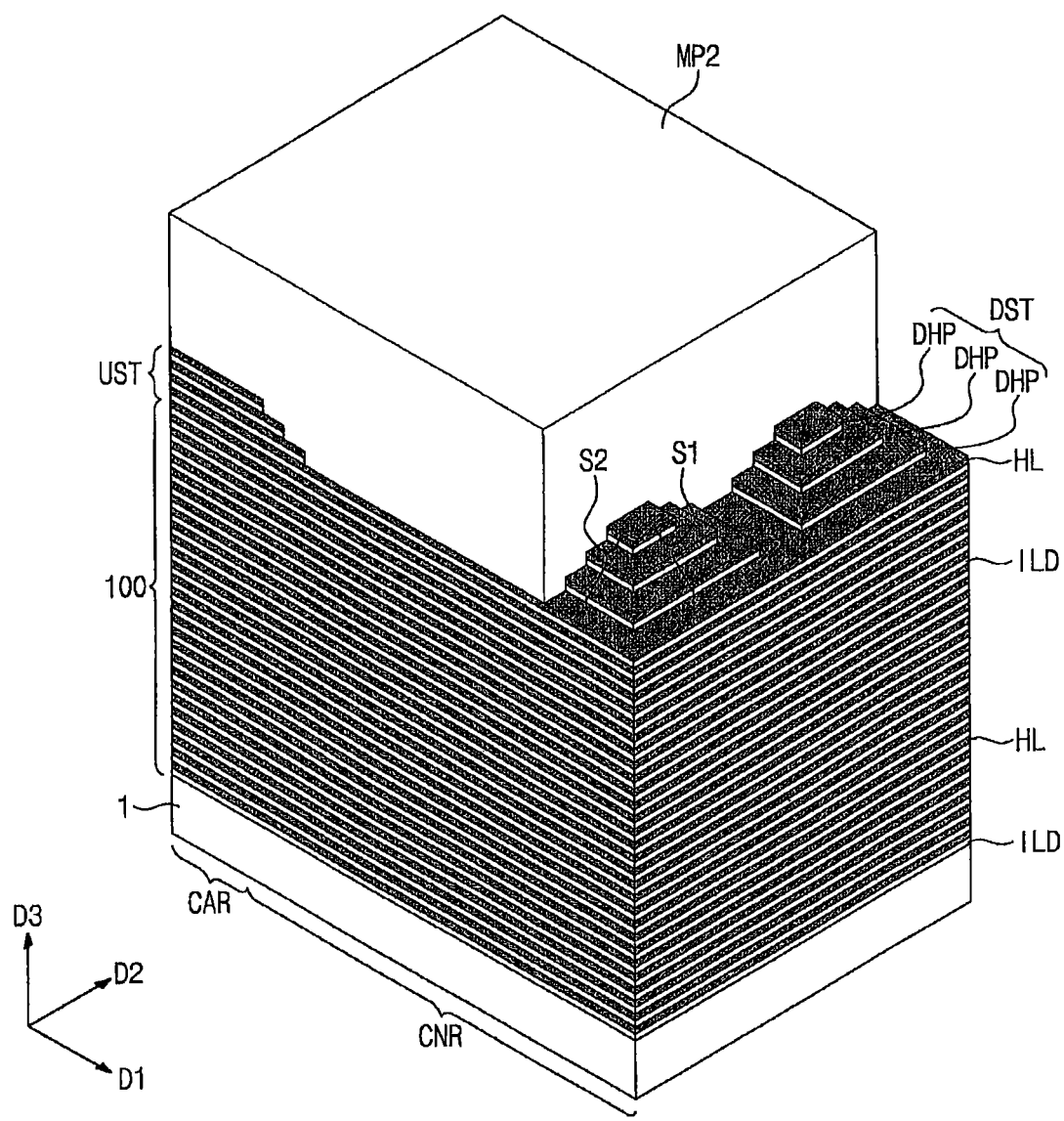

Referring to FIG. 30, a second mask pattern MP2 may be formed to expose portions of the upper dummy structures DST and a portion of the thin-layer structure 100. The second mask pattern MP2 may expose the portions of the upper dummy structures DST in the first direction D1 and the second direction D2. In other words, in the upper dummy structure DST, a portion of the first stair step structure formed in the first direction D1 and a portion of the second stair step structure formed in the second direction D2 may be exposed by the second mask pattern MP2. In some embodiments, forming the second mask pattern MP2 may include forming a second photoresist layer covering entire surfaces of the structures formed on the substrate 1 and performing an exposure process and a development process on the second photoresist layer.

Subsequently, a second etching process may be performed using the second mask pattern MP2 as an etch mask to etch the upper dummy structures DST and the thin-layer structure 100 by a second etching depth. The second etching depth of the second etching process may be equal to or greater than twice the vertical pitch of the horizontal layers HL. In other words, portions of at least two upper dummy patterns DHP and portions of at least two horizontal layers HL may be etched by the second etching process. For example, when the number of the intermediate electrodes 20*a* to 20*d* of each of the intermediate stack structures 20 is n where "n" is a natural number equal to or greater than 2, n horizontal layers HL may be etched by the second etching process. For example, four horizontal layers HL may be etched by the second etching process.

Figure 31:
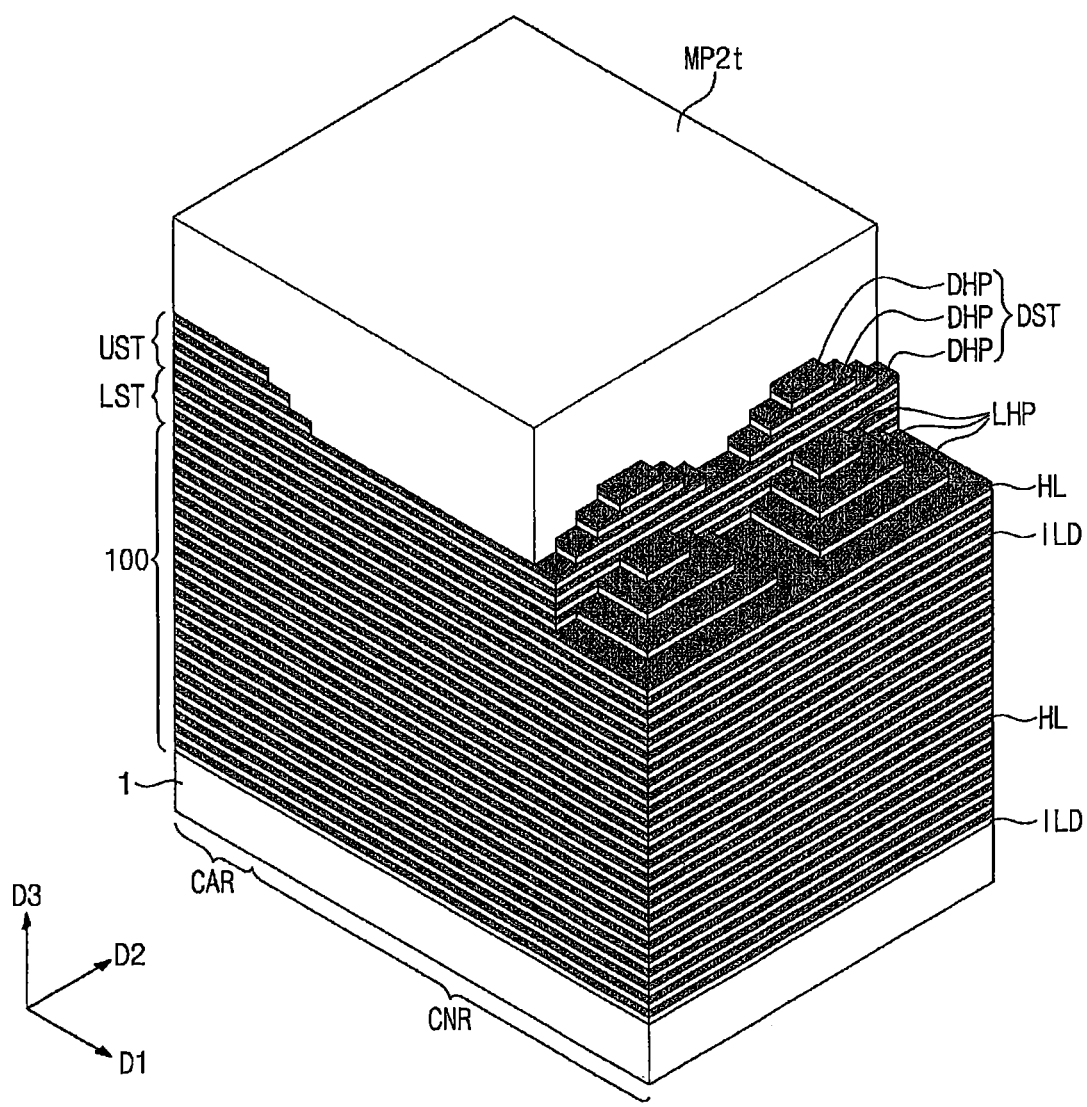

As illustrated in FIG. 31, end portions of the upper dummy structures DST may be etched by the second etching process, and thus lengths of the upper dummy structures DST in the first direction D1 may be reduced. As a result, the upper dummy patterns DHP may have sidewalls vertically substantially aligned with each other in each of the upper dummy structures DST. In other words, during the second etching process, the first stair step structure of the upper dummy structure DST in the first direction D1 may be etched and may be transferred to a portion of the thin-layer structure 100. Thus, a lower structure LST having stair step structures in the first direction D1 and the second direction D2 may be formed under the upper dummy structures DST. The lower structure LST may include a plurality of lower horizontal patterns LHP, and end portions of the lower horizontal patterns LHP may constitute the stair step structures in the first direction D1 and the second direction D2.

After the second etching process, a second trimming process may be performed on the second mask pattern MP2. The second trimming process may expand a region exposed by the second mask pattern MP2, and thus portions of the lower structure LST and the upper dummy structures DST formed in the previous process may be exposed. In other words, the trimmed second mask pattern MP2*t* may expose portions of the second stair step structures of the upper dummy structures DST, as illustrated in FIG. 31.

The second trimming process may laterally move a sidewall of the second mask pattern MP2 in the first direction D1 by a predetermined distance, and thus an area (e.g., surface area) of the second mask pattern MP2 may be reduced. Here, the lateral movement distance of the sidewall of the second mask pattern MP2 may correspond to the lengths, in the first direction D1, of the intermediate pad regions MP of the intermediate electrodes 20*a* to 20*d* described above. For example, the second trimming process may be performed using an isotropic dry etching method or a wet etching method. In addition, since an entire surface of the second mask pattern MP2 is etched during the second trimming process, a top surface of the second mask pattern MP2 may be recessed. In other words, the area and a thickness of the second mask pattern MP2 may be reduced by the second trimming process.

Figure 32:
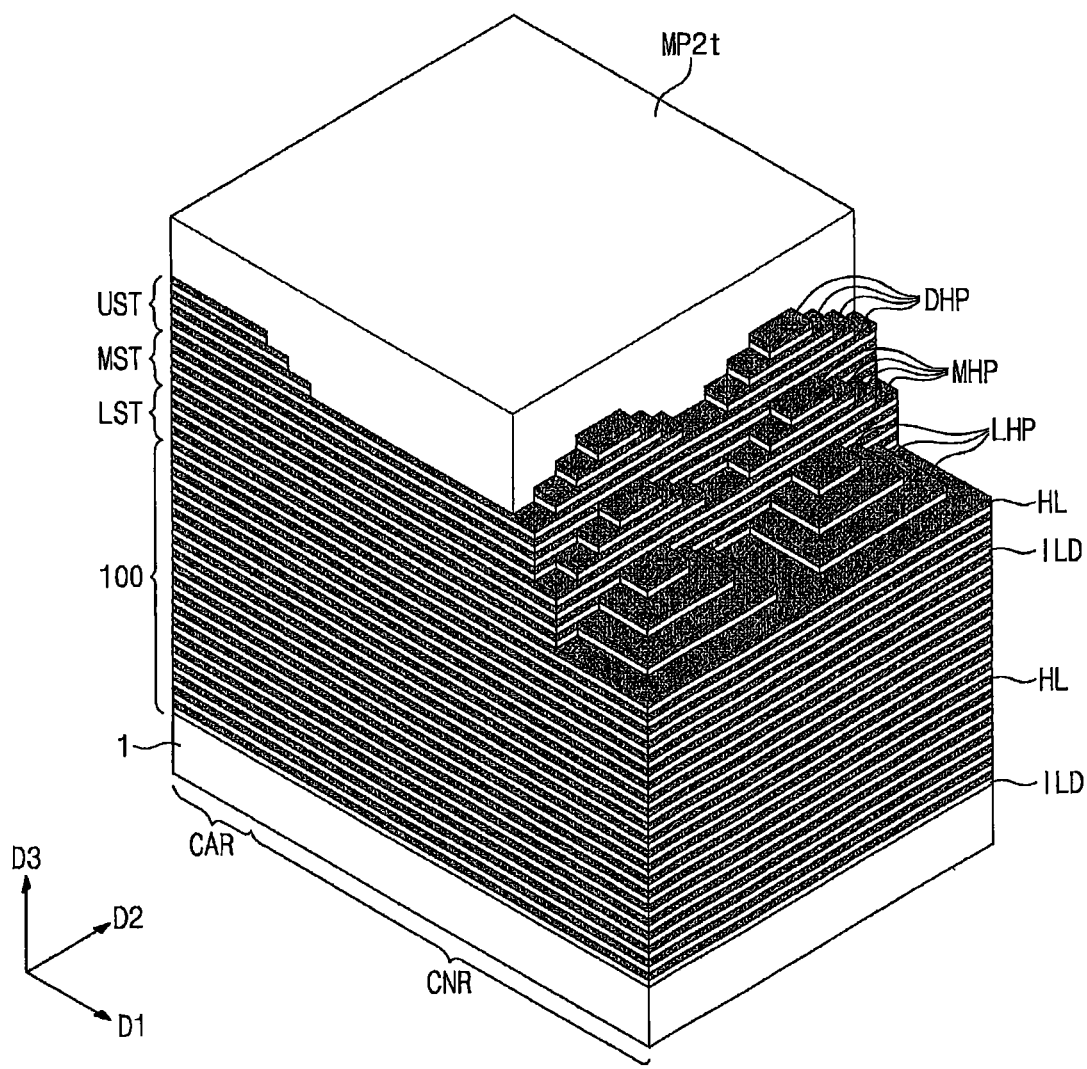

The second etching process may be performed using the trimmed second mask pattern MP2*t* as an etch mask to etch portions of the lower structure LST and the upper dummy structures DST. Thus, as illustrated in FIG. 32, a portion of the second stair step structure of the upper dummy structure DST may be transferred to the previous lower structure LST to form an intermediate structure MST, and a lower structure LST may be formed under the intermediate structure MST. The intermediate structure MST may include a plurality of intermediate horizontal patterns MHP. End portions of the intermediate horizontal patterns MHP may be arranged in the second direction D2 in a plan view and may be exposed. In addition, sidewalls, substantially parallel to the second direction D2, of the intermediate horizontal patterns MHP of the intermediate structure MST may be vertically substantially aligned with each other by the second etching process. In other words, the intermediate structure MST may have the second stair step structure formed in the second direction D2. End portions of lower horizontal patterns LHP of the lower structure LST formed under the intermediate structure MST may constitute stair step structures in the first direction D1 and the second direction D2.

Subsequently, the second trimming process may be performed. Next, the second etching process and the second trimming process may be alternately and repeatedly performed. The number of the repetition of the second etching process and the second trimming process may be changed depending on the number of the horizontal layers HL stacked on the substrate 1. For example, the number of the repetition of the second etching process and the second trimming process may correspond to the number of the intermediate stack structures 20 included in each of the electrode structures ST1 and ST2.

Figure 33:
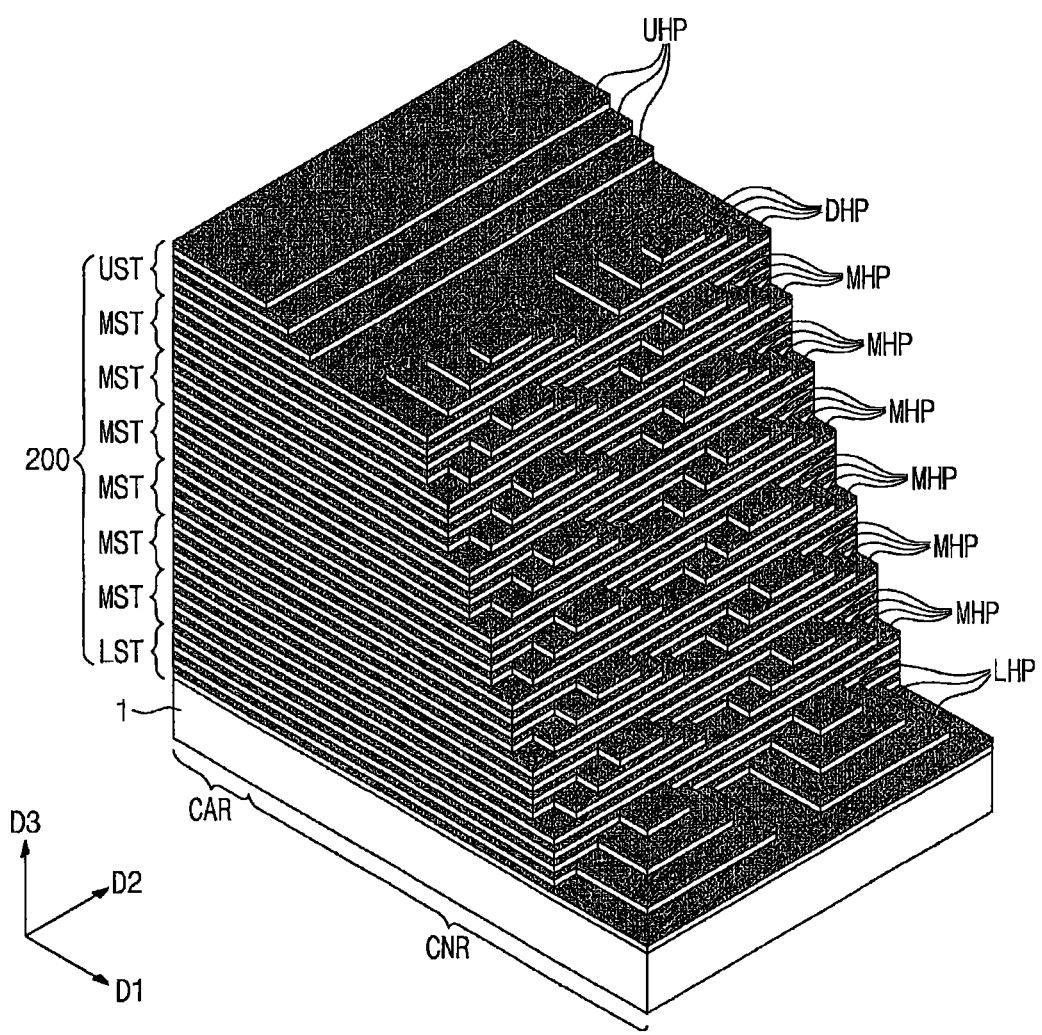

Since the second etching process and the second trimming process are alternately repeated, lengths of the upper dummy structures DST in the first direction D1 may be reduced as illustrated in FIG. 33. A plurality of the intermediate structures MST may be formed under the upper dummy structures DST, and a lower structure LST may be formed under the lowermost one of the intermediate structures MST. In other words, a stack structure 200 may be formed to have a stair step structure on the connection region CNR. The stack structure 200 may include the lower structure LST, the plurality of intermediate structures MST, and the upper structure UST. After the formation of the stack structure 200, the trimmed second mask pattern MP2*t* may be removed to expose the upper structure UST.

In some embodiments, end portions of lower horizontal patterns LHP of the lower structure LST may constitute a first stair step structure in the first direction and a second stair step structure in the second direction on the connection region CNR. In each of the intermediate structures MST, end portions of the intermediate horizontal patterns MHP may constitute a third stair step structure in the second direction D2. End portions of the upper horizontal patterns UHP of the upper structure UST may constitute a fourth stair step structure in the first direction D1. In addition, the stack structure 200 may include the upper dummy patterns DHP which are spaced apart from the upper structure UST and are formed on the uppermost one of the intermediate structures MST.

Figure 34:
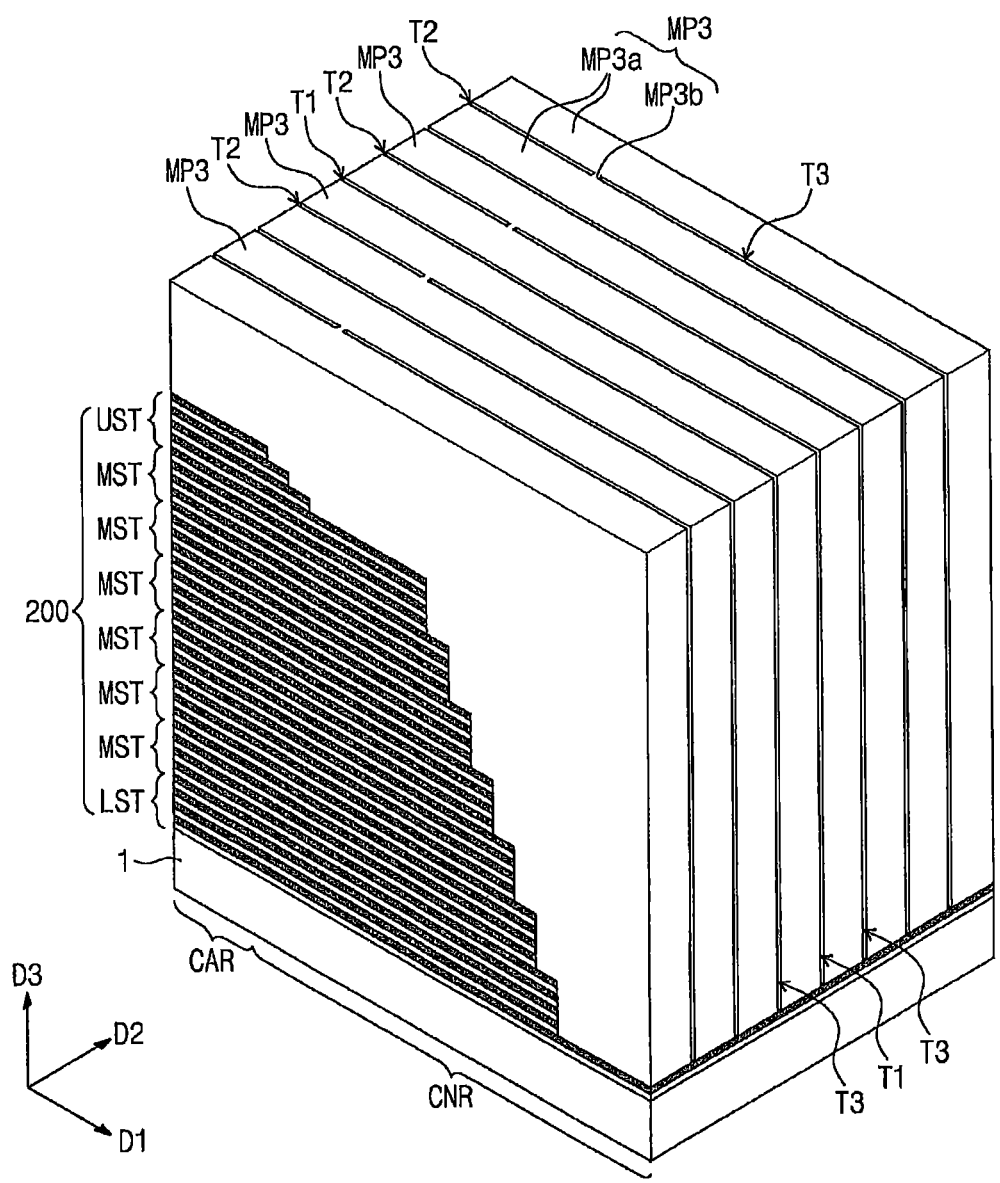

Referring to FIG. 34, third mask patterns MP3 may be formed on the stack structure 200 having the first to fourth stair step structures. Each of the third mask patterns MP3 may include line portions MP3*a* and a connection portion MP3*b*. The line portions MP3*a* may extend in the first direction D1 in a plan view and may be spaced apart from each other in the second direction D2. The connection portion MP3*b* may extend in the second direction D2 to connect the line portions MP3*a* to each other. In some embodiments, the connection portions MP3*b* of the third mask patterns MP3 may be located on the upper structure UST.

Figure 35:
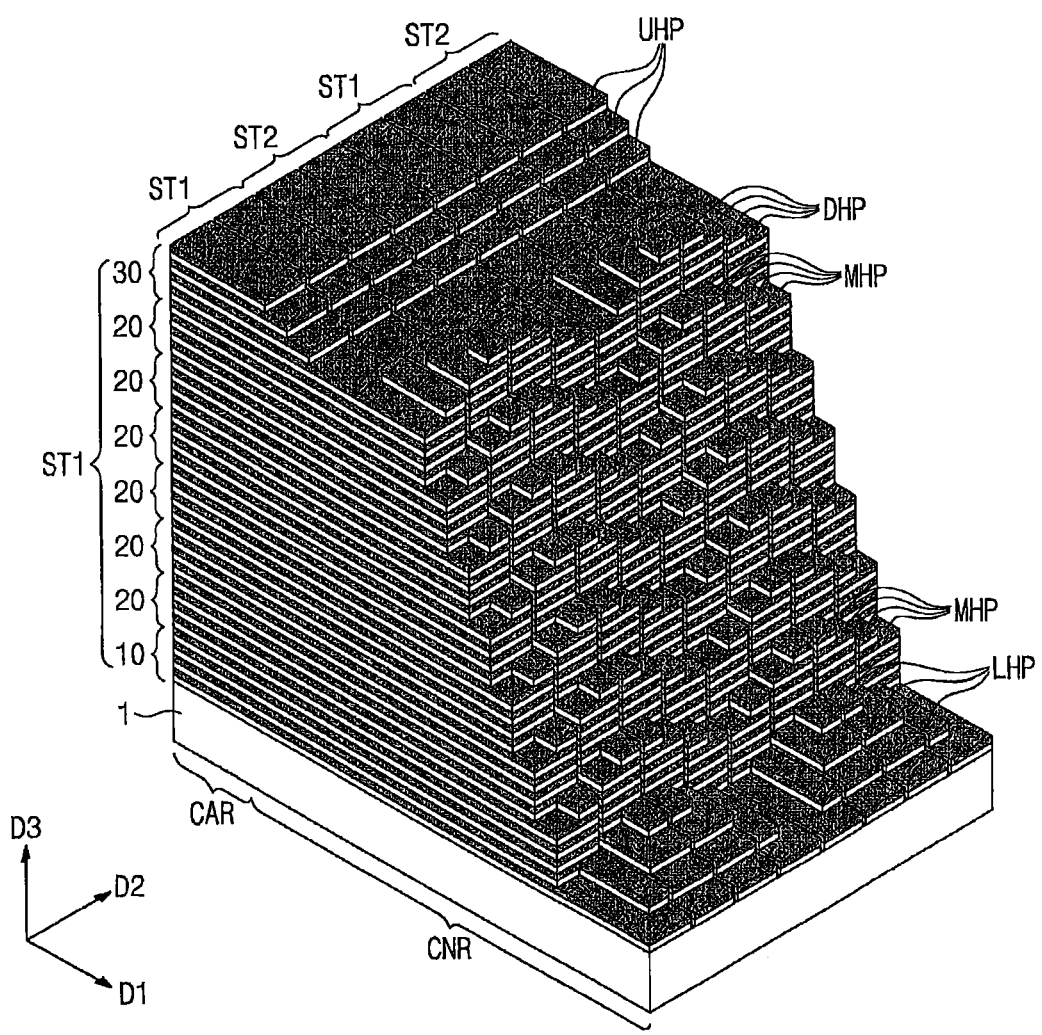

The stack structure 200 may be etched using the third mask patterns MP3 as etch masks to form first trenches T1, second trenches T2, and third trenches T3. The first trenches T1 may divide the stack structure 200 into a plurality of electrode structures ST1 and ST2. The second trenches T2 may extend in the first direction D1 on the cell array region CAR and may be shorter than the first trenches T1. The third trenches T3 may be spaced apart from the second trenches T2 and may extend in the first direction D1 on the connection region CNR. Thus, the electrode structures ST1 and ST2 may be formed as illustrated in FIG. 35. The electrode structures ST1 and ST2 may extend in the first direction D1 and may be spaced apart from each other in the second direction D2. When the horizontal patterns UHP, MHP, and LHP are formed of a conductive material, the horizontal patterns UHP, MHP, and LHP may correspond to electrodes. In some embodiments, when the horizontal patterns UHP, MHP, and LHP are formed of an insulating material, a replacement process may be performed to replace the horizontal patterns UHP, MHP, and LHP with electrodes formed of a conductive material. At this time, the upper dummy patterns DHP may be replaced with conductive patterns. Each of the electrodes of the electrode structures ST1 and ST2 may have an H-shape in a plan view.

FIGS. 36 to 41 are perspective views illustrating a method for manufacturing an electrode structure according to some embodiments of the inventive concepts.

Figure 36:
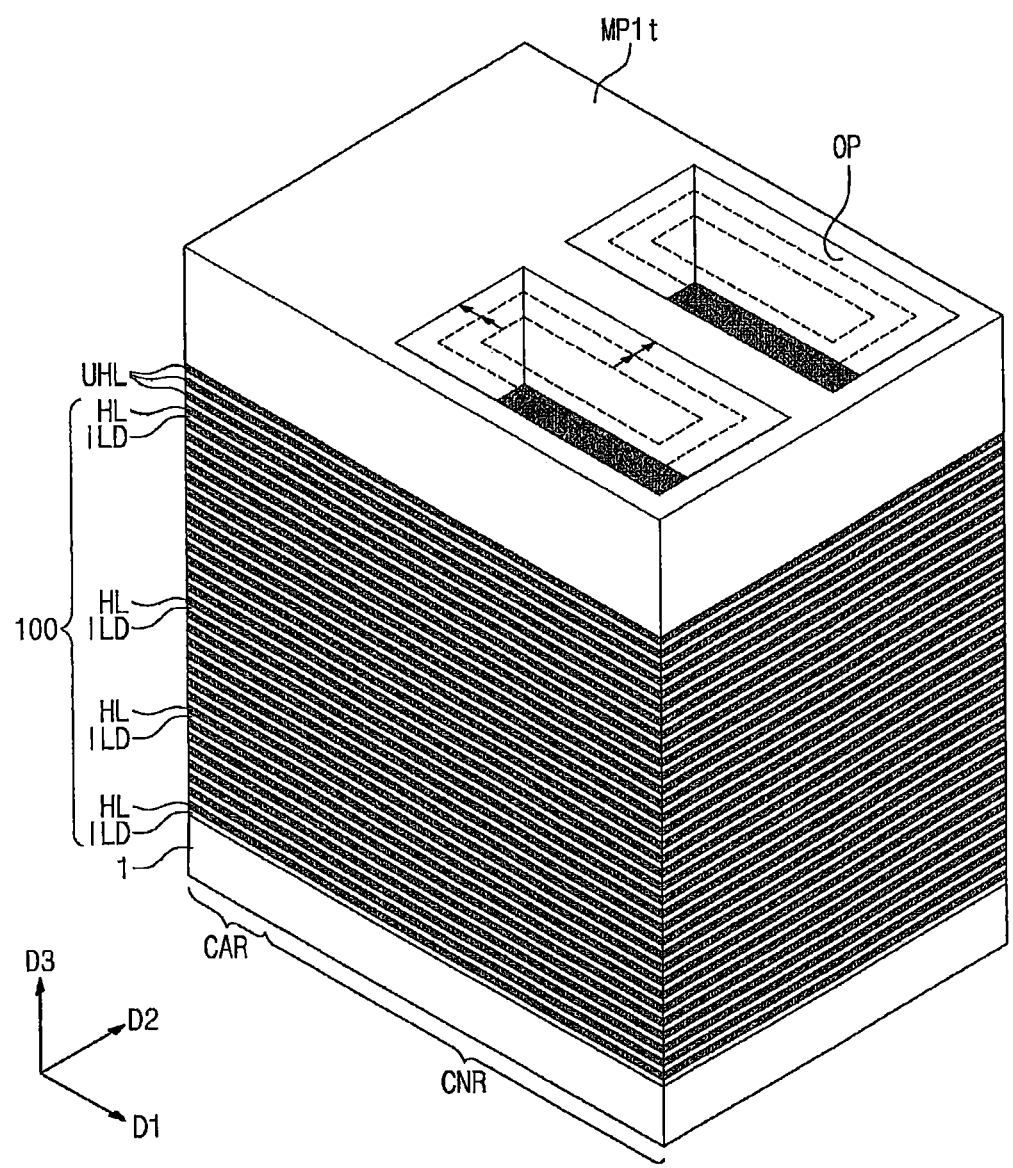
FIGS. 36 to 41 are perspective views illustrating a method of manufacturing an electrode structure of a 3D semiconductor memory device according to some embodiments of the inventive concepts.
Figure 37:
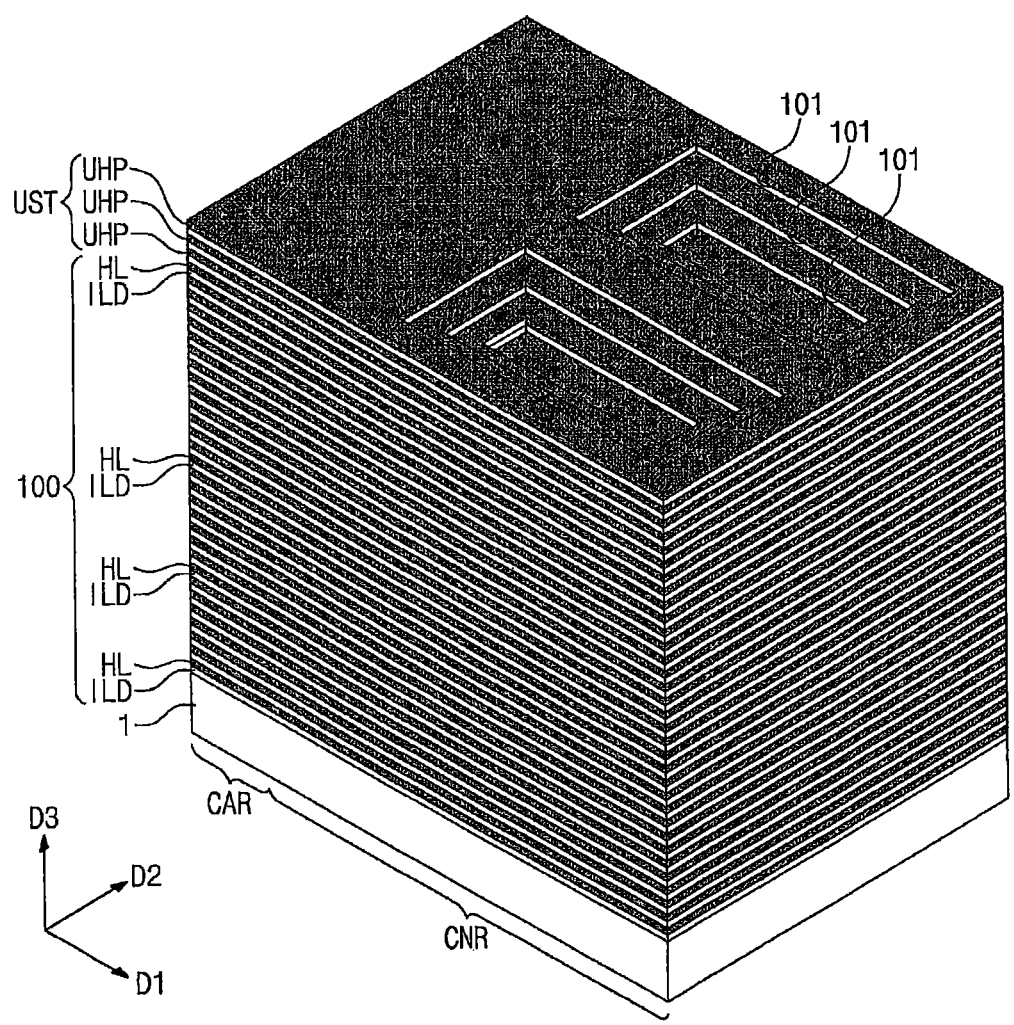

Referring to FIGS. 36 and 37, a thin-layer structure 100 may be formed on a substrate 1 including a cell array region CAR and a connection region CNR, and an upper structure may be formed to expose portions of the thin-layer structure 100 on the connection region CNR. The thin-layer structures 100 may include insulating layers ILD and horizontal layers HL alternately stacked in the third direction D3, as described above.

In some embodiments, forming the upper structure may include forming an upper thin-layer structure including upper horizontal layers UHL vertically stacked on the thin-layer structure 100, forming a first mask pattern MP1 on the upper thin-layer structure, performing a first etching process using the first mask pattern MP1 as an etch mask to etch a portion of the upper thin-layer structure, and performing a first trimming process reducing an area (e.g., surface area) of the first mask pattern MP1. Here, the first etching process and the first trimming process may be alternately repeated one or more times.

In some embodiments, the first mask pattern MP1 may have openings OP exposing portions of the upper horizontal layer UHL on the connection region CNR. Widths and lengths of the openings OP of the first mask pattern MP1 may be determined according to the vertical pitch and the horizontal pitch of the pad regions of the electrode structure described with reference to FIGS. 4 and 5.

Subsequently, the first etching process may be performed using the first mask pattern MP1 as an etch mask to etch a portion of the upper thin-layer structure by a first etching depth, as described above. For example, the first etching depth may be substantially equal to the vertical pitch of the horizontal layers HL. An upper horizontal pattern UHP having openings on the connection region CNR may be formed by performing the first etching process.

The first trimming process may be performed on the first mask pattern MP1 after, the first etching process, and thus an area (e.g., surface area) of the upper horizontal layer UHL exposed by the first mask pattern MP1 may be increased. That is, the width and the length of the opening OP may be increased by the first trimming process. In other words, sidewalls of the opening OP may be horizontally moved in the first direction D1 and the second direction D2 by the first trimming process. As a result, a portion of the upper horizontal pattern UHP may be exposed through the opening OP of the trimmed first mask pattern MP1*t*.

Next, the first etching process and the first trimming process may be alternately and repeatedly performed on the upper thin-layer structure. Thus, the upper structure UST including a plurality of upper horizontal patterns UHP may be formed on the thin-layer structure 100, as illustrated in FIG. 37. The upper horizontal patterns UHP may have openings 101 on the connection region CNR. As described above, the number of the repetition of the first etching process and the first trimming process may be changed depending on the number of the horizontal layers HL stacked on the substrate 1. For example, the number of the repetition of the first etching process and the first trimming process may be changed according to the number of the intermediate electrodes 20*a* to 20*d* constituting the intermediate stack structure 20 described with reference to FIGS. 4 and 5. For example, when the number of the intermediate electrodes 20*a* to 20*d* of each of the intermediate stack structures 20 is n where "n" is a natural number equal to or greater than 2, the number of the repetition may be n–1.

Widths and lengths of the openings 101 of the upper horizontal patterns UHP may increase sequentially as a vertical distance from the substrate 1 increases. In other words, each of the upper horizontal patterns UHP may expose a portion of the upper horizontal pattern UHP or horizontal layer HL disposed thereunder. Thus, the upper structure UST may have a first stair step structure formed along the first direction D1 and a second stair step structure formed along the second direction D2 on the connection region CNR.

Figure 38:
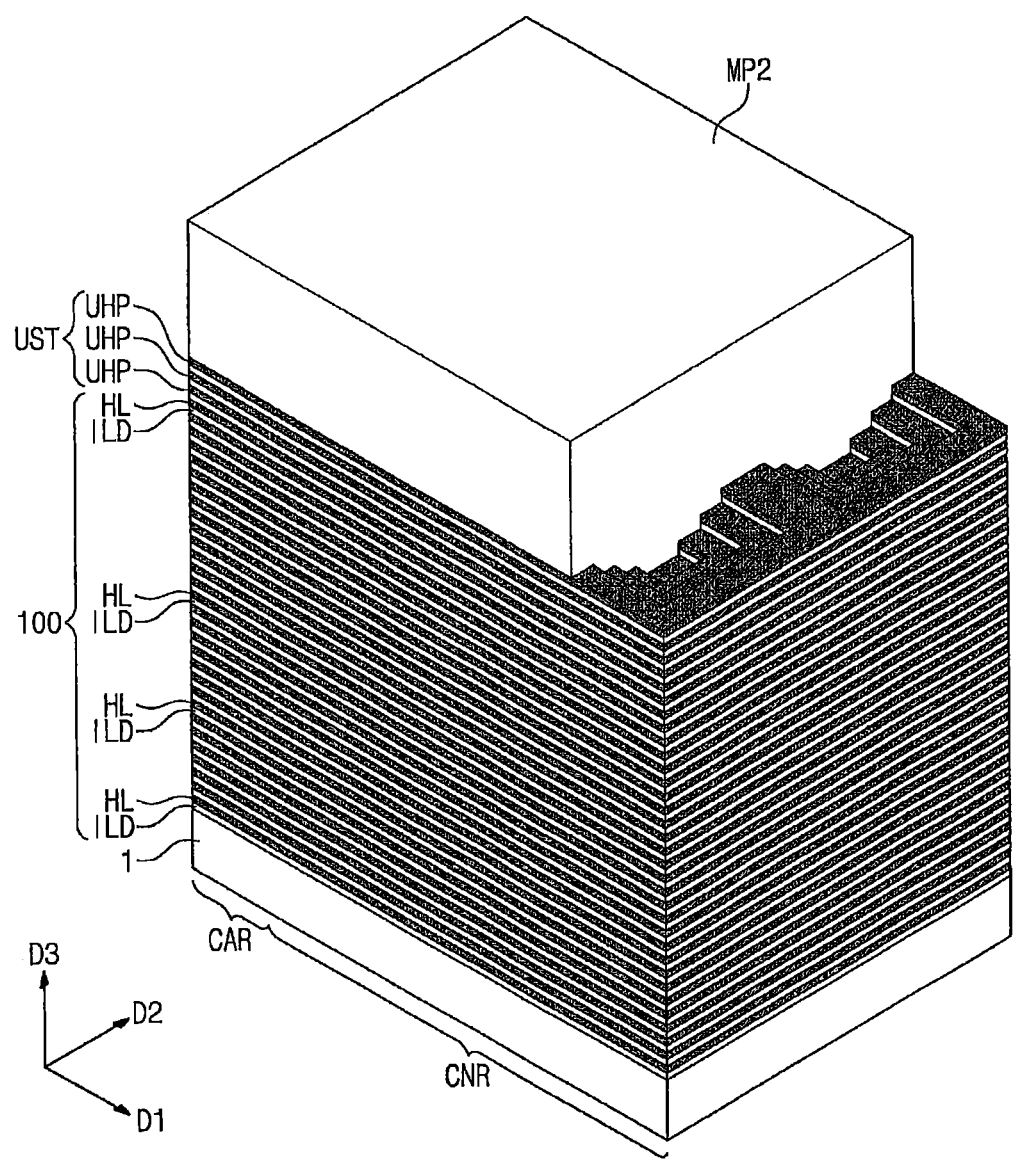

Referring to FIG. 38, a second mask pattern MP2 may be formed to expose a portion of the upper structure UST. The second mask pattern MP2 may expose portions of the first and second stair step structures of the upper structure UST on the connection region CNR. In other words, the second mask pattern MP2 may fill a portion of the opening formed in each of the upper horizontal patterns UHP.

Figure 39:
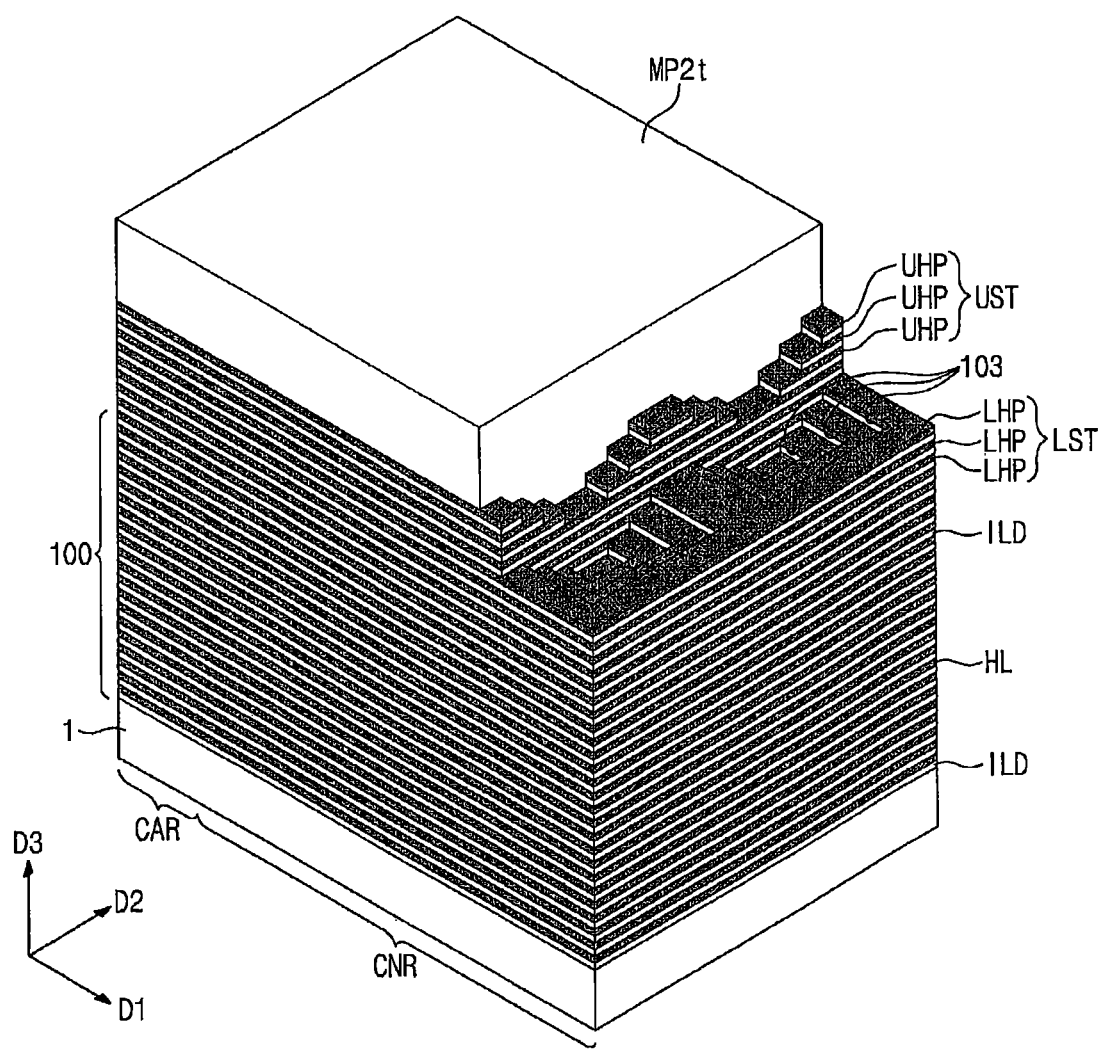

Referring to FIG. 39, a second etching process may be performed using the second mask pattern MP2 as an etch mask to etch the upper structure UST and the thin-layer structure 100 by a second etching depth. The second etching depth of the second etching process may be equal to or greater than twice the vertical pitch of the horizontal layers HL, as described above. In other words, portions of at least two upper horizontal patterns UHP and portions of at least two horizontal layers HL may be etched by the second etching process. In some embodiments, when the number of the intermediate electrodes 20a to 20d of each of the intermediate stack structures 20 is n where "n" is a natural number equal to or greater than 2, n horizontal layers HL may be etched by the second etching process. For example, four horizontal layers HL may be etched by the second etching process as illustrated in FIG. 39.

The exposed portions of the first and second stair step structures of the upper structure UST may be etched by the second etching process, and thus the upper horizontal patterns UHP may have sidewalls which are vertically substantially aligned with each other and are substantially parallel to the second direction D2, as illustrated in FIG. 39. In addition, the exposed portions of the first and second stair step structures may be transferred to the horizontal layers HL by the second etching process, and thus a lower structure LST may be formed under the upper structure UST. The lower structure LST may include a plurality of lower horizontal patterns LHP, and each of the lower horizontal patterns LHP may have an opening 103 on the connection region CNR. The opening 103 of each of the lower horizontal patterns LHP may expose a portion of the lower horizontal pattern LHP or horizontal layer HL disposed thereunder. In other words, widths and lengths of the openings 103 may increase sequentially as a vertical distance from the substrate 1 increases.

Subsequently, a second trimming process may be performed to reduce an area (e.g., surface area) of the second mask pattern MP2. A sidewall of the second mask pattern MP2 may be laterally moved by a predetermined distance in the first direction D1 during the second trimming process. Here, the lateral movement distance of the sidewall of the second mask pattern MP2 may correspond to the lengths, in the first direction D1, of the intermediate pad regions MP of the intermediate electrodes 20a to 20d described above. The trimmed second mask pattern MP2t may expose a portion of the second stair step structure of the upper structure UST and a portion of the lower structure LST.

Figure 40:
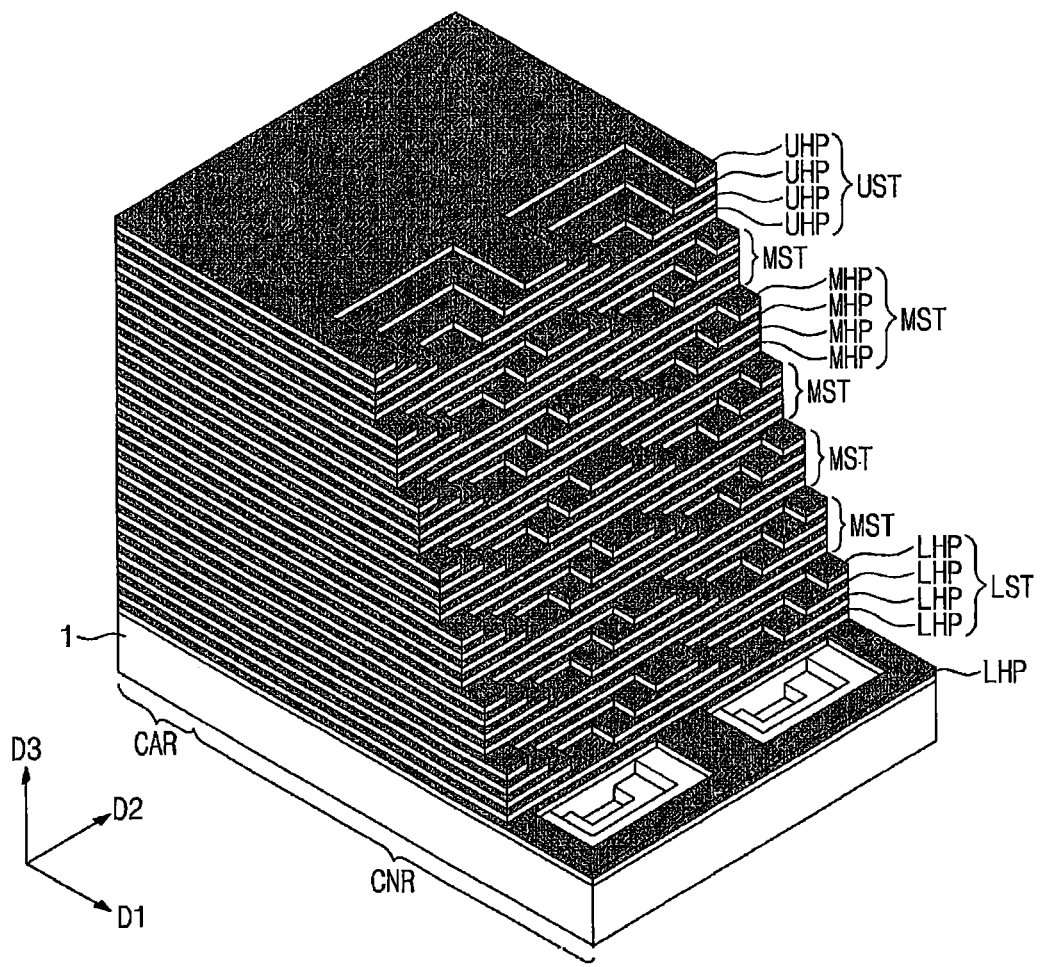

Next, the second etching process may be performed using the trimmed second mask pattern MP2 as an etch mask to etch portions of the upper structure UST and the lower structure LST. Thus, as illustrated in FIG. 40, the exposed portion of the second stair step structure in the second direction D2 of the upper structure UST may be transferred to the previous lower structure LST to form an intermediate structure MST, and a lower structure LST may be formed under the intermediate structure MST. As described above, the intermediate structure MST may include a plurality of intermediate horizontal patterns MHP. End portions of the intermediate horizontal patterns MHP may be arranged in the second direction D2 in a plan view and may be exposed. In other words, the intermediate horizontal patterns MHP may have a stair step structure formed in the second direction D2. In addition, sidewalls, substantially parallel to the second direction D2, of the intermediate horizontal patterns MHP of the intermediate structure MST may be vertically substantially aligned with each other by the second etching process. End portions of lower horizontal patterns LHP of the lower structure LST formed under the intermediate structure MST may constitute stair step structures in the first direction D1 and the second direction D2.

Subsequently, the second trimming process may be performed on the trimmed second mask pattern MP2t. Next, the second etching process and the second trimming process may be alternately repeated at least two or more times. The number of the repetition of the second etching process and the second trimming process may be changed depending on the number of the horizontal layers HL stacked on the substrate 1.

Since the second etching process and the second trimming process are alternately repeated, the length of the upper structure UST in the first direction D1 may decrease (e.g., monotonically decrease or gradually decrease) and a plurality of intermediate structures MST may be formed under the upper structure UST, as illustrated in FIG. 40. In addition, a lower structure LST may be formed under the lowermost one of the intermediate structures MST.

In some embodiments, the lowermost lower horizontal pattern LHP may have an opening exposing the substrate 1.

A top surface of the substrate 1 exposed by the opening of the lowermost lower horizontal pattern LHP may be recessed by the second etching process. Thus, the substrate 1 of the connection region CNR may have a recess region.

Figure 41:
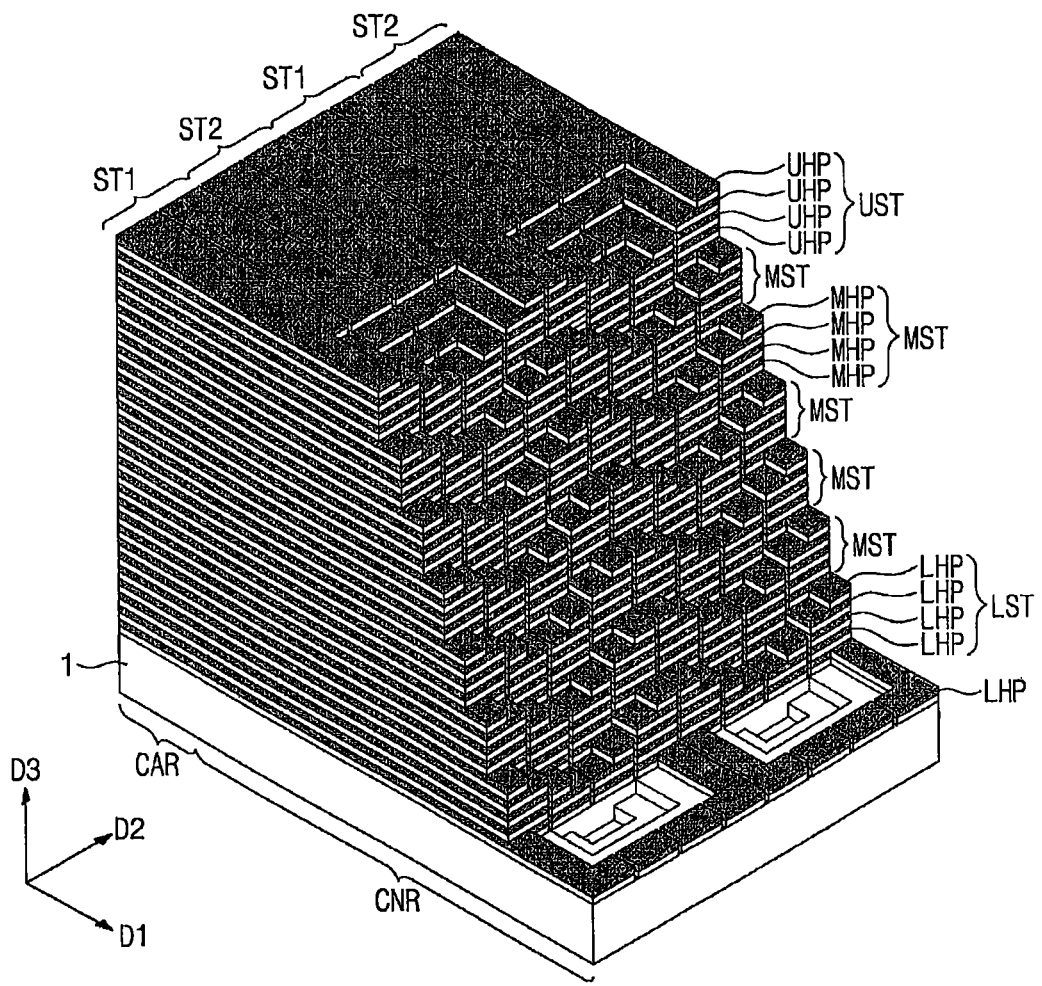

Next, the third mask pattern MP3 of FIG. 34 may be formed on a stack structure including the lower, intermediate, and upper structures LST, MST, and UST, and the stack structure may be etched using the third mask pattern MP3 as an etch mask to form electrode structures ST1 and ST2 spaced apart from each other in the second direction D2, as illustrated in FIG. 41.

Figure 42:
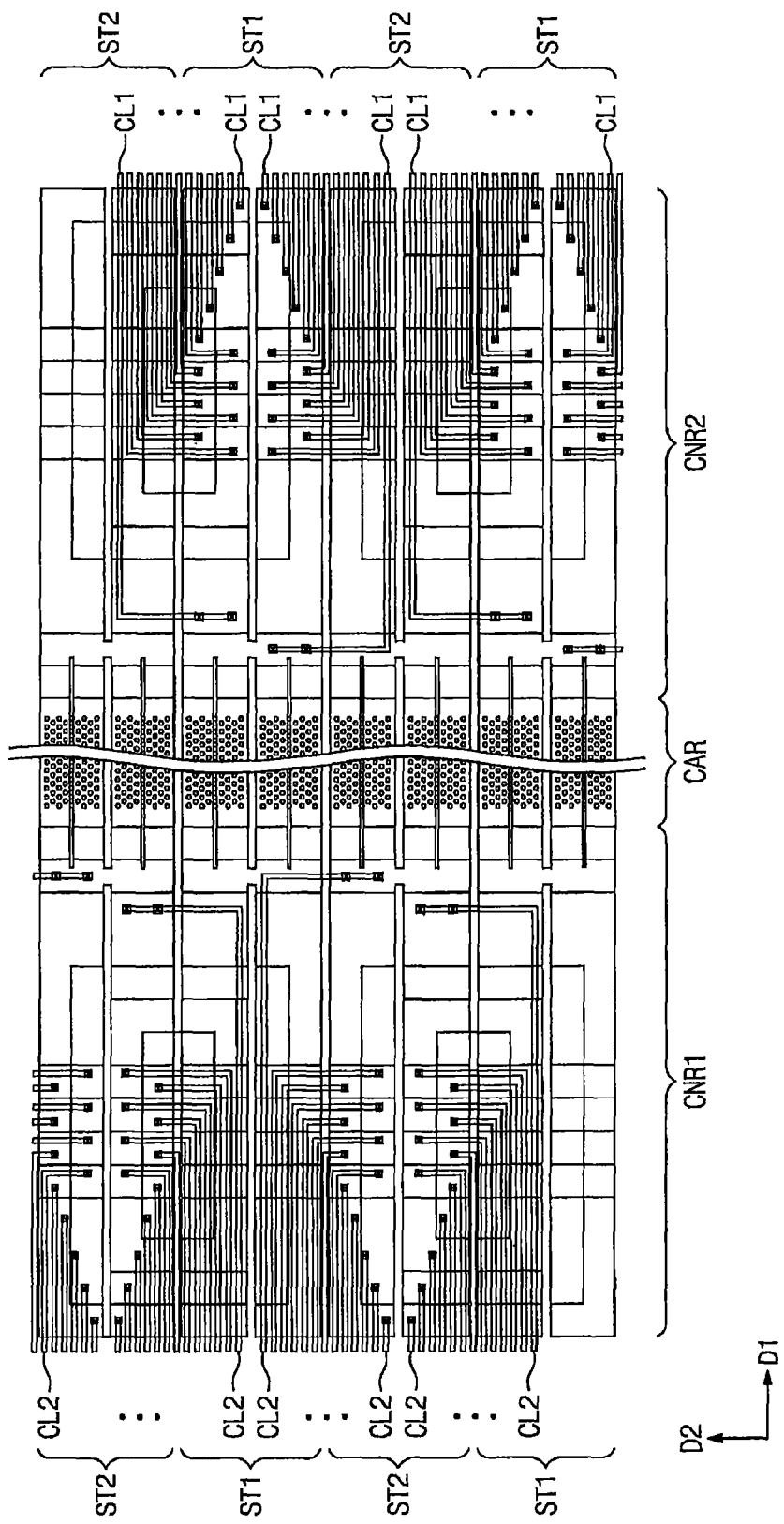
FIGS. 42, 43, and 44 are views illustrating interconnection lines electrically connected to an electrode structure of a 3D semiconductor memory device according to some embodiments of the inventive concepts.
Figure 43:
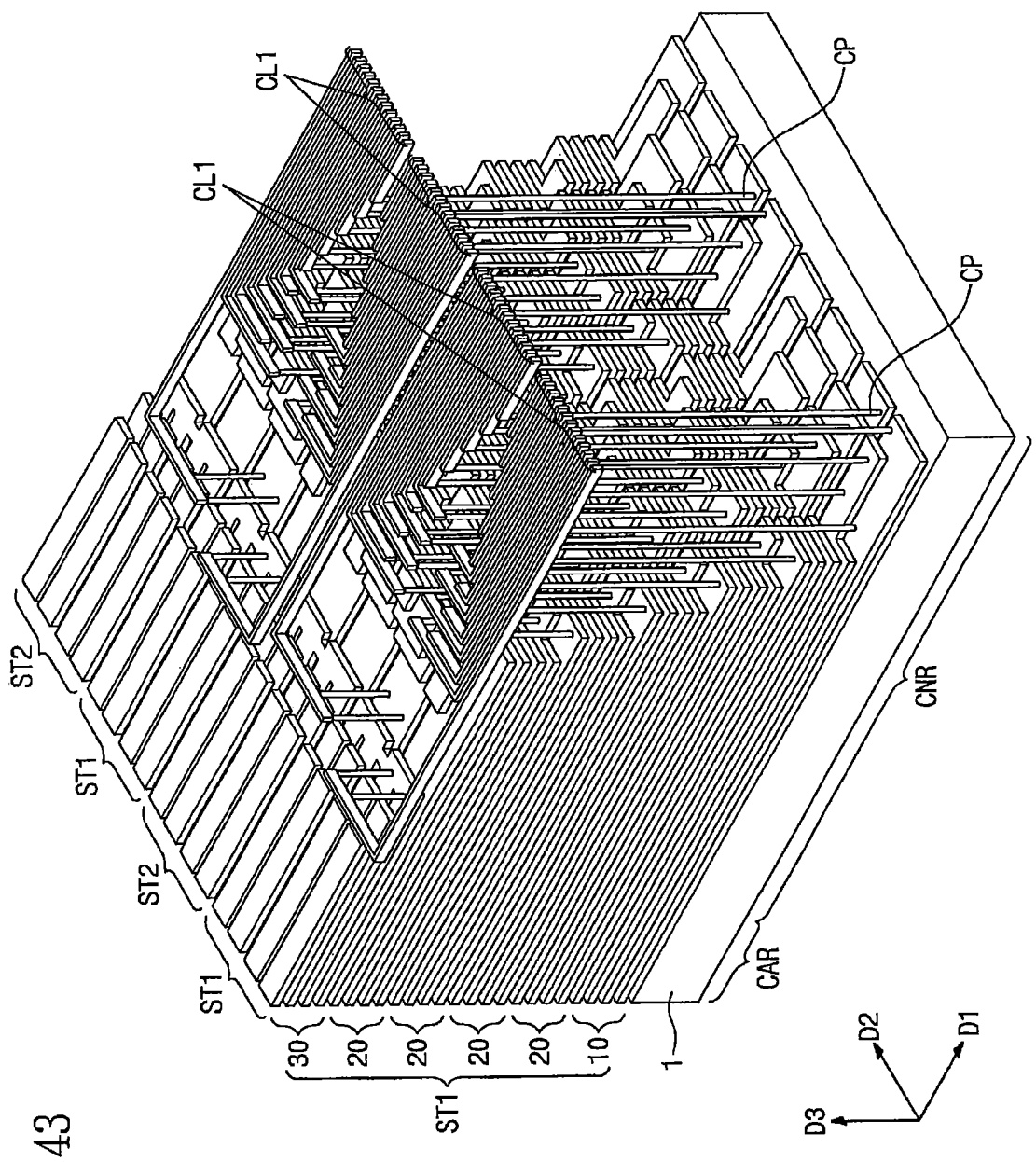
Figure 44:
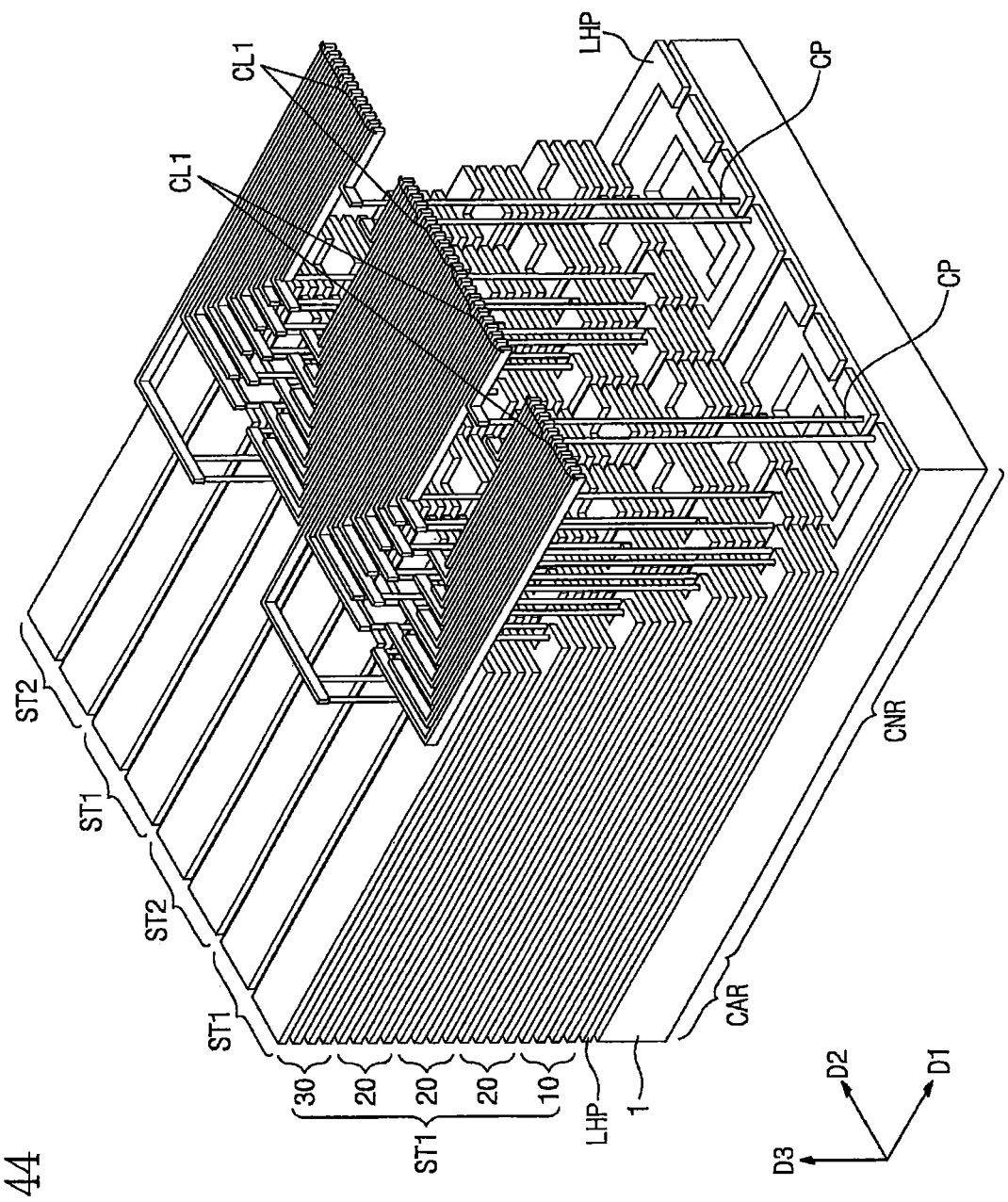

FIGS. 42, 43, and 44 are views illustrating interconnection lines electrically connected to an electrode structure of a 3D semiconductor memory device according to some embodiments of the inventive concepts. Hereinafter, the descriptions to the same technical features as in the above embodiments will be omitted or mentioned briefly for the purpose of ease and convenience in explanation.

Referring to FIGS. 42, 43, and 44, a substrate 1 may include first and second connection regions CNR1 and CNR2 spaced apart from each other in a first direction D1 and a cell array region CAR disposed between the first and second connection regions CNR1 and CNR2.

First and second electrode structures ST1 and ST2 may be disposed on the substrate 1. The first and second electrode structures ST1 and ST2 may extend in the first direction D1 and may be alternately arranged along a second direction D2. The first and second electrode structures ST1 and ST2 may be spaced apart from each other in the second direction D2 and may be electrically insulated from each other.

In some embodiments, each of the first and second electrode structures ST1 and ST2 may have a stair step structure on each of the first and second connection regions CNR1 and CNR2. In some embodiments, the first and second electrode structures ST1 and ST2 may be mirror-symmetric with respect to an imaginary line substantially parallel to the first direction D1. In other words, the first and second electrode structures ST1 and ST2 may include the lower, intermediate, and upper pad regions LP, MP, and UP described with reference to FIGS. 4 and 5 on each of the first and second connection regions CNR1 and CNR2.

In some embodiments, an interconnection structure including contact plugs CP and interconnection lines CL1 or CL2 may be connected to each of the first and second electrode structures ST1 and ST2. The contact plug CP and the interconnection line CL1 or CL2 may be connected to each of the electrodes of each of the electrode structures ST1 and ST2.

In some embodiments, some of the contact plugs CP may be disposed on the pad regions (see LP, MP, and UP of FIG. 4) of the second electrode structure ST2 on the first connection region CNR1, and others of the contact plugs CP may be disposed on the pad regions (see LP, MP, and UP of FIG. 4) of the first electrode structure ST1 on the second connection region CNR2. In other words, the some contact plugs CP may be respectively connected to the electrodes constituting the second electrode structure ST2 on the first connection region CNR1. The other contact plugs CP may be respectively connected to the electrodes constituting the first electrode structure ST1 on the second connection region CNR2.

Furthermore, second interconnection lines CL2 may be electrically connected to the second electrode structure ST2 through the contact plugs CP on the first connection region CNR1, and first interconnection lines CL1 may be electrically connected to the first electrode structure ST1 through the contact plugs CP on the second connection region CNR2.

In some embodiments, the first interconnection lines CL1 and the second interconnection lines CL2 may be disposed at the same distance/height (or the same level) from the substrate 1. In some embodiments, the first interconnection lines CL1 may be divided into a plurality of first line groups, and the first line groups may be disposed at different levels from each other. Likewise, the second interconnection lines CL2 may be divided into a plurality of second line groups, and the second line groups may be disposed at different levels from each other.

In some embodiments, each of the first and second interconnection lines CL1 and CL2 may include a first portion extending in the first direction D1 and a second portion extending in the second direction D2. The first portions of the first and second interconnection lines CL1 and CL2 may be arranged at intervals in the second direction D2, and the second portions of the first and second interconnection lines CL1 and CL2 may be in contact with the contact plugs CP, respectively. However, the inventive concepts are not limited to the aforementioned shapes and arrangement of the first and second interconnection lines CL1 and CL2. In some embodiments, the shapes and arrangement of the interconnection lines CL1 and CL2 may be variously modified.

The first interconnection lines CL1 connected to the first electrode structure ST1 may overlap with a portion of the second electrode structure ST2 in a plan view. The second interconnection lines CL2 connected to the second electrode structure ST2 may overlap with a portion of the first electrode structure ST1 in a plan view.

Figure 45:
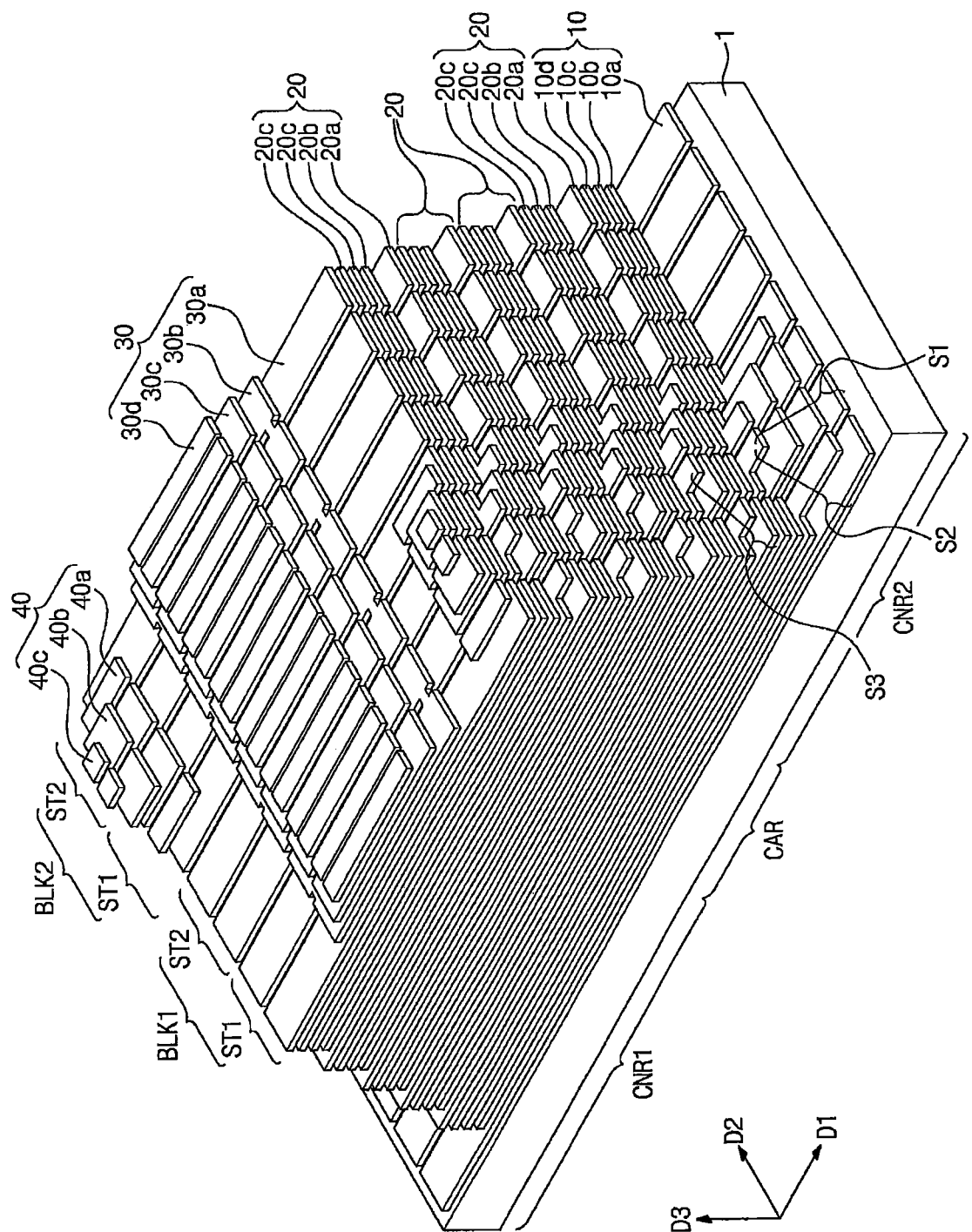
FIGS. 45, 46, and 47 are views illustrating electrode structures of 3D semiconductor memory devices according to some embodiments of the inventive concepts.
Figure 46:
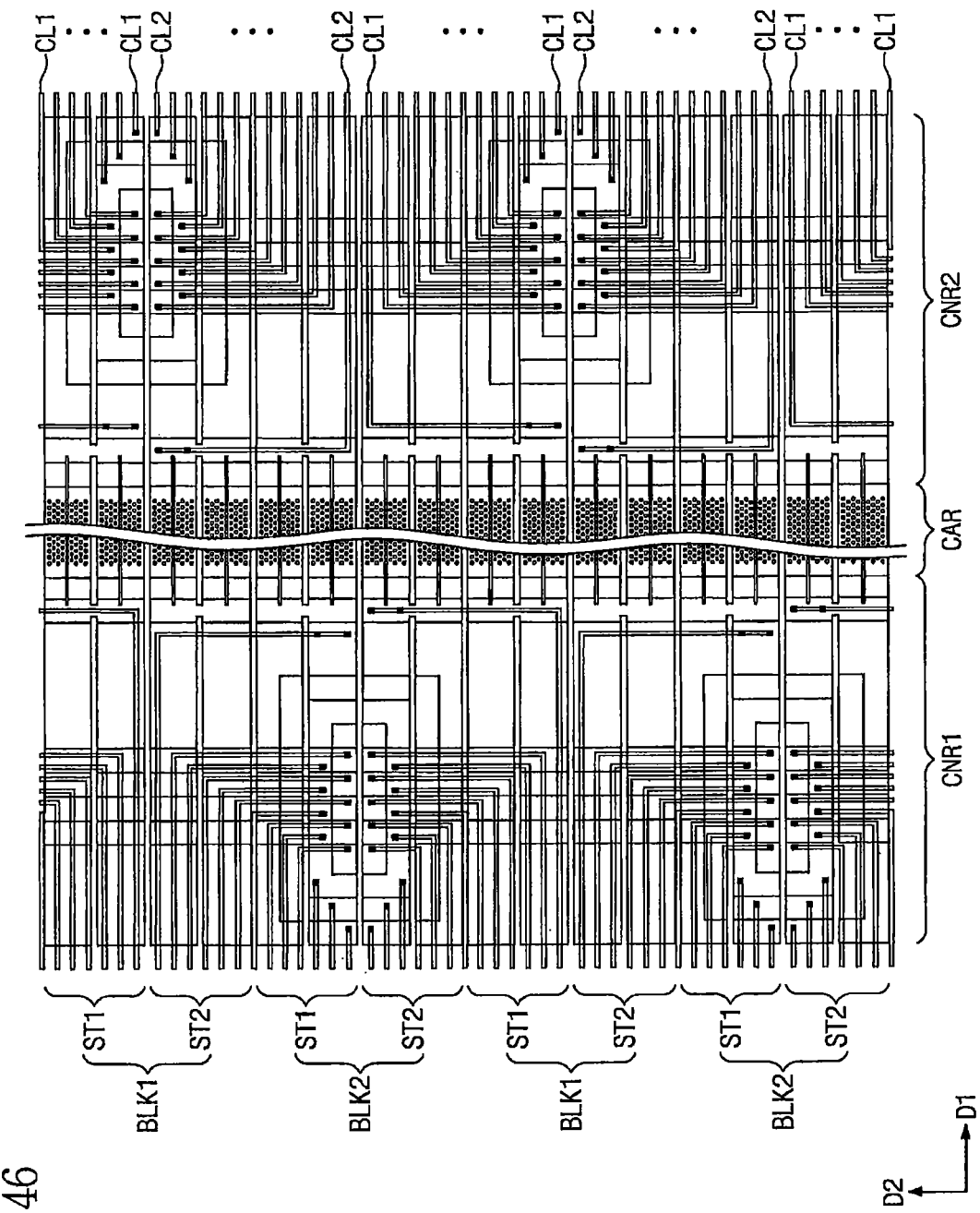
Figure 47:
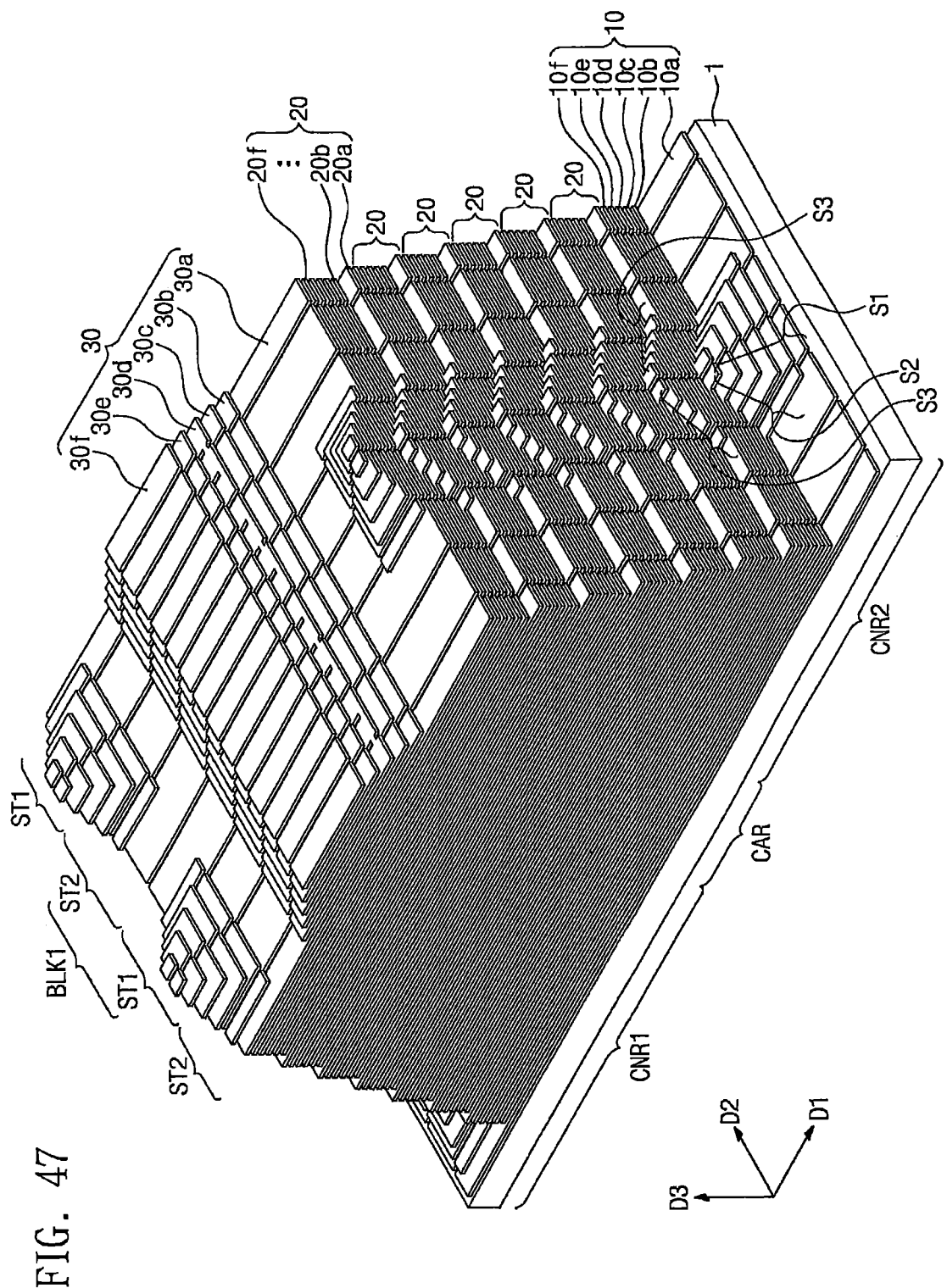

FIGS. 45, 46, and 47 are views illustrating electrode structures of 3D semiconductor memory devices according to some embodiments of the inventive concepts. Hereinafter, the descriptions to the same technical features as in the above embodiments will be omitted or mentioned briefly for the purpose of ease and convenience in explanation.

Referring to FIGS. 45 and 46, a substrate 1 may include first and second connection regions CNR1 and CNR2 and a cell array region CAR disposed between the first and second connection regions CNR1 and CNR2. In some embodiments, a plurality of first cell array blocks BLK1 and a plurality of second cell array blocks BLK2 may be disposed on the substrate 1. The first and second cell array blocks BLK1 and BLK2 may be alternately arranged in the second direction D2. Each of the first and second cell array blocks BLK1 and BLK2 may include a pair of electrode structures ST1 and ST2, i.e., a first electrode structure ST1 and a second electrode structure ST2.

The first and second electrode structures ST1 and ST2 may extend in the first direction D1 on the substrate 1 and may be spaced apart from each other in the second direction D2. As described above, each of the first and second electrode structures ST1 and ST2 may include the lower stack structure 10, the upper stack structure 30, and a plurality of the intermediate stack structures 20 stacked between the lower stack structure 10 and the upper stack structure 30.

In some embodiments, each of the electrode structures ST1 and ST2 of the first connection region CNR1 and each of the electrode structures ST1 and ST2 of the second connection region CNR2 may be asymmetrical with respect to the cell array region CAR. In detail, each of the first and second electrode structures ST1 and ST2 may have a first stair step structure S1 formed in the first direction D1 on each of the first and second connection regions CNR1 and CNR2 and may have a second stair step structure S2 formed in the second direction D2 on one of the first and second connection regions CNR1 and CNR2. The second stair step structures S2 of the first and second electrode structures ST1 and ST2 adjacent to each other may be mirror-symmetrical with respect to an imaginary line substantially parallel to the first direction D1.

For example, the first and second electrode structures ST1 and ST2 of the first cell array blocks BLK1 may have the second stair step structures S2 formed in the second direction D2 on the second connection region CNR2. The first and second electrode structures ST1 and ST2 of the second cell array blocks BLK2 may have the second stair step structures S2 formed in the second direction D2 on the first connection region CNR1.

According to the present embodiment, the second stair step structures S2 of the first cell array blocks BLK1 disposed at the substantially same level on the second connection region CNR2 may be laterally spaced apart from each other in the second direction D2. Likewise, the second stair step structures S2 of the second cell array blocks BLK2 disposed at the substantially same level on the first connection region CNR1 may be laterally spaced apart from each other in the second direction D2.

In some embodiments, in each of the first cell array blocks BLK1, the lower stack structures 10 of the first and second electrode structures ST1 and ST2 may have first and second stair step structures S1 and S2 formed respectively in the first and second directions D1 and D2 by end portions of the lower electrodes on the second connection region CNR2. In addition, on the first connection region CNR1, at least two lower electrodes of the lower stack structure 10 of the first cell array block BLK1 may have sidewalls vertically substantially aligned with each other.

In each of the first cell array blocks BLK1, the intermediate stack structures 20 of the first and second electrode structures ST1 and ST2 may have third stair step structures S3 formed by end portions of the intermediate electrodes in the second direction D2 on the second connection region CNR2. In addition, on the first connection region CNR1, at least two intermediate electrodes of the first cell array block BLK1 may have sidewalls vertically substantially aligned with each other.

In each of the first and second cell array blocks BLK1 and BLK2, the upper stack structures 30 of the first and second electrode structures ST1 and ST2 may have stair step structures formed in the first direction D1. In addition, the stair step structures of the upper stack structures 30 of the first connection region CNR1 and the stair step structures of the upper stack structures 30 of the second connection region CNR2 may be symmetrical with respect to the cell array region CAR. Furthermore, an upper dummy stack structure 40 may be disposed on an end portion of the lowermost one of the upper electrodes of the upper stack structure 30.

In some embodiments, since the second stair step structures S2 of the electrode structures ST1 and ST2 are laterally spaced apart from each other on the first connection region CNR1, it may be possible to increase process margins of processes of forming contact plugs and interconnection lines which are connected to the electrode structures ST1 and ST2.

According to an embodiment illustrated in FIG. 47, the first and second electrode structures ST1 and ST2 of the first cell array block BLK1 may have the first stair step structure S1 in the first direction D1, the second stair step structure S2 in the second direction D2, the third stair step structure S3 in the second direction D2 on the second connection region CNR2. The first and second electrode structures ST1 and ST2 of the second cell array block BLK2 may have shapes reverse to those of the first and second electrode structures ST1 and ST2 of the first cell array block BLK1.

Each of the first and second electrode structures ST1 and ST2 may have stair step structures which are respectively disposed on the first and second connection regions CNR1 and CNR2 and are asymmetrical. In some embodiments, each of the first and second electrode structures ST1 and ST2 may include the first stair step structure S1 formed in the first direction D1, the second stair step structure S2 formed in the second direction D2 and the third stair step structure S3 formed in the second direction D2 on the first and second connection regions CNR1 and CNR2, and the number of the electrodes constituting the second stair step structure S2 of the first connection region CNR1 may be different from the number of the electrodes constituting the second stair step structure S2 of the second connection region CNR2.

According to some embodiments of the inventive concepts, the upper structure having the pyramid-shaped stair step structure on the connection region may be formed on the thin-layer structure including a plurality of the horizontal layers vertically stacked, and the thin-layer structure may be patterned using the upper structure as an etch mask. Thus, it may be possible to easily form the electrode structure having the stair step structure on the connection region.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
 a substrate comprising a cell array region and a connection region sequentially disposed in a first direction; and
 first and second electrode structures extending in the first direction and spaced apart from each other in a second direction substantially perpendicular to the first direction,
 wherein each of the first and second electrode structures comprises:
  a lower stack structure comprising a plurality of lower electrodes vertically stacked on the substrate, the lower stack structure comprising a first downward staircase structure in the first direction on the connection region; and
  a plurality of intermediate stack structures vertically stacked on the lower stack structure, each of the plurality of intermediate stack structures comprising a first intermediate electrode comprising a first pad region and a second intermediate electrode comprising a second pad region on the first intermediate electrode, the first pad region being spaced apart from the second pad region in the second direction, and
 wherein the first electrode structure is mirror-symmetrical with respect to the second electrode structure, and
 wherein the lower stack structure of the first electrode structure further comprises a second downward staircase structure in the second direction on the connection region.

2. The 3D semiconductor memory device of claim 1, wherein the plurality of intermediate stack structures are offset from each other in the first direction on the connection region.

3. The 3D semiconductor memory device of claim 1, wherein each of the first and second electrode structures further comprises an upper stack structure on an uppermost one of the plurality of intermediate stack structures,
 wherein the upper stack structure comprises a plurality of upper electrodes vertically stacked on the uppermost one of the plurality of intermediate stack structures, and
 wherein the upper stack structure comprises a third downward staircase structure in the first direction on the connection region.

4. The 3D semiconductor memory device of claim 1, wherein each of the first and second electrode structures further comprises an upper dummy stack structure on an uppermost one of the plurality of intermediate stack structures,
 wherein the upper dummy stack structure comprises a plurality of upper dummy electrodes vertically stacked on the uppermost one of the plurality of intermediate stack structures, and
 wherein the upper dummy stack structure comprises an upward staircase structure in the first direction.

5. The 3D semiconductor memory device of claim 1, further comprising:
 a plurality of vertical semiconductor patterns in the first and second electrode structures; and
 a plurality of insulating layers interposed between the plurality of vertical semiconductor patterns and the first and second electrode structures, respectively.

6. The 3D semiconductor memory device of claim 5, further comprising:
 a plurality of lower semiconductor patterns interposed between the plurality of vertical semiconductor patterns and the substrate, respectively.

7. The 3D semiconductor memory device of claim 1, further comprising third and fourth electrode structures extending in the first direction,
wherein the first to fourth electrode structures are sequentially arranged in the second direction,
wherein the third electrode structure is mirror-symmetrical with respect to the fourth electrode structure, and
wherein the second electrode structure is mirror-symmetrical with respect to the third electrode structure.

8. A three-dimensional (3D) semiconductor memory device comprising:
a substrate comprising a cell array region and a connection region sequentially disposed in a first direction, the connection region including an upper pad region, a lower pad region, and an intermediate pad region between the upper pad region and the lower pad region; and
first and second electrode structures extending in the first direction and spaced apart from each other in a second direction substantially perpendicular to the first direction,
wherein each of the first and second electrode structures comprises:
a plurality of upper electrodes vertically stacked on the substrate, the plurality of upper electrodes comprising an upper pad structure on the upper pad region;
a plurality of intermediate electrodes vertically stacked, the plurality of intermediate electrodes comprising an intermediate pad structure on the intermediate pad region; and
a plurality of lower electrodes vertically stacked on the substrate, the plurality of lower electrodes comprising a lower pad structure on the lower pad region,
wherein the first electrode structure is mirror-symmetrical with respect to the second electrode structure,
wherein the upper pad structure comprises a first region and a second region,
the first region of the upper pad structure includes a first upper pad having a first area, in a plan view, and
the second region of the upper pad structure includes a second upper pad having a second area less than the first area, in a plan view.

9. The 3D semiconductor memory device of claim 8, wherein the first region of the upper pad structure has a first width, and
the second region of the upper pad structure has a second width less than the first width.

10. The 3D semiconductor memory device of claim 8, wherein the first region of the upper pad structure comprises a first upper staircase structure in the first direction and a second upper staircase structure in the second direction.

11. The 3D semiconductor memory device of claim 8, further comprising
a plurality of upper contact plugs connected to the second region of the upper pad structure; and
a plurality of intermediate contact plugs connected to the intermediate pad structure.

12. The 3D semiconductor memory device of claim 11, wherein a first one of the plurality of intermediate contact plugs is spaced apart from a first one of the plurality of upper contact plugs by a first distance, and
adjacent ones of the plurality of upper contact plugs are spaced apart from each other by a second distance less than the first distance.

13. The 3D semiconductor memory device of claim 8, wherein the first region of the upper pad structure is between the intermediate pad structure and the second region of the upper pad structure.

14. The 3D semiconductor memory device of claim 8, further comprising third and fourth electrode structures extending in the first direction,
wherein the first, second, third, and fourth electrode structures are sequentially arranged in the second direction,
wherein the third electrode structure is mirror-symmetrical with respect to the fourth electrode structure, and
wherein the second electrode structure is mirror-symmetrical with respect to the third electrode structure.

15. The 3D semiconductor memory device of claim 8, further comprising:
a plurality of vertical channels vertically extending through the plurality of upper electrodes, the plurality of intermediate electrodes, and the plurality of lower electrodes on the cell array region; and
a data storage layer surrounding each of the plurality of vertical channels.

* * * * *